US012813103B2

(12) United States Patent
Kim et al.

(10) Patent No.: US 12,813,103 B2
(45) Date of Patent: Nov. 24, 2026

(54) DISPLAY APPARATUS

(71) Applicant: Samsung Display Co., Ltd., Yongin-si (KR)

(72) Inventors: Sujin Kim, Yongin-si (KR); Minjoo Kim, Yongin-si (KR); Daehyun Kim, Yongin-si (KR); Kyoungjin Park, Yongin-si (KR); Junghoon Shim, Yongin-si (KR); Seoni Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 432 days.

(21) Appl. No.: 18/354,810

(22) Filed: Jul. 19, 2023

(65) Prior Publication Data

US 2024/0099065 A1 Mar. 21, 2024

(30) Foreign Application Priority Data

Sep. 19, 2022 (KR) ........................ 10-2022-0118108
Dec. 14, 2022 (KR) ........................ 10-2022-0174948

(51) Int. Cl.
*H10K 59/131* (2023.01)
*G09G 3/3233* (2016.01)
*H10K 59/121* (2023.01)

(52) U.S. Cl.
CPC ......... *H10K 59/131* (2023.02); *G09G 3/3233* (2013.01); *H10K 59/1216* (2023.02);
(Continued)

(58) Field of Classification Search
CPC ........... H10K 59/1216; H10K 59/1213; H10K 59/131; H10K 59/123; H10K 59/82;
(Continued)

(56) References Cited

U.S. PATENT DOCUMENTS 8,159,420 B2 4/2012 Takahashi et al.
8,324,018 B2 * 12/2012 Isa .......................... H10P 14/46
438/161

(Continued)

FOREIGN PATENT DOCUMENTS

CN 107799532 A 3/2018
CN 114759046 A 7/2022

(Continued)

OTHER PUBLICATIONS

International Search Report corresponding to International Application No. PCT/KR2023/014202 dated Dec. 26, 2023.

*Primary Examiner* — Yara B Green
*Assistant Examiner* — Benjamin Michael Kupp
(74) *Attorney, Agent, or Firm* — F. CHAU & ASSOCIATES, LLC

(57) ABSTRACT

A display apparatus includes a first electrode and a second electrode that are disposed apart from each other on a substrate, a first insulating layer disposed on the substrate and overlapping the first electrode and the second electrode, a third electrode disposed on the first insulating layer and overlapping the first electrode and the second electrode, a second insulating layer disposed on the first insulating layer and overlapping the third electrode, a fourth electrode disposed on the second insulating layer, overlapping the third electrode, and electrically connected to the first electrode, a third insulating layer disposed on the second insulating layer and overlapping the fourth electrode, and a fifth electrode disposed on the third insulating layer, overlapping the fourth electrode, and electrically connected to the third electrode.

27 Claims, 28 Drawing Sheets

(52) U.S. Cl.
CPC ............... *G09G 2300/0819* (2013.01); *G09G 2300/0852* (2013.01); *G09G 2300/0861* (2013.01)

(58) Field of Classification Search
CPC ................. H10K 59/89; G09G 3/3233; G09G 2300/0819; G09G 2300/0852; G09G 2300/0861; G09G 2300/0426; G09G 2300/0814; G09G 2300/0866; G09G 2320/045
See application file for complete search history.

(56) References Cited

U.S. PATENT DOCUMENTS

| | | | | |
|---|---|---|---|---|
| 9,495,905 | B2 | 11/2016 | Omata et al. | |
| 9,954,043 | B2 | 4/2018 | Park et al. | |
| 10,622,436 | B2 | 4/2020 | Park et al. | |
| 10,991,783 | B2 * | 4/2021 | Cha | G09G 3/3266 |
| 2014/0291636 | A1 | 10/2014 | Kim et al. | |
| 2015/0214249 | A1 * | 7/2015 | Cheng | H10D 86/423 257/43 |
| 2016/0372497 | A1 | 12/2016 | Lee et al. | |
| 2020/0135120 | A1 | 4/2020 | Seo | |
| 2020/0135825 | A1 | 4/2020 | Cha et al. | |
| 2022/0157909 | A1 | 5/2022 | Kim et al. | |
| 2022/0320456 | A1 | 10/2022 | Lius et al. | |

FOREIGN PATENT DOCUMENTS

| | | |
|---|---|---|
| JP | 2014-85384 | 5/2014 |
| KR | 2003-0096562 | 12/2003 |
| KR | 10-2008-0029849 | 4/2008 |
| KR | 10-0914929 | 9/2009 |
| KR | 10-2014-0079093 | 6/2014 |
| KR | 10-2016-0094457 | 8/2016 |
| KR | 10-2016-0150199 A | 12/2016 |
| KR | 10-2017-0080779 | 7/2017 |
| KR | 10-1970570 | 4/2019 |
| KR | 10-2279392 | 7/2021 |
| KR | 10-2414276 | 6/2022 |

* cited by examiner

DISPLAY APPARATUS

CROSS-REFERENCE TO RELATED APPLICATION(S)

This application claims priority to and benefits of Korean Patent Application Nos. 10-2022-0118108 and 10-2022-0174948 under 35 U.S.C. § 119, filed on Sep. 19, 2022 and Dec. 14, 2022, respectively, in the Korean Intellectual Property Office, the entire contents of which are incorporated herein by reference.

BACKGROUND

1. Technical Field

One or more embodiments relate to a display apparatus.

2. Description of the Related Art

A display apparatus visually displays data. A display apparatus may be used as a display unit of miniaturized products such as mobile phones, and also may be used as a display unit of large-scale products such as televisions.

A display apparatus includes pixels that receive electric signals and emit light to display images to the outside. Each pixel may include a display element. As an example, an organic light-emitting display apparatus may include an organic light-emitting diode OLED as a display element. Generally, an organic light-emitting display apparatus includes a thin-film transistor and an organic light-emitting diode over a substrate and operates while the organic light-emitting diode emits light spontaneously.

Recently, as the purposes of display apparatuses have diversified, various designs to improve the quality of display apparatuses have been attempted.

SUMMARY

One or more embodiments include a display apparatus including a capacitor with an increased (or secured) capacitance. The capacitor may be placed in a pixel circuit configured to drive a display element.

Technical aspects are not limited to those mentioned above, and other technical aspects that are not mentioned will be clearly understood by those of ordinary skill in the art from the description of the disclosure.

According to one or more embodiments, a display apparatus may include a first electrode and a second electrode that are disposed apart from each other on a substrate, a first insulating layer disposed on the substrate and overlapping the first electrode and the second electrode, a third electrode disposed on the first insulating layer and overlapping the first electrode and the second electrode, a second insulating layer disposed on the first insulating layer and overlapping the third electrode, a fourth electrode disposed on the second insulating layer, overlapping the third electrode, and electrically connected to the first electrode, a third insulating layer disposed on the second insulating layer and overlapping the fourth electrode, and a fifth electrode disposed on the third insulating layer, overlapping the fourth electrode, and electrically connected to the third electrode.

In a plan view, the second electrode may substantially extend in a first direction and have a protrusion protruding in a second direction intersecting the first direction, and the first electrode may be disposed adjacent in the first direction to the protrusion of the second electrode.

The display apparatus may further include a first display element configured to emit light of a first color, and a first pixel circuit electrically connected to the first display element and electrically connected to a power line. The first pixel circuit may include a first transistor configured to control a magnitude of a first driving current flowing through the first display element, a first storage capacitor electrically connected between a gate of the first transistor and a source of the first transistor, and a first hold capacitor electrically connected between the power line and the source of the first transistor. A first storage capacitance of the first storage capacitor may be a sum of a first capacitance between the first electrode and the third electrode, a second capacitance between the third electrode and the fourth electrode, and a third capacitance between the fourth electrode and the fifth electrode. A first hold capacitance of the first hold capacitor may be a fourth capacitance between the second electrode and the third electrode.

The display apparatus may further include a second display element configured to emit light of a second color different from the first color, and a second pixel circuit electrically connected to the second display element and electrically connected to the power line. The second pixel circuit may include a second transistor configured to control a magnitude of a second driving current flowing through the second display element, a second storage capacitor electrically connected between a gate of the second transistor and a source of the second transistor, and a second hold capacitor electrically connected between the power line and the source of the second transistor. The first storage capacitance of the first storage capacitor may be greater than the second storage capacitance of the second storage capacitor, and the first hold capacitance of the first hold capacitor may be less than a second hold capacitance of the second hold capacitor.

The first color may be green, and the second color may be blue.

The display apparatus may further include a display element, and a pixel circuit electrically connected to the display element and electrically connected to a power line. The pixel circuit may include a first transistor configured to control a magnitude of a driving current flowing through the display element, a storage capacitor including a first storage electrode and a second storage electrode, the first storage electrode being electrically connected to a gate of the first transistor, and the second storage electrode being electrically connected to a source of the first transistor, and a hold capacitor including a first hold electrode and a second hold electrode, the first hold electrode being electrically connected to the power line, and the second hold electrode being electrically connected to the source of the first transistor. The first storage electrode of the storage capacitor may include the first electrode and the fourth electrode, the second storage electrode of the storage capacitor may include a portion of the third electrode overlapping the first electrode, and the fifth electrode, the first hold electrode of the hold capacitor may include the second electrode, and the second hold electrode of the hold capacitor may include another portion of the third electrode overlapping the second electrode.

The display element may include an anode and a cathode, the pixel circuit may be electrically connected to a data line, a first voltage line, and a second voltage line, and the pixel circuit may further include a second transistor configured to electrically connect the data line to the gate of the first transistor in response to a first scan signal, a third transistor configured to electrically connect the first voltage line to the gate of the first transistor in response to a second scan signal, a fourth transistor configured to electrically connect the second voltage line to the anode of the display element in response to a third scan signal, a fifth transistor configured to electrically connect the power line to a drain of the first transistor in response to a first emission control signal, and a sixth transistor configured to electrically connect the source of the first transistor to the anode of the display element in response to a second emission control signal.

The display apparatus may further include a semiconductor layer disposed between the third electrode and the fourth electrode and including an oxide semiconductor material.

The third electrode may include an opening exposing at least a portion of the first insulating layer, and the first electrode may be electrically connected to the fourth electrode through a contact hole passing through the opening of the third electrode.

In a plan view, the opening of the third electrode may overlap a central portion of the first electrode.

The fourth electrode may include an opening exposing at least a portion of the second insulating layer, and the third electrode may be electrically connected to the fifth electrode through a contact hole passing through the opening of the fourth electrode.

According to one or more embodiments, a display apparatus may include a first electrode and a second electrode that are disposed apart from each other on a substrate, a first insulating layer disposed on the substrate and overlapping the first electrode and the second electrode, a third electrode disposed on the first insulating layer and overlapping the first electrode and the second electrode, a second insulating layer disposed on the first insulating layer and overlapping the third electrode, a fourth electrode disposed on the second insulating layer, overlapping the third electrode, and electrically connected to the second electrode, a third insulating layer disposed on the second insulating layer and overlapping the fourth electrode, a fifth electrode disposed on the third insulating layer, overlapping the third electrode, and electrically connected to the first electrode, a fourth insulating layer disposed on the third insulating layer and overlapping the fifth electrode, and a sixth electrode disposed on the fourth insulating layer, overlapping the fifth electrode, and electrically connected to the third electrode.

The fourth electrode may include an oxide semiconductor material.

In a plan view, the second electrode may substantially extend in a first direction and have a protrusion protruding in a second direction intersecting the first direction, and the first electrode may be arranged adjacent in the first direction to the protrusion of the second electrode.

The display apparatus may further include a display element, and a pixel circuit electrically connected to the display element and electrically connected to a power line. The pixel circuit may include a transistor configured to control a magnitude of a driving current flowing through the display element, a storage capacitor including a first storage electrode and a second storage electrode, the first storage electrode being electrically connected to a gate of the transistor, and the second storage electrode being electrically connected to a source of the transistor, and a hold capacitor including a first hold electrode and a second hold electrode, the first hold electrode being electrically connected to the power line, and the second hold electrode being electrically connected to the source of the transistor. The first storage electrode of the storage capacitor may include the first electrode and the fifth electrode, the second storage electrode of the storage capacitor may include a portion of the third electrode overlapping the first electrode, and the sixth electrode, the first hold electrode of the hold capacitor may include the second electrode and the fourth electrode, and the second hold electrode of the hold capacitor may include another portion of the third electrode overlapping the second electrode.

The display apparatus may further include a first display element configured to emit light of a first color, and a first pixel circuit electrically connected to the first display element and electrically connected to a power line. The first pixel circuit may include a first transistor configured to control a magnitude of a first driving current flowing through the first display element, a first storage capacitor electrically connected between a gate of the first transistor and a source of the first transistor, and a first hold capacitor electrically connected between the power line and the source of the first transistor. A first storage capacitance of the first storage capacitor may be a sum of a first capacitance between the first electrode and the third electrode, a second capacitance between the third electrode and the fifth electrode, and a third capacitance between the fifth electrode and the sixth electrode. A first hold capacitance of the first hold capacitor may be a sum of a fourth capacitance between the second electrode and the third electrode, and a fifth capacitance between the third electrode and the fourth electrode.

The display apparatus may further include a second display element configured to emit light of a second color different from the first color, and a second pixel circuit electrically connected to the second display element and electrically connected to the power line. The second pixel circuit may include a second transistor configured to control a magnitude of a second driving current flowing through the second display element, a second storage capacitor electrically connected between a gate of the second transistor and a source of the second transistor, and a second hold capacitor electrically connected between the power line and the source of the second transistor. The first storage capacitance of the first storage capacitor may be greater than a second storage capacitance of the second storage capacitor. The first hold capacitance of the first hold capacitor may be less than a second hold capacitance of the second hold capacitor.

The first color may be green, and the second color may be blue.

The third electrode may include a first opening exposing at least a portion of the first insulating layer, the fifth electrode may include a second opening exposing at least a portion of the third insulating layer, the first electrode may be electrically connected to the fifth electrode through a first contact hole passing through the first opening of the third electrode, and the third electrode may be electrically connected to the sixth electrode through a second contact hole passing through the second opening of the fifth electrode.

According to one or more embodiments, a display apparatus may include a first electrode and a second electrode that are disposed apart from each other on a substrate, a first insulating layer disposed on the substrate and overlapping the first electrode and the second electrode, a third electrode disposed on the first insulating layer and overlapping the first electrode, a fourth electrode disposed apart from the third electrode on the first insulating layer and overlapping the second electrode, a second insulating layer disposed on the first insulating layer and overlapping the third electrode and the fourth electrode, a fifth electrode disposed on the second insulating layer, overlapping the third electrode, and electrically connected to the first electrode, a third insulating layer disposed on the second insulating layer and overlapping the fifth electrode, and a sixth electrode disposed on the third insulating layer, overlapping the fifth electrode, and electrically connected to the second electrode and the third electrode.

In a plan view, the fourth electrode may substantially extend in a first direction and have a protrusion protruding in a second direction intersecting the first direction, and the third electrode may be arranged adjacent in the first direction to the protrusion of the fourth electrode.

The display apparatus may further include a semiconductor layer disposed between the third electrode and the fifth electrode and including an oxide semiconductor material.

The fourth electrode may be in a state in which a preset voltage is applied thereto.

The display apparatus may further include a display element, and a pixel circuit electrically connected to the display element and electrically connected to a power line. The pixel circuit may include a transistor configured to control a magnitude of a driving current flowing through the display element, a storage capacitor electrically connected between a gate of the transistor and a source of the transistor, and a hold capacitor electrically connected between the power line and the source of the transistor. A storage capacitance of the storage capacitor may be a sum of a first capacitance between the first electrode and the third electrode, a second capacitance between the third electrode and the fifth electrode, and a third capacitance between the fifth electrode and the sixth electrode. A hold capacitance of the hold capacitor may be a fourth capacitance between the second electrode and the fourth electrode.

The display apparatus may further include a display element, and a pixel circuit electrically connected to the display element and electrically connected to a power line. The pixel circuit may include a transistor configured to control a magnitude of a driving current flowing through the display element, a storage capacitor including a first storage electrode and a second storage electrode, the first storage electrode being electrically connected to a gate of the transistor, and the second storage electrode being electrically connected to a source of the transistor, and a hold capacitor including a first hold electrode and a second hold electrode, the first hold electrode being electrically connected to the power line, and the second hold electrode being electrically connected to the source of the transistor. The first storage electrode of the storage capacitor may include the first electrode and the fifth electrode, the second storage electrode of the storage capacitor may include the third electrode and the sixth electrode, the first hold electrode of the hold capacitor may include the fourth electrode, and the second hold electrode of the hold capacitor may include the second electrode.

These and/or other aspects will become apparent and more readily appreciated from the following description of the embodiments, the accompanying drawings, and claims.

These general and specific aspects may be implemented by using a system, a method, a computer program, or a combination of a certain system, method, and computer program.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
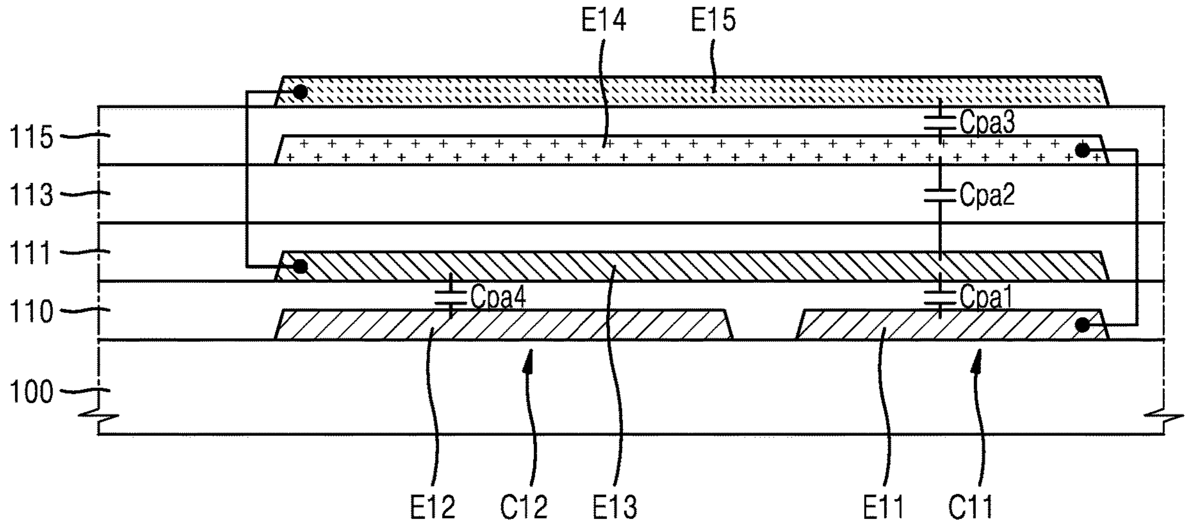
FIG. 1 is a schematic cross-sectional view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

The phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

While such terms as "first" and "second" may be used to describe various elements, such elements must not be limited to the above terms. The above terms are used to distinguish one element from another.

The singular forms "a," "an," and "the" as used herein are intended to include the plural forms as well unless the context clearly indicates otherwise.

It will be understood that the terms "comprise," "comprising," "has," "have," "having," "include" and/or "including" as used herein specify the presence of stated features or elements but do not preclude the addition of one or more other features or elements.

It will be further understood that, when a layer, region, or element is referred to as being "on" another layer, region, or element it can be directly or indirectly on the other layer, region, or element. That is, for example, intervening layers, regions, or elements may be present.

Sizes of elements in the drawings may be exaggerated or reduced for convenience of explanation. As an example, the size and thickness of each element shown in the drawings may be arbitrarily represented for convenience of description, and thus, the disclosure is not necessarily limited thereto.

In the case where a certain embodiment may be implemented differently, a specific process order may be performed in the order different from the described order. As an example, two processes successively described may be simultaneously performed substantially or performed in the opposite order.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical and/or electrical connection or coupling.

The first direction (e.g., the ±x direction), the second direction (e.g., the ±y direction) and the third direction (e.g., the ±z direction) are not limited to three directions indicated by three axes of the rectangular coordinate system, and may be interpreted in a broader sense. For example, the first direction (e.g., the ±x direction), the second direction (e.g., the ±y direction), and the third direction (e.g., the ±z direction) may be perpendicular to one another, or may represent different directions that are not perpendicular to one another.

An element extending "substantially" in a direction may denote an element extending in the direction in zig-zags or in other shapes, as well as an element extending straight in the direction. That is, the element may extend in only the direction indicated, or may extend in directions other than the direction indicated as well as in the direction indicated.

The term "overlap" or "overlapped" mean that a first object may be above or below or to a side of a second object, and vice versa, either partially or fully. Additionally, the term "overlap" may include layer, stack, face or facing, extending over, covering, or partly covering or any other suitable term as would be appreciated and understood by those of ordinary skill in the art.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of a display apparatus according to an embodiment.

Referring to FIG. 1, the display apparatus may include a first capacitor C11 and a second capacitor C12.

The first capacitor C11 may include a first electrode E11, a third electrode E13, a fourth electrode E14, and a fifth electrode E15. The third electrode E13 may be disposed on the first electrode E11 and may at least partially overlap the first electrode E11. The first electrode E11 and the third electrode E13 may constitute a first capacitance Cpa1. The fourth electrode E14 may be disposed on the third electrode E13 and may at least partially overlap the third electrode E13. The third electrode E13 and the fourth electrode E14 may constitute a second capacitance Cpa2. The fourth electrode E14 may be electrically connected to the first electrode E11. The fifth electrode E15 may be disposed on the fourth electrode E14 and may at least partially overlap the fourth electrode E14. The fourth electrode E14 and the fifth electrode E15 may constitute a third capacitance Cpa3. The fifth electrode E15 may be electrically connected to the third electrode E13.

The first capacitor C11 may have a capacitance based on the first capacitance Cpa1, the second capacitance Cpa2, and the third capacitance Cpa3. As an example, the capacitance (or a capacitance value) of the first capacitor C11 may be a sum of the first capacitance Cpa1, the second capacitance Cpa2, and the third capacitance Cpa3.

The second capacitor C12 may include a second electrode E12 and a third electrode E13. The third electrode E13 may be disposed on the second electrode E12 and may at least partially overlap the second electrode E12. The second electrode E12 and the third electrode E13 may constitute a fourth capacitance Cpa4.

The second capacitor C12 may have a capacitance based on the fourth capacitance Cpa4. As an example, the capacitance of the second capacitor C12 may be the fourth capacitance Cpa4.

In case that the 'first capacitor C11 may include the third electrode E13', it may mean that the 'first capacitor C11 may include a portion of the third electrode E13 overlapping the first electrode E11.' In case that the 'second capacitor C12 may include the third electrode E13', it may mean that the 'second capacitor C12 may include another portion of the third electrode E13 overlapping the second electrode E12.'

As in an embodiment, in case that at least some of electrodes constituting the first capacitor C11 are disposed on the second capacitor C12, an area in which electrodes constituting the second capacitor C12 may be arranged may be increased (or secured). In case that at least some of the electrodes constituting the first capacitor C11 are stacked on the second capacitor C12, a capacitance of the second capacitor C12 may be increased (or secured).

Hereinafter, a configuration of a display apparatus is described more specifically according to a stack structure with reference to FIG. 1.

A substrate 100 may include glass material, a ceramic material, and/or a metal material. The substrate 100 may include a flexible or bendable material. In case that the substrate 100 is flexible or bendable, the substrate 100 may include a polymer resin including polyethersulfone, polyacrylate, polyetherimide, polyethylene naphthalate, polyethylene terephthalate, polyphenylene sulfide, polyarylate, polyimide, polycarbonate, and/or cellulose acetate propionate.

The substrate 100 may have a single-layered structure or a multi-layered structure of the above materials and may further include an inorganic material in the case of the multi-layered structure. In an embodiment, the substrate 100 may have a structure of an organic material/an inorganic material/an organic material.

The first electrode E11 and the second electrode E12 may be disposed on the substrate 100. The first electrode E11 may be apart from the second electrode E12. The first electrode E11 and the second electrode E12 may include at least one of molybdenum (Mo), aluminum (Al), copper (Cu), titanium (Ti) and the like and include a single layer or a multi-layer. As an example, the first electrode E11 and the second electrode E12 may be a single Mo layer.

In an embodiment, a preset voltage may be applied to the second electrode E12. As an example, a first driving voltage ELVDD of FIG. 5 described below may be applied to the second electrode E12.

A barrier layer 110 may be disposed on the substrate 100 to cover the first electrode E11 and the second electrode E12. The barrier layer 110 may prevent or reduce the penetration of impurities from the substrate 100 and the like. The barrier layer 110 may include an inorganic material, an organic material, or an organic/inorganic composite material, and include a single layer or a multi-layer including an inorganic material and an organic material, the inorganic material including oxide or nitride.

The third electrode E13 may be disposed on the barrier layer 110. The third electrode E13 may include at least one of molybdenum (Mo), aluminum (Al), copper (Cu), titanium (Ti) and the like and include a single layer or a multi-layer. As an example, the third electrode E13 may include a single Mo layer.

The first electrode E11 and the third electrode E13 may overlap each other with the barrier layer 110 therebetween and constitute the first capacitance Cpa1. The second electrode E12 and the third electrode E13 may overlap each other with the barrier layer 110 therebetween and constitute the fourth capacitance Cpa4. The barrier layer 110 may serve as a dielectric layer of the capacitor.

A buffer layer 111 may be disposed on the barrier layer 110 to cover the third electrode E13. The buffer layer 111 may be configured to reduce or block the penetration of foreign materials, moisture, or external air from below the substrate 100 and may provide a flat surface on the substrate 100. The buffer layer 111 may include an inorganic material, an organic material, or an organic/inorganic composite material, and include a single layer or a multi-layer including an inorganic material and an organic material, the inorganic material including oxide or nitride.

A first insulating layer 113 and a second insulating layer 115 may be stacked on the buffer layer 111. The first insulating layer 113 and the second insulating layer 115 may each include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$). Zinc oxide ($ZnO_x$) may be zinc oxide (ZnO) and/or zinc peroxide ($ZnO_2$).

The fourth electrode E14 may be disposed between the first insulating layer 113 and the second insulating layer 115. The fourth electrode E14 may be electrically connected to the first electrode E11. The fourth electrode E14 may include at least one of molybdenum (Mo), aluminum (Al), copper (Cu), titanium (Ti) and the like and include a single layer or a multi-layer. As an example, the fourth electrode E14 may include a single Mo layer.

The third electrode E13 and the fourth electrode E14 may overlap each other with the buffer layer 111 and the first insulating layer 113 therebetween and constitute the second capacitance Cpa2. The buffer layer 111 and the first insulating layer 113 may serve as dielectric layers of the capacitor.

The fifth electrode E15 may be disposed on the second insulating layer 115. The fifth electrode E15 may be electrically connected to the third electrode E13. The fifth electrode E15 may include a conductive material including molybdenum (Mo), aluminum (Al), copper (Cu), and/or titanium (Ti) and have a single-layered structure or a multi-layered structure including the above materials. As an example, the fifth electrode E15 may have a multi-layered structure of Ti/Al/Ti.

The fourth electrode E14 and the fifth electrode E15 may overlap each other with the second insulating layer 115 therebetween and constitute the third capacitance Cpa3. The second insulating layer 115 may serve as a dielectric layer of the capacitor.

Figure 2:
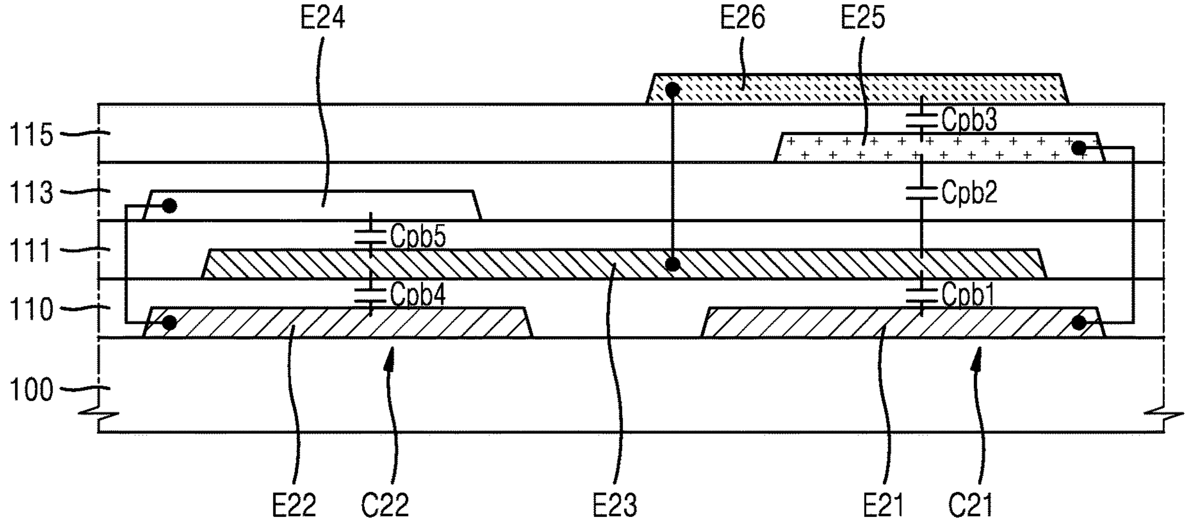
FIG. 2 is a schematic cross-sectional view of a display apparatus according to an embodiment.

FIG. 2 is a schematic cross-sectional view of the display apparatus according to an embodiment. In FIG. 2, the same reference numerals as those of FIG. 1 denote the same members, and thus, repeated descriptions thereof are omitted.

Referring to FIG. 2, the display apparatus may include a first capacitor C21 and a second capacitor C22.

The first capacitor C21 may include a first electrode E21, a third electrode E23, a fifth electrode E25, and a sixth electrode E26. The first electrode E21, the third electrode E23, the fifth electrode E25, and the sixth electrode E26 may include at least one of molybdenum (Mo), aluminum (Al), copper (Cu), titanium (Ti) and the like and include a single layer or a multi-layer. As an example, the first electrode E21, the third electrode E23, and the fifth electrode E25 may each be a single Mo layer. The sixth electrode E26 may have a multi-layered structure of Ti/Al/Ti.

The first electrode E21 may be disposed between the substrate 100 and the barrier layer 110, the third electrode E23 may be disposed between the barrier layer 110 and the buffer layer 111, the fifth electrode E25 may be disposed between the first insulating layer 113 and the second insulating layer 115, and the sixth electrode E26 may be disposed on the second insulating layer 115. The first electrode E21 and the third electrode E23 may overlap each other with the barrier layer 110 therebetween and constitute a first capacitance Cpb1. The third electrode E23 and the fifth electrode E25 may overlap each other with the buffer layer 111 and the first insulating layer 113 therebetween and constitute a second capacitance Cpb2. The fifth electrode E25 and the sixth electrode E26 may overlap each other with the second insulating layer 115 therebetween and constitute a third capacitance Cpb3. The barrier layer 110, the buffer layer 111, the first insulating layer 113, and the second insulating layer 115 may serve as dielectric layers. The first electrode E21 may be electrically connected to the fifth electrode E25. The third electrode E23 may be electrically connected to the sixth electrode E26.

The first capacitor C21 may have a capacitance based on the first capacitance Cpb1, the second capacitance Cpb2, and the third capacitance Cpb3. As an example, the capacitance (or a capacitance value) of the first capacitor C21 may be a sum of the first capacitance Cpb1, the second capacitance Cpb2, and the third capacitance Cpb3.

The second capacitor C22 may include a second electrode E22, the third electrode E23, and a fourth electrode E24. The second electrode E22 and the third electrode E23 may include at least one of molybdenum (Mo), aluminum (Al), copper (Cu), titanium (Ti) and the like and include a single layer or a multi-layer. As an example, the second electrode E22 and the third electrode E23 may be a single Mo layer. The fourth electrode E24 may include an oxide semiconductor material. The fourth electrode E24 may include, for example, an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). The fourth electrode E24 may be made a conductor (or conductive) by a plasma treatment and the like.

The second electrode E22 may be disposed between the substrate 100 and the barrier layer 110, the third electrode E23 may be disposed between the barrier layer 110 and the buffer layer 111, and the fourth electrode E24 may be disposed between the buffer layer 111 and the first insulating layer 113. The second electrode E22 may be apart from the first electrode E21. The second electrode E22 and the third electrode E23 may overlap each other with the barrier layer 110 therebetween and constitute the fourth capacitance Cpb4. The third electrode E23 and the fourth electrode E24 may overlap each other with the buffer layer 111 therebetween and constitute the fifth capacitance Cpb5. The barrier layer 110 and the buffer layer 111 may serve as dielectric layers of the capacitor. The second electrode E22 may be electrically connected to the fourth electrode E24.

The second capacitor C22 may have a capacitance based on the fourth capacitance Cpb4 and the fifth capacitance Cpb5. As an example, the capacitance of the second capacitor C22 may be a sum of the fourth capacitance Cpb4 and the fifth capacitance Cpb5.

In an embodiment, a preset voltage may be applied to the second electrode E22 and the fourth electrode E24. As an example, the first driving voltage ELVDD of FIG. 5 described below may be applied to the second electrode E22 and the fourth electrode E24.

In case that the 'first capacitor C21 may include the third electrode E23', it may mean that the 'first capacitor C21 may include a portion of the third electrode E23 overlapping the first electrode E21 and the fifth electrode E25.' In case that the 'second capacitor C22 may include the third electrode E23', it may mean that the 'second capacitor C22 may include another portion of the third electrode E23 overlapping the second electrode E22 and the fourth electrode E24.'

As in an embodiment, in case that at least some of electrodes constituting the first capacitor C21 are disposed on the second capacitor C22, an area in which electrodes constituting the second capacitor C22 may be arranged may be increased (or secured). In case that at least some of the electrodes constituting the first capacitor C21 are stacked on the second capacitor C22, a capacitance of the second capacitor C22 may be increased (or secured). In case that the electrodes constituting the second capacitor C22 are stacked in a multi-layered structure, a capacitance of the second capacitor C22 may be increased (or secured) even more.

Figure 3:
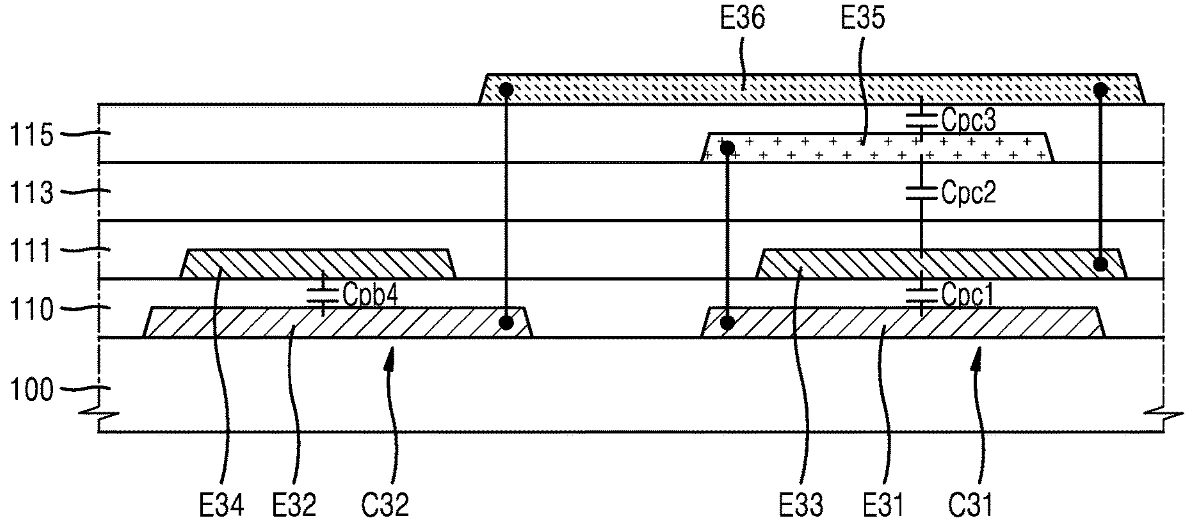
FIG. 3 is a schematic cross-sectional view of a display apparatus according to an embodiment.

FIG. 3 is a schematic cross-sectional view of the display apparatus according to an embodiment. In FIG. 3, the same reference numerals as those of FIG. 1 denote the same members, and thus, repeated descriptions thereof are omitted.

Referring to FIG. 3, the display apparatus may include a first capacitor C31 and a second capacitor C32.

The first capacitor C31 may include a first electrode E31, a third electrode E33, a fifth electrode E35, and a sixth electrode E36. The first electrode E31, the third electrode E33, the fifth electrode E35, and the sixth electrode E36 may include at least one of molybdenum (Mo), aluminum (Al), copper (Cu), titanium (Ti) and the like and include a single layer or a multi-layer. As an example, the first electrode E31, the third electrode E33, and the fifth electrode E35 may each be a single Mo layer. The sixth electrode E36 may have a multi-layered structure of Ti/Al/Ti.

The first electrode E31 may be disposed between the substrate 100 and the barrier layer 110, the third electrode E33 may be disposed between the barrier layer 110 and the buffer layer 111, the fifth electrode E35 may be disposed between the first insulating layer 113 and the second insulating layer 115, and the sixth electrode E36 may be disposed on the second insulating layer 115. The first electrode E31 and the third electrode E33 may overlap each other with the barrier layer 110 therebetween and constitute a first capacitance Cpc1. The third electrode E33 and the fifth electrode E35 may overlap each other with the buffer layer 111 and the first insulating layer 113 therebetween and constitute a second capacitance Cpc2. The fifth electrode E35 and the sixth electrode E36 may overlap each other with the second insulating layer 115 therebetween and constitute a third capacitance Cpc3. The barrier layer 110, the buffer layer 111, the first insulating layer 113, and the second insulating layer 115 may serve as dielectric layers. The first electrode E31 may be electrically connected to the fifth electrode E35. The third electrode E33 may be electrically connected to the sixth electrode E36.

The first capacitor C31 may have a capacitance based on the first capacitance Cpc1, the second capacitance Cpc2, and the third capacitance Cpc3. As an example, the capacitance of the first capacitor C31 may be a sum of the first capacitance Cpc1, the second capacitance Cpc2, and the third capacitance Cpc3.

The second capacitor C32 may include a second electrode E32 and a fourth electrode E34. The second electrode E32 and the fourth electrode E34 may include at least one of molybdenum (Mo), aluminum (Al), copper (Cu), titanium (Ti) and the like and include a single layer or a multi-layer. As an example, the second electrode E32 and the fourth electrode E34 may each be a single Mo layer.

The second electrode E32 may be disposed between the substrate 100 and the barrier layer 110, and the fourth electrode E34 may be disposed between the barrier layer 110 and the buffer layer 111. The second electrode E32 may be apart from the first electrode E31, and the fourth electrode E34 may be apart from the third electrode E33. The second electrode E32 and the fourth electrode E34 may overlap each other with the barrier layer 110 therebetween and constitute the fourth capacitance Cpb4. The barrier layer 110 may serve as a dielectric layer of the capacitor. The second electrode E32 may be electrically connected to the sixth electrode E36.

The second capacitor C32 may have a capacitance based on the fourth capacitance Cpb4. As an example, the capacitance of the second capacitor C32 may be the fourth capacitance Cpb4.

In an embodiment, a preset voltage may be applied to the fourth electrode E34. As an example, the first driving voltage ELVDD of FIG. 5 described below may be applied to the fourth electrode E34.

As in an embodiment, in case that at least some of electrodes constituting the first capacitor C31 are disposed on the second capacitor C32, an area in which electrodes constituting the second capacitor C32 may be arranged may be increased (or secured). In case that at least some of the electrodes constituting the first capacitor C31 are stacked on the second capacitor C32, a capacitance of the second capacitor C32 may be increased (or secured).

Figure 4:
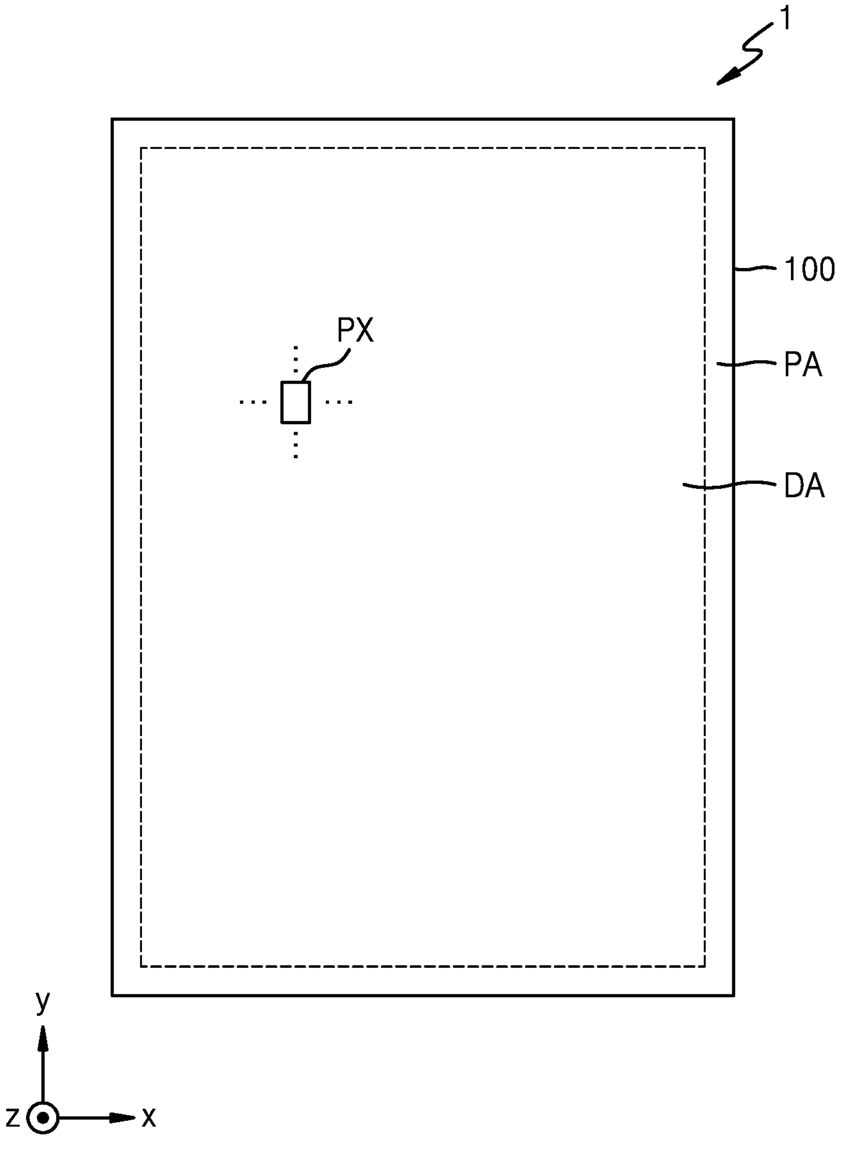
FIG. 4 is a schematic plan view of a display apparatus according to an embodiment.

FIG. 4 is a schematic plan view of the display apparatus according to an embodiment.

Referring to FIG. 4, the display apparatus 1 may include a display area DA and a peripheral area PA. The display area DA may be configured to display images, and the peripheral area PA may surround at least a portion of the display area DA. The display apparatus 1 may display images to outside by using light emitted from the display area DA. Because the display apparatus 1 includes the substrate 100, it may be understood that the substrate 100 includes the display area DA and the peripheral area PA. In other words, it may be understood that the display area DA and the peripheral area PA are defined in the substrate 100.

The substrate 100 may include various materials such as glass, metal, and/or plastic. In an embodiment, the substrate 100 may include a flexible material. Here, the flexible material denotes a material that is readily warped, bendable, foldable, and/or rollable. The substrate 100 of the flexible material may include ultra-thin glass, metal, and/or plastic.

As shown in FIG. 4, the display area DA may be rectangular. In another embodiment, the display area DA may be provided in a polygonal shape such as a triangle, a pentagon, a hexagon, and the like, a circular shape, an elliptical shape, an irregular shape, or the like.

Pixels PX including various display elements such as an organic light-emitting diode OLED may be arranged in the display area DA of the substrate 100. The pixels PX may be arranged in various configurations such as a stripe configuration, a PenTile® configuration, a mosaic configuration, and the like to display images. Hereinafter, in the specification, each pixel PX denotes a sub-pixel configured to emit light of a different color. Each pixel PX may be, for example, a red sub-pixel, a green sub-pixel, or a blue sub-pixel.

Though an organic light-emitting display apparatus is described as an example of the display apparatus 1 according to an embodiment, the display apparatus 1 according to an embodiment is not limited thereto. In another embodiment, the display apparatus 1 according to an embodiment may be an inorganic light-emitting display apparatus or a quantum-dot light-emitting display apparatus. As an example, an emission layer of a display element of a display apparatus 1 may include an organic material, an inorganic material, quantum dots, an organic material and quantum dots, inorganic material and quantum dots, or an organic material, an inorganic material, and quantum dots.

The peripheral area PA of the substrate 100 is a region arranged around the display area DA and may be a region in which images are not displayed. Pads may be arranged in the peripheral area PA. Various wirings, a printed circuit board or a driver integrated circuit (IC) chip configured to transfer electric signals to the display area DA may be attached to the pads.

Figure 5:
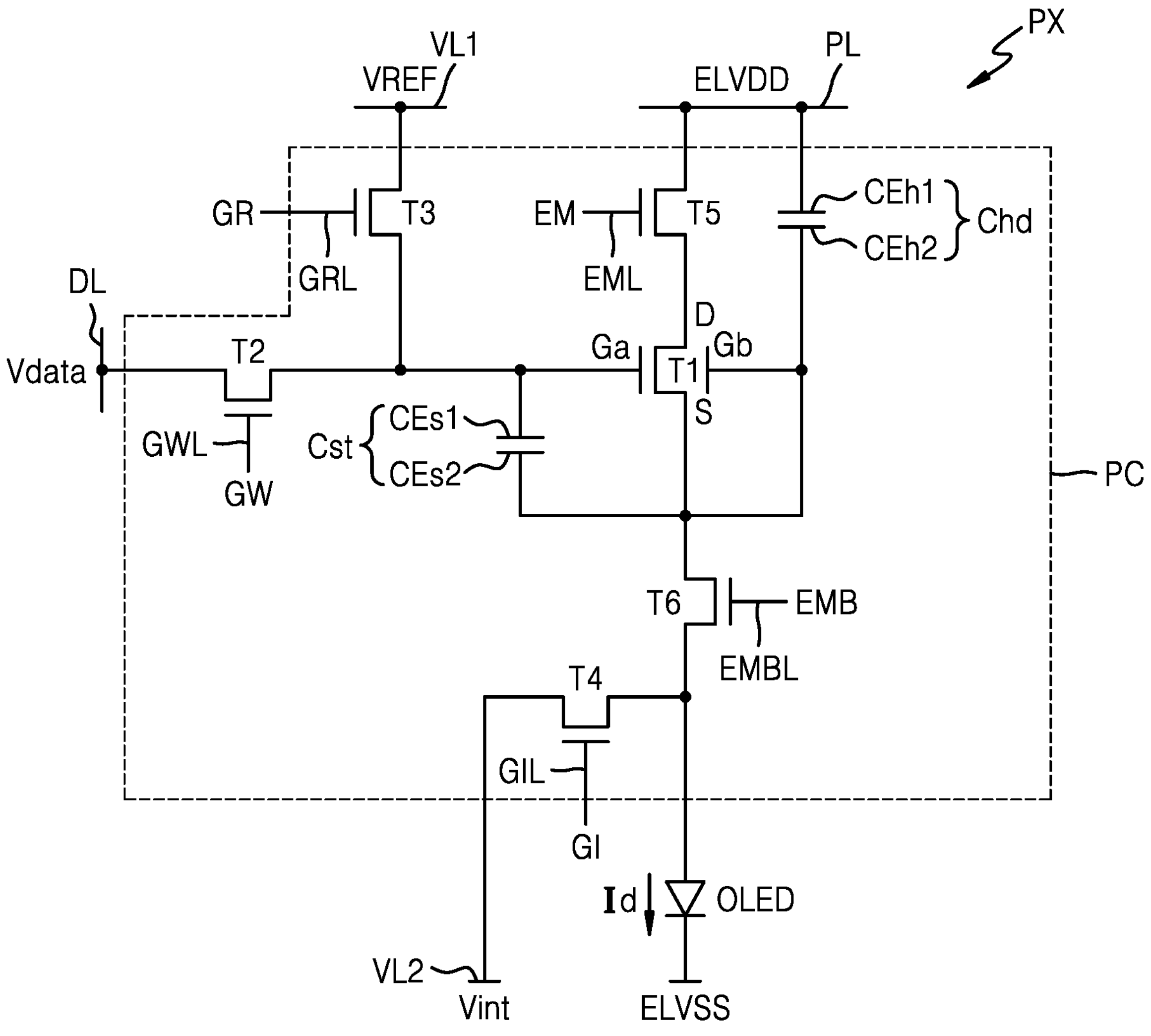
FIG. 5 is a schematic diagram of an equivalent circuit of a pixel included in the display apparatus of FIG. 4.

FIG. 5 is a schematic diagram of an equivalent circuit of a pixel included in the display apparatus of FIG. 4.

Referring to FIG. 5, a pixel PX may include a pixel circuit PC and a display element electrically connected to the pixel circuit PC. The display element may be an organic light-emitting diode OLED including an anode (or a pixel electrode) and a cathode (an opposite electrode).

As an example, as shown in FIG. 5, the pixel circuit PC may include first to sixth transistors T1, T2, T3, T4, T5, and T6, a storage capacitor Cst, and a hold capacitor Chd. The first to sixth transistors T1, T2, T3, T4, T5, and T6, the storage capacitor Cst, and the hold capacitor Chd may be connected to first to third scan lines GWL, GRL, and GIL, a data line DL, first and second emission control lines EML and EMBL, a power line PL, a first voltage line VL1, a second voltage line VL2, and a common electrode. The first to third scan lines GWL, GRL, and GIL may be configured to respectively transfer first to third scan signals GW, GR, and GI, the data line DL may be configured to transfer a data voltage Vdata, the first and second emission control lines EML and EMBL may be configured to respectively transfer first and second emission control signals EM and EMB, the power line PL may be configured to transfer the first driving voltage ELVDD, the first voltage line VL1 may be configured to transfer a reference voltage VREF, the second voltage line VL2 may be configured to transfer an initialization voltage Vint, and a second driving voltage ELVSS may be applied to the common electrode.

The first transistor T1 may be a driving transistor in which the magnitude of a drain current thereof may be determined according to a (upper) gate-source voltage thereof, and the second to sixth transistors T2, T3, T4, T5, and T6 may be switching transistors that are turned on/off according to a gate-source voltage, substantially a gate voltage. The first to sixth transistors T1, T2, T3, T4, T5, and T6 may be formed as thin-film transistors.

In an embodiment, as shown in FIG. 5, the first to sixth transistors T1, T2, T3, T4, T5, and T6 may be provided as N-channel metal-oxide semiconductor field-effect transistors (MOSFETs). In another embodiment, some of the first to sixth transistors T1, T2, T3, T4, T5, and T6 may be N-channel metal-oxide semiconductor (NMOS) field-effect transistors (n-channel MOSFETs), and the rest of the first to sixth transistors T1, T2, T3, T4, T5, and T6 may be P-channel metal-oxide semiconductor (PMOS) field-effect transistors (P-channel MOSFETs). In another embodiment, the first to sixth transistors T1, T2, T3, T4, T5, and T6 may be P-channel metal-oxide semiconductor (PMOS) field-effect transistors (P-channel MOSFETs).

In an embodiment, the semiconductor layers of the first to sixth transistors T1, T2, T3, T4, T5, and T6 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). As an example, the semiconductor layer may be an ITZO (In—Sn—Zn—O) semiconductor layer, an IGZO (In—Ga—Zn—O) semiconductor layer and the like.

As another example, the first to sixth transistors T1, T2, T3, T4, T5, and T6 may include a semiconductor layer including silicon. As an example, the first to sixth transistors T1, T2, T3, T4, T5, and T6 may include a semiconductor layer including low temperature polycrystalline silicon (LTPS). Because a polysilicon material has a high electron mobility (100 $cm^2$/Vs or more), energy power consumption may be low and reliability may be excellent.

As another example, some of the semiconductor layers among the first to sixth transistors T1, T2, T3, T4, T5, and T6 may include low temperature polycrystalline silicon (LTPS), and others of the first to sixth transistors T1, T2, T3, T4, T5, and T6 may include oxide semiconductor (e.g., IGZO and the like).

The storage capacitor Cst may include a first storage electrode CEs1 and a second storage electrode CEs2. The hold capacitor Chd may include a first hold electrode CEh1 and a second hold electrode CEh2. The first hold electrode CEh1 may be connected to the power line PL, and the second hold electrode CEh2 may be connected to the second storage electrode CEs2 of the storage capacitor Cst.

The first transistor T1 may be configured to control the magnitude of a driving current Id flowing through the organic light-emitting diode OLED from the power line PL according to a (upper) gate-source voltage. The first transistor T1 may include an upper gate Ga, a drain D, a source S, and a lower gate Gb. The upper gate Ga may be connected to the first storage electrode CEs1 of the storage capacitor Cst, the drain D may be connected to the power line PL through the fifth transistor T5, the source S may be connected to the organic light-emitting diode OLED through the sixth transistor T6, and the lower gate Gb may be connected to the second hold electrode CEh2 of the hold capacitor Chd. The lower gate Gb of the first transistor T1 may be connected to the source S of the first transistor T1.

The first transistor T1 may be configured to output the driving current Id to the organic light-emitting diode OLED according to a gate-source voltage. The magnitude of the driving current Id may be determined based on a difference between the gate-source voltage of the first transistor T1 and a threshold voltage. The organic light-emitting diode OLED may be configured to receive the driving current Id from the first transistor T1 and emit light at a brightness corresponding to the magnitude of the driving current Id.

The second transistor T2 may be configured to connect the data line DL to the first storage electrode CEs1 of the storage capacitor Cst (or the upper gate Ga of the first transistor T1) in response to a first scan signal GW. The second transistor T2 may be configured to connect the data line DL and the first storage electrode CEs1 of the storage capacitor Cst (or the upper gate Ga of the first transistor T1) to each other in response to a first scan signal GW. The second transistor T2 may be configured to transfer the data voltage Vdata to the first storage electrode CEs1 of the storage capacitor Cst (or the upper gate Ga of the first transistor T1) in response to a first scan signal GW.

The third transistor T3 may be configured to connect the first voltage line VL1 to the upper gate Ga of the first transistor T1 in response to a second scan signal GR. The third transistor T3 may be configured to connect the first voltage line VL1 and the upper gate Ga of the first transistor T1 to each other in response to a second scan signal GR. The third transistor T3 may be configured to apply the reference voltage VREF to the upper gate Ga of the first transistor T1 in response to a second scan signal GR.

The fourth transistor T4 may be configured to connect the second voltage line VL2 to an anode of the organic light-emitting diode OLED in response to a third scan signal GI. The fourth transistor T4 may be configured to connect the second voltage line VL2 and an anode of the organic light-emitting diode OLED to each other in response to a third scan signal GI. The fourth transistor T4 may be configured to apply the initialization voltage Vint to an anode of the organic light-emitting diode OLED in response to a third scan signal GI.

The fifth transistor T5 may be configured to connect the power line PL to the drain D of the first transistor T1 in response to a first emission control signal EM. The fifth transistor T5 may be configured to connect the power line PL and the drain D of the first transistor T1 to each other in response to a first emission control signal EM. The fifth transistor T5 may be configured to apply the first driving voltage ELVDD to the drain D of the first transistor T1 in response to a first emission control signal EM.

The sixth transistor T6 may be configured to connect the source S of the first transistor T1 to the anode of the organic light-emitting diode OLED in response to a second emission control signal EMB. The sixth transistor T6 may be configured to connect the source S of the first transistor T1 and the anode of the organic light-emitting diode OLED to each other in response to a second emission control signal EMB.

Although it is shown in FIG. 5 that the fifth transistor T5 and the sixth transistor T6 are configured to respectively operate in response to different emission controls signals EM and EMB, the fifth transistor T5 and the sixth transistor T6 may be configured to operate in response to the same emission control signal in another embodiment.

In an embodiment, a second scan signal GR may be substantially synchronized with a first scan signal GW in a previous row. A third scan signal GI may be substantially synchronized with a first scan signal GW. According to another example, a third scan signal GI may be substantially synchronized with a first scan signal GW in the next row or a second scan signal GR in the next row.

Although it is shown in FIG. 5 that the pixel circuit PC includes six transistors and two capacitors, the pixel circuit PC may include five transistors and two capacitors in another embodiment. In another embodiment, the pixel circuit PC may include seven transistors and two capacitors.

Figure 6:
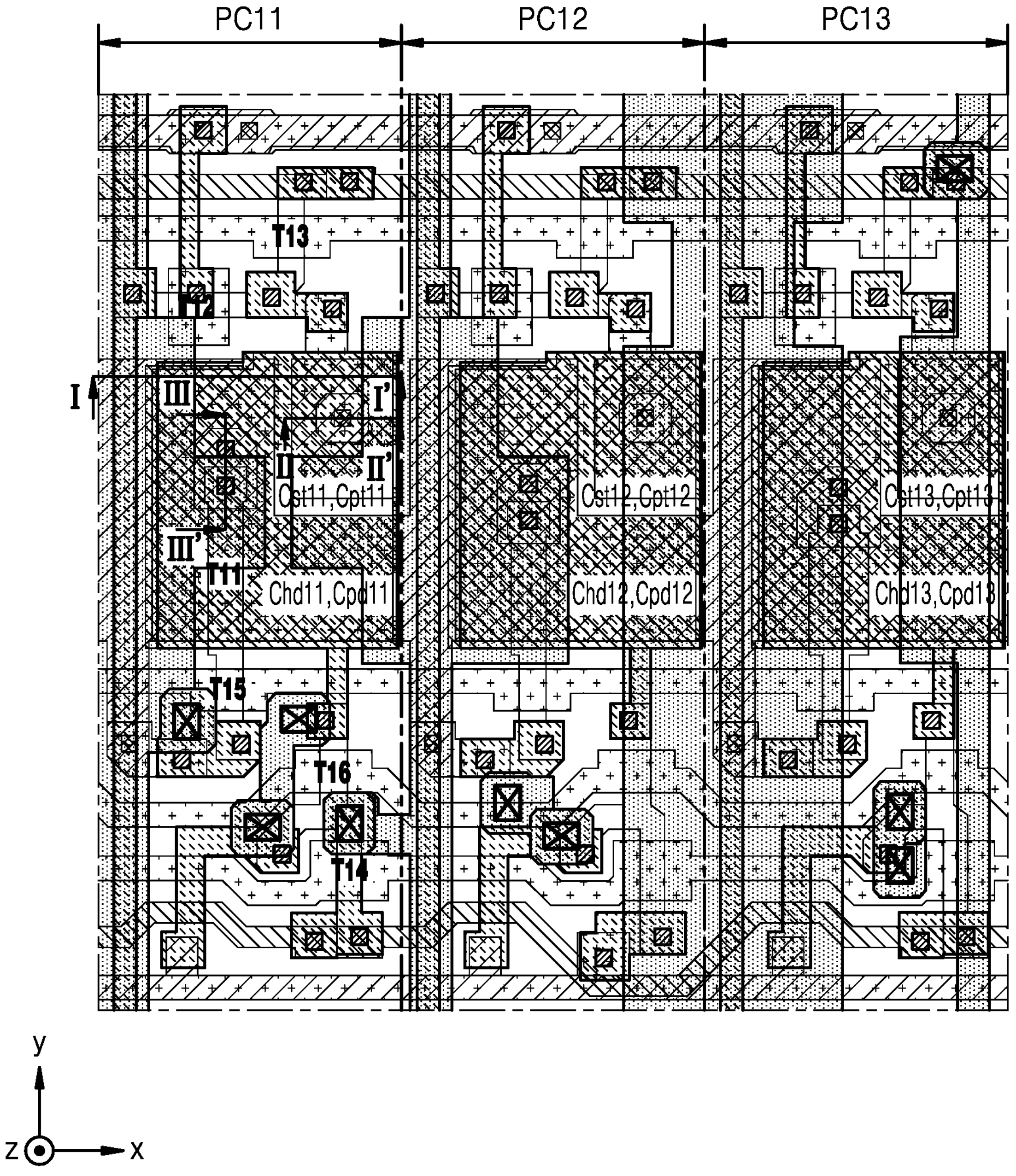
FIG. 6 is a schematic configuration view of positions of transistors, capacitors, and the like in pixel circuits included in the display apparatus of FIG. 4.

FIG. 6 is a schematic configuration view of positions of transistors, capacitors and the like in pixel circuits included in the display apparatus of FIG. 4, and FIGS. 7 to 11 are schematic configuration views of elements such as transistors and capacitors, for layers of a display apparatus shown in FIG. 6. Although FIGS. 7 to 11 describe a first pixel circuit PC11 of FIG. 6, the description is equally applicable to a second pixel circuit PC12 and a third pixel circuit PC13.

First, referring to FIG. 6, the display apparatus may include the first pixel circuit PC11, the second pixel circuit PC12, and the third pixel circuit PC13. The first pixel circuit PC11, the second pixel circuit PC12, and the third pixel circuit PC13 may be arranged in a first direction (e.g., ±x direction).

The first pixel circuit PC11, the second pixel circuit PC12, and the third pixel circuit PC13 may each correspond to the pixel circuit PC of FIG. 5. As an example, the first pixel circuit PC11 may include first to sixth transistors T11, T12, T13, T14, T15, and T16, a first storage capacitor Cst11, and a first hold capacitor Chd11. The first to sixth transistors T11, T12, T13, T14, T15, and T16 may correspond to the first to sixth transistor T1, T2, T3, T4, T5, and T6 of FIG. 5, the first storage capacitor Cst11 may correspond to the storage capacitor Cst of FIG. 5, and the first hold capacitor Chd11 may correspond to the hold capacitor Chd of FIG. 5. Although description has been made to the first pixel circuit PC11, the description is equally applicable to the second pixel circuit PC12 and the third pixel circuit PC13. As an example, the second pixel circuit PC12 may include a second storage capacitor Cst12 and a second hold capacitor Chd12, and the third pixel circuit PC13 may include a third storage capacitor Cst13 and a third hold capacitor Chd13. The second storage capacitor Cst12 and the third storage capacitor Cst13 may each correspond to the storage capacitor Cst of FIG. 5, and the second hold capacitor Chd12 and the third hold capacitor Chd13 may each correspond to the hold capacitor Chd of FIG. 5.

In an embodiment, the first pixel circuit PC11, the second pixel circuit PC12, and the third pixel circuit PC13 may be respectively electrically connected to display elements configured to emit light of different colors. The first pixel circuit PC11, the second pixel circuit PC12, and the third pixel circuit PC13 may be configured to respectively drive display elements configured to emit light of different colors. As an example, a display element electrically connected to the first pixel circuit PC11 may be configured to emit red light. The first pixel circuit PC11 may be configured to drive a display element configured to emit red light. A display element electrically connected to the second pixel circuit PC12 may be configured to emit green light. The second pixel circuit PC12 may be configured to drive a display element configured to emit green light. A display element electrically connected to the third pixel circuit PC13 may be configured to emit blue light. The third pixel circuit PC13 may be configured to drive a display element configured to emit blue light.

The first storage capacitor Cst11 of the first pixel circuit PC11 may have a first storage capacitance Cpt11, and the first hold capacitor Chd11 of the first pixel circuit PC11 may have a first hold capacitance Cpd11. The second storage capacitor Cst12 of the second pixel circuit PC12 may have a second storage capacitance Cpt12, and the second hold capacitor Chd12 of the second pixel circuit PC12 may have a second hold capacitance Cpd12. The third storage capacitor Cst13 of the third pixel circuit PC13 may have a third storage capacitance Cpt13, and the third hold capacitor Chd13 of the third pixel circuit PC13 may have a third hold capacitance Cpd13.

In an embodiment, the first storage capacitance Cpt11 of the first storage capacitor Cst11, the second storage capacitance Cpt12 of the second storage capacitor Cst12, and the third storage capacitance Cpt13 of the third storage capacitor Cst13 may be substantially equal to each other. The first hold capacitance Cpd11 of the first hold capacitor Chd11, the second hold capacitance Cpd12 of the second hold capacitor Chd12, and the third hold capacitance Cpd13 of the third hold capacitor Chd13 may be substantially equal to each other.

In another embodiment, the first storage capacitance Cpt11 of the first storage capacitor Cst11, the second storage capacitance Cpt12 of the second storage capacitor Cst12, and the third storage capacitance Cpt13 of the third storage capacitor Cst13 may be different from each other. The first hold capacitance Cpd11 of the first hold capacitor Chd11, the second hold capacitance Cpd12 of the second hold capacitor Chd12, and the third hold capacitance Cpd13 of the third hold capacitor Chd13 may be substantially different from each other. As an example, the second storage capacitance Cpt12 of the second storage capacitor Cst12 may be greater than the first storage capacitance Cpt11 of the first storage capacitor Cst11, and the third storage capacitance Cpt13 of the third storage capacitor Cst13. The third hold capacitance Cpd13 of the third hold capacitor Chd13 may be greater than the first hold capacitance Cpd11 of the first hold capacitor Chd11 and the second hold capacitance Cpd12 of the second hold capacitor Chd12.

Elements such as transistors and capacitors of the display apparatus shown in FIG. 6 are described more specifically with reference to FIGS. 7 to 11.

Figure 7:
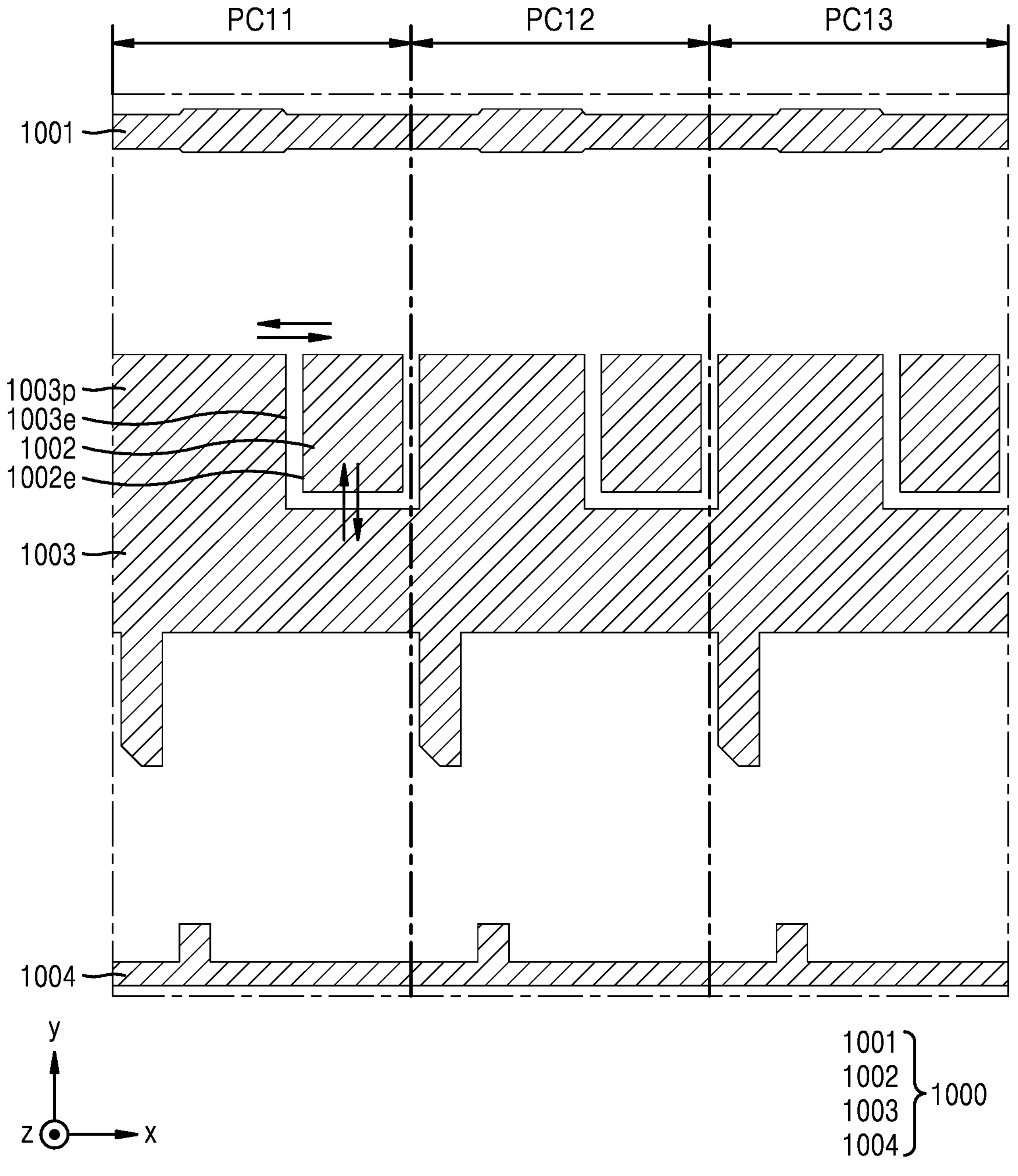
FIGS. 7 to 11 are schematic configuration views of elements such as transistors and capacitors, for layers of the display apparatus shown in FIG. 6.

A first conductive layer 1000 shown in FIG. 7 may be disposed on the substrate 100 (see FIG. 4). The first conductive layer 1000 may include at least one of molybdenum (Mo), aluminum (Al), copper (Cu), titanium (Ti) and the like and include a single layer or a multi-layer. As an example, the first conductive layer 1000 may include a single Mo layer.

The first conductive layer 1000 may include a first conductive pattern 1001, a second conductive pattern 1002, a third conductive pattern 1003, and a fourth conductive pattern 1004. The first conductive pattern 1001, the third conductive pattern 1003, and the fourth conductive pattern 1004 may substantially extend in the first direction (e.g., the ±x direction). The third conductive pattern 1003 may be in a state in which a preset voltage is applied. As an example, the first driving voltage ELVDD of FIG. 5 may be applied to the third conductive pattern 1003. The fourth conductive pattern 1004 may be a repair line. The first conductive pattern 1001 may correspond to the first scan line GWL of FIG. 5, the second conductive pattern 1002 may correspond to the first storage electrode CEs1 of the storage capacitor Cst of FIG. 5, and the third conductive pattern 1003 may correspond to the first hold electrode CEh1 of the hold capacitor Chd of FIG. 5.

In an embodiment, the third conductive pattern 1003 may have a protrusion 1003*p* protruding in a second direction (e.g., a ±y direction). The second conductive pattern 1002 may be arranged adjacent to the protrusion 1003*p* of the third conductive pattern 1003 in the first direction (e.g., the ±x direction). The second conductive pattern 1002 may be arranged between the protrusions 1003*p* of the third conductive pattern 1003.

The areas of the second conductive pattern 1002 and the third conductive pattern 1003 may be changed by moving the positions of an edge 1002*e* of the second conductive pattern 1002 and an edge 1003*e* of the third conductive pattern 1003 facing each other in the first direction (e.g., the ±x direction) and/or the second direction (e.g., the ±y direction). As an example, in case that the positions of the edge 1002*e* of the second conductive pattern 1002 and the edge 1003*e* of the third conductive pattern 1003 facing each other are moved in the +x direction, the area of the second conductive pattern 1002 may be reduced, and the area of the third conductive pattern 1003 may be increased. In case that the positions of the edge 1002*e* of the second conductive pattern 1002 and the edge 1003*e* of the third conductive pattern 1003 facing each other are moved in the −x direction, the area of the second conductive pattern 1002 may be increased, and the area of the third conductive pattern 1003 may be reduced. In case that the positions of the edge 1002*e* of the second conductive pattern 1002 and the edge 1003*e* of the third conductive pattern 1003 facing each other are moved in the +y direction, the area of the second conductive pattern 1002 may be reduced, and the area of the third conductive pattern 1003 may be increased. In case that the positions of the edge 1002*e* of the second conductive pattern 1002 and the edge 1003*e* of the third conductive pattern 1003 facing each other are moved in the −y direction, the area of the second conductive pattern 1002 may be increased, and the area of the third conductive pattern 1003 may be reduced.

Figure 8:
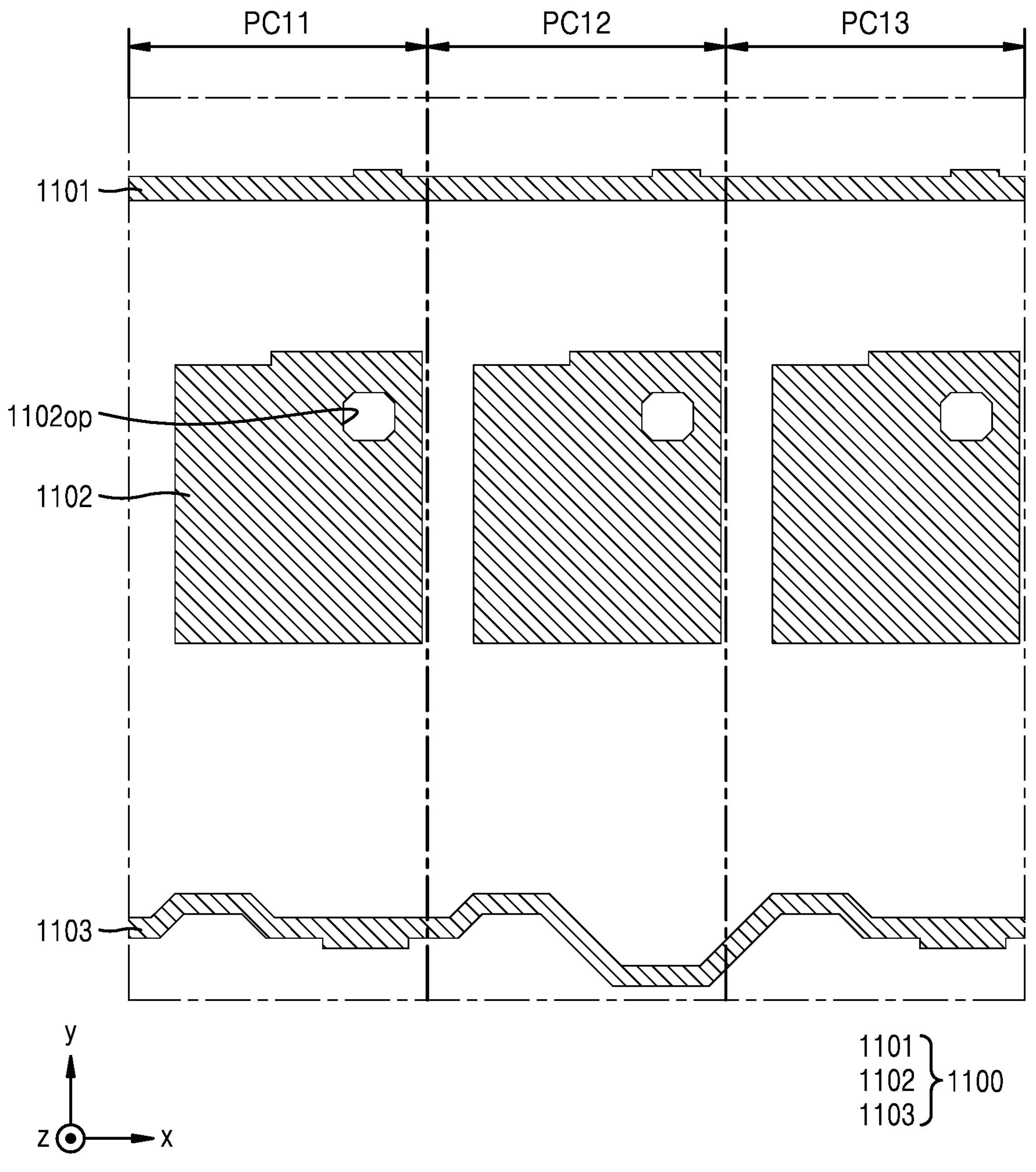

A second conductive layer 1100 shown in FIG. 8 may be disposed on the first conductive layer 1000. The second conductive layer 1100 may include at least one of molybdenum (Mo), aluminum (Al), copper (Cu), titanium (Ti) and the like and include a single layer or a multi-layer. As an example, the second conductive layer 1100 may include a single Mo layer.

The second conductive layer 1100 may include a fifth conductive pattern 1101, a sixth conductive pattern 1102, and a seventh conductive pattern 1103. The fifth conductive pattern 1101 and the seventh conductive pattern 1103 may substantially extend in the first direction (e.g., the ±x direction). The fifth conductive pattern 1101 and the seventh conductive pattern 1103 may be in a state in which a preset voltage is applied. As an example, the reference voltage VREF of FIG. 5 may be applied to the fifth conductive pattern 1101, and the initialization voltage Vint of FIG. 5 may be applied to the seventh conductive pattern 1103. A first opening 1102*op* may be formed in the sixth conductive pattern 1102. A conductive pattern disposed on the sixth conductive pattern 1102 may be connected to a conductive pattern disposed under the sixth conductive pattern 1102 through the first opening 1102*op* of the sixth conductive pattern 1102. The fifth conductive pattern 1101 may correspond to the first voltage line VL1 of FIG. 5, the sixth conductive pattern 1102 may correspond to the second storage electrode CEs2 of the storage capacitor Cst and the second hold electrode CEh2 of the hold capacitor Chd of FIG. 5, and the seventh conductive pattern 1103 may correspond to the second voltage line VL2 of FIG. 5.

Figure 9:
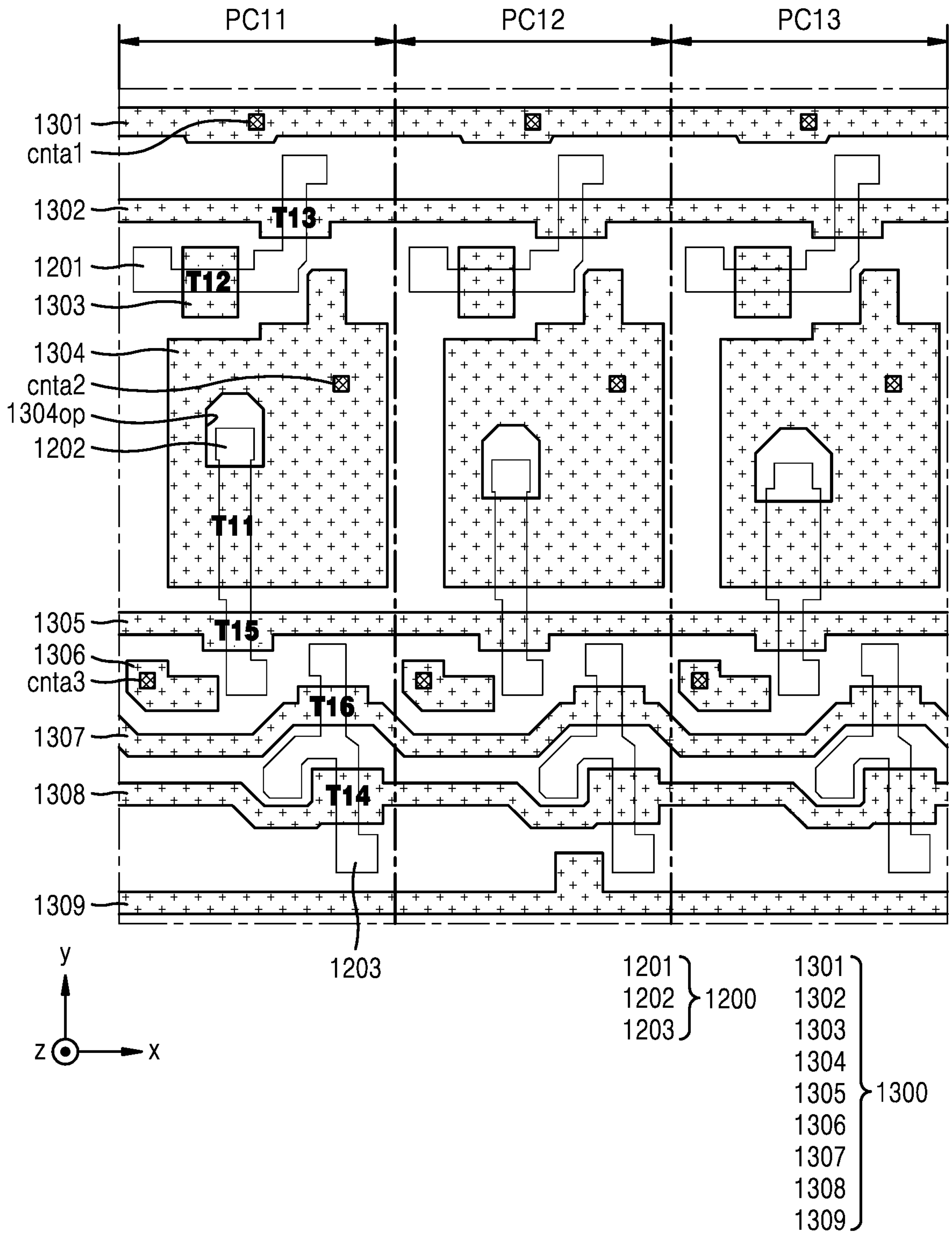

A semiconductor layer 1200 shown in FIG. 9 may be disposed on the second conductive layer 1100. The semiconductor layer 1200 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). As an example, the semiconductor layer 1200 may be an ITZO(InSnZnO) semiconductor layer, an IGZO(InGaZnO) semiconductor layer and the like. In case needed, a process of making a conductor (conductive) by plasma treatment and the like may be performed on at least a portion of the semiconductor layer 1200. The semiconductor layer 1200 may include a first semiconductor pattern 1201, a second semiconductor pattern 1202, and a third semiconductor pattern 1203.

A third conductive layer 1300 shown in FIG. 9 may be disposed on the semiconductor layer 1200. The third conductive layer 1300 may include at least one of molybdenum (Mo), aluminum (Al), copper (Cu), titanium (Ti) and the like and include a single layer or a multi-layer. As an example, the third conductive layer 1300 may include a single Mo layer.

The third conductive layer 1300 may include an eighth conductive pattern 1301, a ninth conductive pattern 1302, a tenth conductive pattern 1303, an eleventh conductive pattern 1304, a twelfth conductive pattern 1305, a thirteenth conductive pattern 1306, a fourteenth conductive pattern 1307, a fifteenth conductive pattern 1308, and a sixteenth conductive pattern 1309. The eighth conductive pattern 1301, the ninth conductive pattern 1302, the twelfth conductive pattern 1305, the fourteenth conductive pattern 1307, the fifteenth conductive pattern 1308, and the sixteenth conductive pattern 1309 may substantially extend in the first direction (e.g., the ±x direction). A second opening 1304*op* may be formed in the eleventh conductive pattern 1304. A conductive pattern disposed on the eleventh conductive pattern 1304 may be connected to a semiconductor pattern and/or a conductive pattern disposed under the eleventh conductive pattern 1304 through the second opening 1304*op* of the eleventh conductive pattern 1304. The eighth conductive pattern 1301 may correspond to the first scan line GWL of FIG. 5, the ninth conductive pattern 1302 may correspond to the second scan line GRL of FIG. 5, the eleventh conductive pattern 1304 may correspond to the first storage electrode CEs1 of the storage capacitor Cst of FIG. 5, the twelfth conductive pattern 1305 may correspond to the first emission control line EML of FIG. 5, the fourteenth conductive pattern 1307 may correspond to the second emission control line EMBL of FIG. 5, the fifteenth conductive pattern 1308 may correspond to the third scan line GIL of FIG. 5, and the sixteenth conductive pattern 1309 may correspond to the second voltage line VL2 of FIG. 5.

The seventh conductive pattern 1103 and the sixteenth conductive pattern 1309 of FIG. 8 may each correspond to the second voltage line VL2 of FIG. 5 and may be respectively connected to different pixel circuits. As an example, the seventh conductive pattern 1103 may be connected to the first pixel circuit PC11 and the third pixel circuit PC13, and configured to transfer the initialization voltage Vint of FIG. 5 to the first pixel circuit PC11 and the third pixel circuit PC13. The sixteenth conductive pattern 1309 may be connected to the second pixel circuit PC12 and configured to transfer the initialization voltage Vint to the second pixel circuit PC12.

A portion of the tenth conductive pattern 1303 overlapping the first semiconductor pattern 1201 may correspond to a gate of the second transistor T12. A portion of the ninth conductive pattern 1302 overlapping the first semiconductor pattern 1201 may correspond to a gate of the third transistor T13. A portion of the eleventh conductive pattern 1304 overlapping the second semiconductor pattern 1202 may correspond to a (upper) gate of the first transistor T11. A portion of the twelfth conductive pattern 1305 overlapping the second semiconductor pattern 1202 may correspond to a gate of the fifth transistor T15. A portion of the fourteenth conductive pattern 1307 overlapping the third semiconductor pattern 1203 may correspond to a gate of the sixth transistor T16. A portion of the fifteenth conductive pattern 1308 overlapping the third semiconductor pattern 1203 may correspond to a gate of the fourth transistor T14.

The eighth conductive pattern 1301 may be connected to the first conductive pattern 1001 through a first contact hole cnta1. The first conductive pattern 1001 and the eighth conductive pattern 1301 may constitute a double scan line. The eleventh conductive pattern 1304 may be connected to the second conductive pattern 1002 through a second contact hole cnta2. The second conductive pattern 1002 and the eleventh conductive pattern 1304 may constitute the first storage electrode CEs1 of the storage capacitor Cst of FIG. 5. The thirteenth conductive pattern 1306 may be connected to the third conductive pattern 1003 through a third contact hole cnta3.

Figure 10:
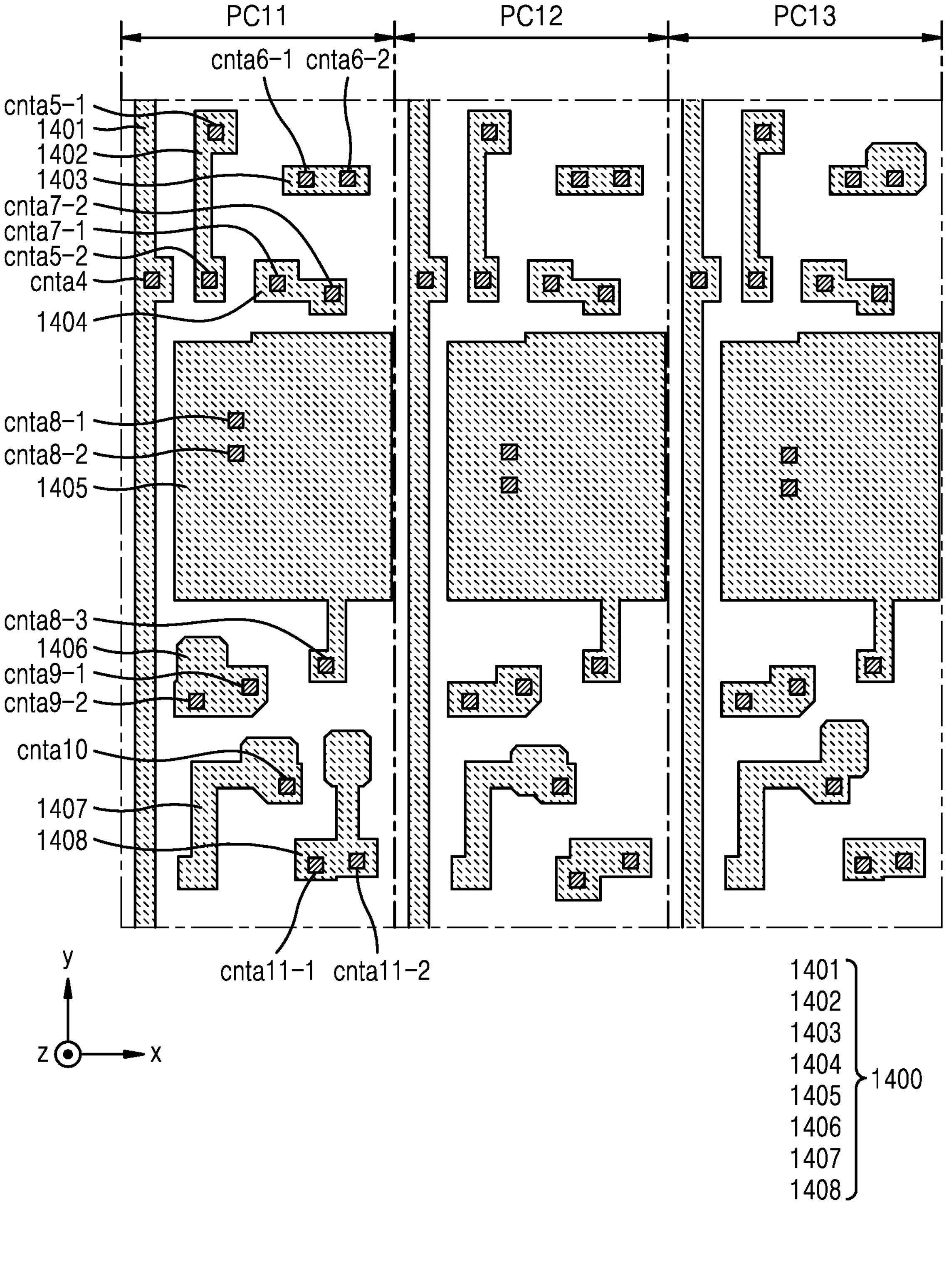

A fourth conductive layer 1400 shown in FIG. 10 may be disposed on the third conductive layer 1300. The fourth conductive layer 1400 may include a conductive material including molybdenum (Mo), aluminum (Al), copper (Cu), and/or titanium (Ti) and have a single-layered structure or a multi-layered structure including the above materials. As an example, the fourth conductive layer 1400 may have a multi-layered structure of Ti/Al/Ti.

The fourth conductive layer 1400 may include a seventeenth conductive pattern 1401, an eighteenth conductive pattern 1402, a nineteenth conductive pattern 1403, a twentieth conductive pattern 1404, a 21-st conductive pattern 1405, a 22-nd conductive pattern 1406, a 23-rd conductive pattern 1407, and a 24-th conductive pattern 1408. The seventeenth conductive pattern 1401 may substantially extend in the second direction (e.g., the ±y direction). The seventeenth conductive pattern 1401 may correspond to the data line DL of FIG. 5. The 21-st conductive pattern 1405 may correspond to the second storage electrode CEs2 of the storage capacitor Cst of FIG. 5.

The seventeenth conductive pattern 1401 may be connected to the first semiconductor pattern 1201 through a fourth contact hole cnta4. The eighteenth conductive pattern 1402 may be connected to the eighth conductive pattern 1301 through a (5-1)st contact hole cnta5-1 and connected to the tenth conductive pattern 1303 through a (5-2)nd contact hole cnta5-2. The nineteenth conductive pattern 1403 may be connected to the first semiconductor pattern 1201 through a (6-1)st contact hole cnta6-1 and connected to the fifth conductive pattern 1101 through a (6-2)nd contact hole cnta6-2. The twentieth conductive pattern 1404 may be connected to the first semiconductor pattern 1201 through a (7-1)st contact hole cnta7-1 and connected to the eleventh conductive pattern 1304 through a (7-2)nd contact hole cnta7-2. The 21-st conductive pattern 1405 may be connected to the sixth conductive pattern 1102 through a (8-1)st contact hole cnta8-1, connected to the second semiconductor pattern 1202 through a (8-2)nd contact hole cnta8-2, and connected to the third semiconductor pattern 1203 through a (8-3)rd contact hole cnta8-3. The 22-nd conductive pattern 1406 may be connected to the second semiconductor pattern 1202 through a (9-1)st contact hole cnta9-1 and connected to the thirteenth conductive pattern 1306 through a (9-2)nd contact hole cnta9-2. The 23-rd conductive pattern 1407 may be connected to the third semiconductor pattern 1203 through a tenth contact hole cnta10. The 24-th conductive pattern 1408 may be connected to the seventh conductive pattern 1103 through a (11-1)st contact hole cnta11-1 and connected to the third semiconductor pattern 1203 through a (11-2)nd contact hole cnta11-2.

Figure 11:
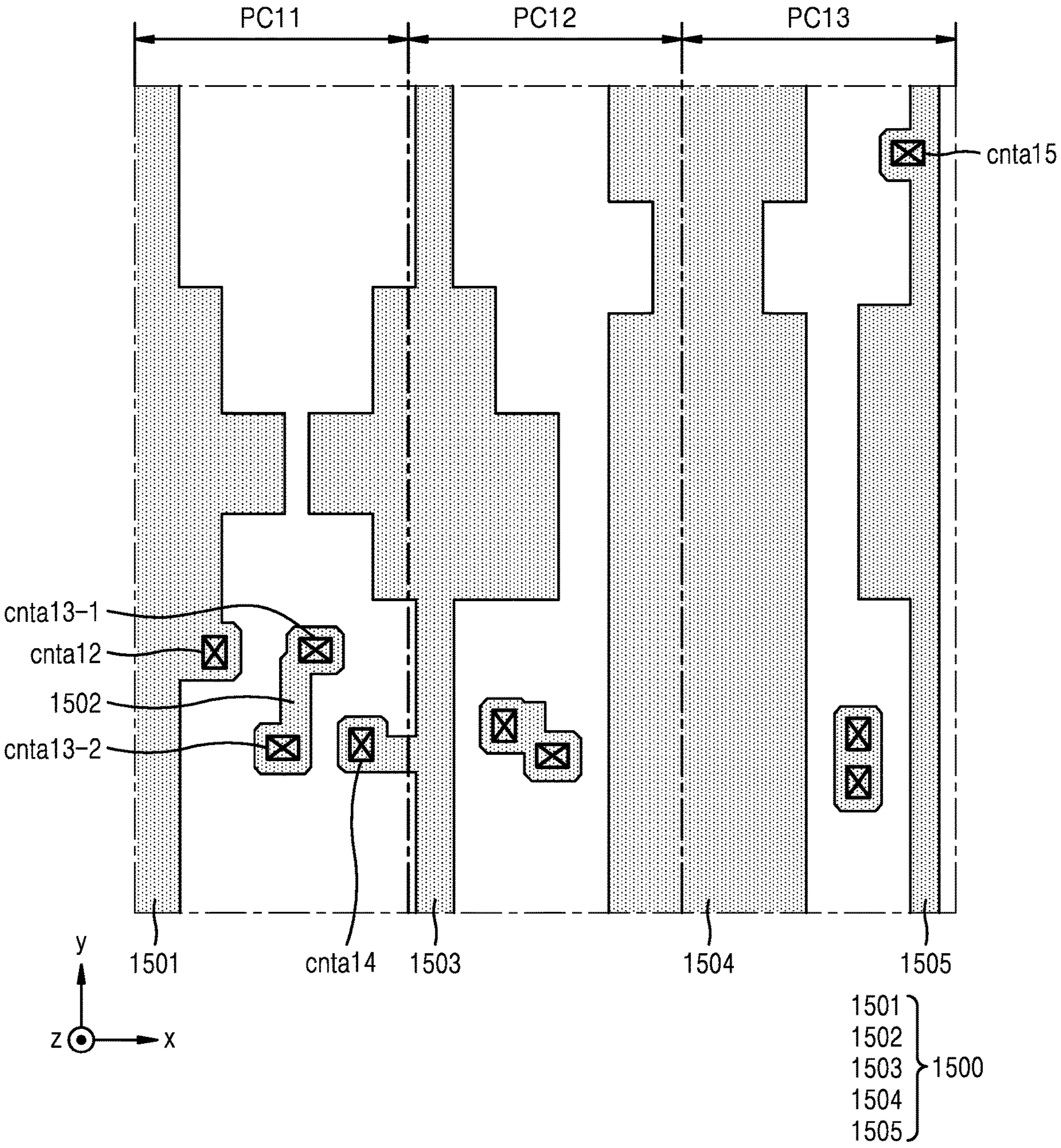

A fifth conductive layer 1500 shown in FIG. 11 may be disposed on the fourth conductive layer 1400. The fifth conductive layer 1500 may include a conductive material including molybdenum (Mo), aluminum (Al), copper (Cu), and/or titanium (Ti) and have a single-layered structure or a multi-layered structure including the above materials. As an example, the fifth conductive layer 1500 may have a multi-layered structure of Ti/Al/Ti.

The fifth conductive layer 1500 may include a 25-th conductive pattern 1501, a 26-th conductive pattern 1502, a 27-th conductive pattern 1503, a 28-th conductive pattern 1504, and a 29-th conductive pattern 1505. The 25-th conductive pattern 1501, the 27-th conductive pattern 1503, the 28-th conductive pattern 1504, and the 29-th conductive pattern 1505 may substantially extend in the second direction (e.g., the ±y direction). The 25-th conductive pattern 1501 may correspond to the power line PL of FIG. 5, the 27-th conductive pattern 1503 may correspond to the second voltage line VL2 of FIG. 5, the 28-th conductive pattern 1504 may correspond to the common electrode of FIG. 5, and the 29-th conductive pattern 1505 may correspond to the first voltage line VL1 of FIG. 5.

The 25-th conductive pattern 1501 may be connected to the 22-nd conductive pattern 1406 through a 12-th contact hole cnta12. The 26-th conductive pattern 1502 may be connected to an anode of the display element through a (13-1)st contact hole cnta13-1 and connected to the 23-rd conductive pattern 1407 through a (13-2)nd contact hole cnta13-2. The 27-th conductive pattern 1503 may be connected to the 24-th conductive pattern 1408 through a 14-th contact hole cnta14. The 29-th conductive pattern 1505 may be connected to the 19-th conductive pattern 1403 of the third pixel circuit PC13 through a 15-th contact hole cnta15.

Figure 12:
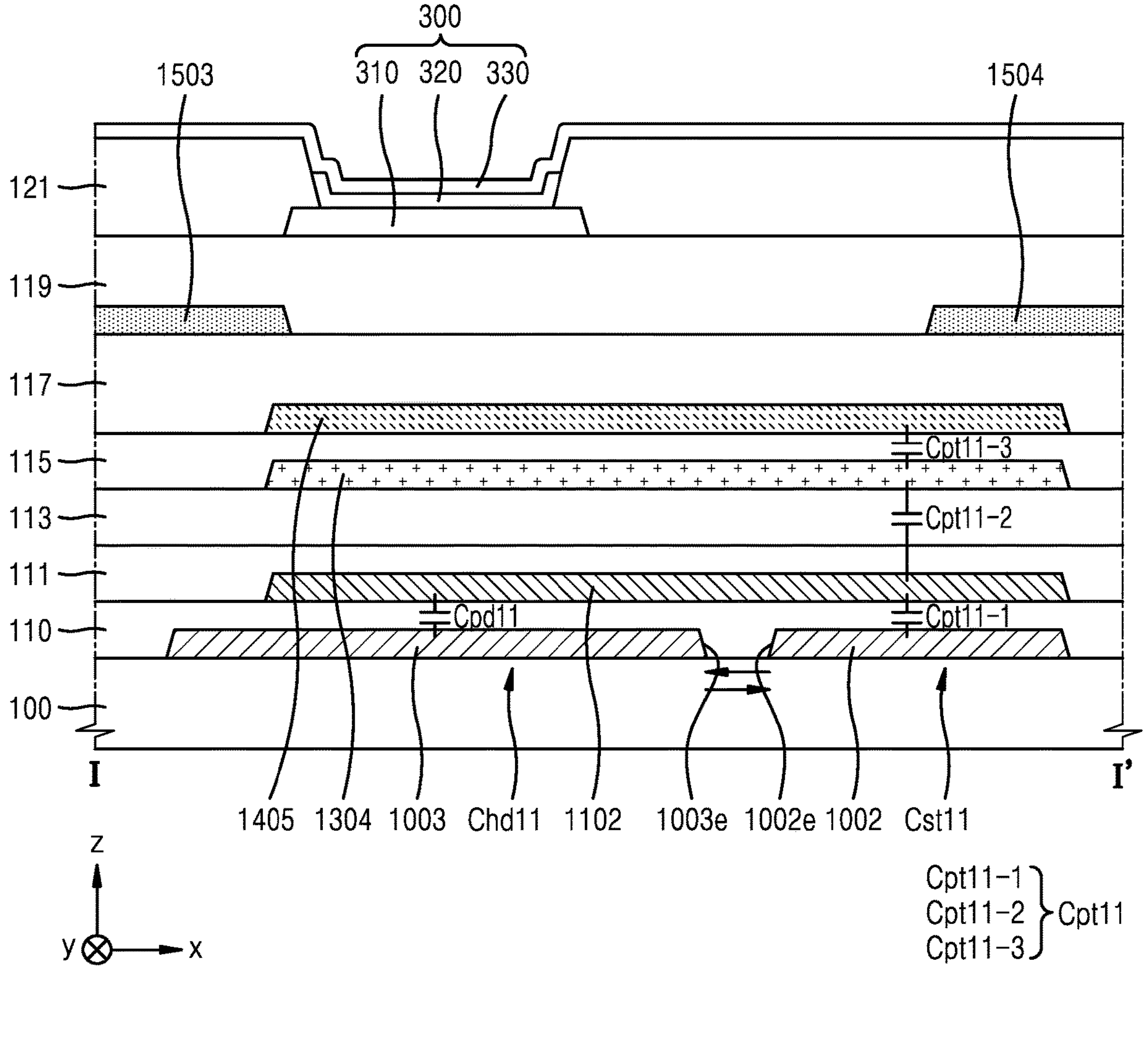
FIG. 12 is a cross-sectional view of an example of a portion of the display apparatus in FIG. 6, taken along line I-I' in FIG. 6.

FIG. 12 is a cross-sectional view of an example of a portion of the display apparatus in FIG. 6, taken along line I-I' in FIG. 6. Although FIG. 12 describes the first pixel circuit PC11 of FIG. 6, the description is equally applicable to a second pixel circuit PC12 and a third pixel circuit PC13.

Referring to FIG. 12, the first pixel circuit PC11 may include the first storage capacitor Cst11 and the first hold capacitor Chd11.

The first storage capacitor Cst11 may include the second conductive pattern 1002 (or a first electrode), the sixth conductive pattern 1102 (or a third electrode), the 11-th conductive pattern 1304 (or a fourth electrode), and the 21-st conductive pattern 1405 (or a fifth electrode). The first storage capacitor Cst11 may include a first storage electrode and a second storage electrode. The first storage electrode may be connected to a (upper) gate of the first transistor T11, and the second storage electrode may be connected to a source of the first transistor T11. The first storage electrode of the first storage capacitor Cst11 may include the second conductive pattern 1002 and the 11-th conductive pattern 1304, and the second storage electrode of the first storage capacitor Cst11 may include the sixth conductive pattern 1102 and the 21-st conductive pattern 1405.

The sixth conductive pattern 1102 may be disposed on the second conductive pattern 1002 and may at least partially overlap the second conductive pattern 1002. The second conductive pattern 1002 and the sixth conductive pattern 1102 may constitute a (1-1)st storage capacitance Cpt11-1. The 11-th conductive pattern 1304 may be disposed on the sixth conductive pattern 1102 and may partially overlap the sixth conductive pattern 1102. The sixth conductive pattern 1102 and the 11-th conductive pattern 1304 may constitute a (1-2)nd storage capacitance Cpt11-2. The 21-st conductive pattern 1405 may be disposed on the 11-th conductive pattern 1304 and may at least partially overlap the 11-th conductive pattern 1304. The 11-th conductive pattern 1304 and the 21-st conductive pattern 1405 may constitute a (1-3)rd storage capacitance Cpt11-3. As described below with reference to FIG. 13, the 11-th conductive pattern 1304 may be electrically connected to the second conductive pattern 1002. As described below with reference to FIG. 14, the 21-st conductive pattern 1405 may be electrically connected to the sixth conductive pattern 1102.

The first storage capacitor Cst11 may include a first storage capacitance Cpt11 based on a (1-1)st storage capacitance Cpt11-1, a (1-2)nd storage capacitance Cpt11-2, and a (1-3)rd storage capacitance Cpt11-3. As an example, the first storage capacitance Cpt11 of the first storage capacitor Cst11 may be a sum of the (1-1)st storage capacitance Cpt11-1, the (1-2)nd storage capacitance Cpt11-2, and the (1-3)rd storage capacitance Cpt11-3.

The first hold capacitor Chd11 may include the third conductive pattern 1003 (or the second electrode) and the sixth conductive pattern 1102. The first hold capacitor Chd11 may include a first hold electrode and a second hold electrode. The first hold electrode may be connected to the power line PL of FIG. 5, and the second hold electrode may be connected to the source of the first transistor T11. The first hold electrode of the first hold capacitor Chd11 may include the third conductive pattern 1003, and the second hold electrode of the first hold capacitor Chd11 may include the sixth conductive pattern 1102.

The sixth conductive pattern 1102 may be disposed on the third conductive pattern 1003 and may partially overlap the third conductive pattern 1003. The third conductive pattern 1003 and the sixth conductive pattern 1102 may constitute the first hold capacitance Cpd11 of the first hold capacitor Chd11.

In case that the 'first storage capacitor Cst11 may include the sixth conductive pattern 1102', it may mean that the 'first storage capacitor Cst11 may include a portion of the sixth conductive pattern 1102 overlapping the second conductive pattern 1002'. In case that the 'first hold capacitor Chd11 may include the sixth conductive pattern 1102', it may mean that the 'first hold capacitor Chd11 may include another portion of the sixth conductive pattern 1102 overlapping the third conductive pattern 1003'.

As described above with reference to FIG. 7, the areas of the second conductive pattern 1002 and the third conductive pattern 1003 may be changed by moving the edge 1002*e* of the second conductive pattern 1002 and the edge 1003*e* of the third conductive pattern 1003 facing each other in the first direction (e.g., the ±x direction) and/or the second direction (e.g., the ±y direction). In case that the areas of the second conductive pattern 1002 and the third conductive pattern 1003 are changed, the area of each of the second conductive pattern 1002 and the third conductive pattern 1003 overlapping the sixth conductive pattern 1102 may be changed. The first storage capacitance Cpt11 of the first storage capacitor Cst11 and the first hold capacitance Cpd11 of the first hold capacitor Chd11 may be changed.

As an example, in case that the positions of the edge 1002*e* of the second conductive pattern 1002 and the edge 1003*e* of the third conductive pattern 1003 facing each other are moved in the +x direction, the area of the second conductive pattern 1002 may be reduced, and the area of the third conductive pattern 1003 may be increased. The first storage capacitance Cpt11 of the first storage capacitor Cst11 may be reduced and the first hold capacitance Cpd11 of the first hold capacitor Chd11 may be increased. In case that the positions of the edge 1002*e* of the second conductive pattern 1002 and the edge 1003*e* of the third conductive pattern 1003 facing each other are moved in the −x direction, the area of the second conductive pattern 1002 may be increased, and the area of the third conductive pattern 1003 may be reduced. The first storage capacitance Cpt11 of the first storage capacitor Cst11 may be increased and the first hold capacitance Cpd11 of the first hold capacitor Chd11 may be decreased.

As described above, capacitors of the first to third pixel circuits PC11, PC12, and PC13 may be differentially formed by moving the positions of an edge 1002*e* of the second conductive pattern 1002 and an edge 1003*e* of the third conductive pattern 1003 facing each other in the first direction (e.g., the ±x direction) and/or the second direction (e.g., the ±y direction). As an example, the second storage capacitance Cpt12 of the second storage capacitor Cst12 may be greater than the first storage capacitance Cpt11 of the first storage capacitor Cst11, and the third storage capacitance Cpt13 of the third storage capacitor Cst13. The third hold capacitance Cpd13 of the third hold capacitor Chd13 may be greater than the first hold capacitance Cpd11 of the first hold capacitor Chd11 and the second hold capacitance Cpd12 of the second hold capacitor Chd12.

As in an embodiment, in case that at least some of the electrodes constituting the first storage capacitor Cst11 are disposed on the first hold capacitor Chd11, an area in which the electrodes constituting the first hold capacitor Chd11 may be arranged may be increased (or secured). In case that at least some of the electrodes constituting the first storage capacitor Cst11 are stacked on the first hold capacitor Chd11, the first hold capacitance Cpd11 of the first hold capacitor Chd11 may be increased (or secured). As the first hold capacitance Cpd11 of the first hold capacitor Chd11 increased (or secured), a change in the source of the first transistor T11 may become small. As a change in the source of the first transistor T11 becomes small, an advantage may be achieved by reducing a data swing range while the pixel circuit is driven.

Hereinafter, a configuration of a display apparatus is described more specifically according to a stack structure with reference to FIG. 12.

A substrate 100 may include glass material, a ceramic material, and/or a metal material. The substrate 100 may include a flexible and/or bendable material. In case that the substrate 100 is flexible or bendable, the substrate 100 may include a polymer resin including polyethersulfone, polyacrylate, polyetherimide, polyethylene naphthalate, polyethylene terephthalate, polyphenylene sulfide, polyarylate, polyimide, polycarbonate, and/or cellulose acetate propionate.

The substrate 100 may have a single-layered structure or a multi-layered structure of the above materials, and may further include an inorganic material in the case of the multi-layered structure. In an embodiment, the substrate 100 may have a structure of an organic material/an inorganic material/an organic material.

The second conductive pattern 1002 and the third conductive pattern 1003 may be disposed on the substrate 100. The second conductive pattern 1002 may be apart from the third conductive pattern 1003. The second conductive pattern 1002 and the third conductive pattern 1003 may include at least one of molybdenum (Mo), aluminum (Al), copper (Cu), titanium (Ti) and the like and include a single layer or a multi-layer. As an example, the second conductive pattern 1002 and the third conductive pattern 1003 may be a single Mo layer.

In an embodiment, a preset voltage may be applied to the third conductive pattern 1003. As an example, the first driving voltage ELVDD of FIG. 5 may be applied to the third conductive pattern 1003.

The barrier layer 110 may be disposed on the substrate 100 to cover the second conductive pattern 1002 and the third conductive pattern 1003. The barrier layer 110 may prevent or reduce the penetration of impurities from the substrate 100 and the like. The barrier layer 110 may include an inorganic material, an organic material, or an organic/inorganic composite material, and include a single layer or a multi-layer including an inorganic material and an organic material, the inorganic material including oxide or nitride.

The sixth conductive pattern 1102 may be disposed on the barrier layer 110. The sixth conductive pattern 1102 may include at least one of molybdenum (Mo), aluminum (Al), copper (Cu), titanium (Ti) and the like and include a single layer or a multi-layer. As an example, the sixth conductive pattern 1102 may include a single Mo layer.

The second conductive pattern 1002 and the sixth conductive pattern 1102 may overlap each other with the barrier layer 110 therebetween and constitute the (1-1)st storage capacitance Cpt11-1. The third conductive pattern 1003 and the sixth conductive pattern 1102 may overlap each other with the barrier layer 110 therebetween and constitute the first hold capacitance Cpd11. The barrier layer 110 may serve as a dielectric layer of the capacitor.

The buffer layer 111 may be disposed on the barrier layer 110 to cover the sixth conductive pattern 1102. The buffer layer 111 may be configured to reduce or block foreign materials, moisture, or external air penetrating from below the substrate 100 and may provide a flat surface on the substrate 100. The buffer layer 111 may include an inorganic material, an organic material, or an organic/inorganic composite material, and include a single layer or a multi-layer including an inorganic material and an organic material, the inorganic material including oxide or nitride.

The first insulating layer 113 and the second insulating layer 115 may be stacked on the buffer layer 111. The first insulating layer 113 and the second insulating layer 115 may each include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$). Zinc oxide ($ZnO_x$) may be zinc oxide (ZnO) and/or zinc peroxide ($ZnO_2$).

The eleventh conductive pattern 1304 may be disposed between the first insulating layer 113 and the second insulating layer 115. The eleventh conductive pattern 1304 may include at least one of molybdenum (Mo), aluminum (Al), copper (Cu), titanium (Ti) and the like and include a single layer or a multi-layer. As an example, the eleventh conductive pattern 1304 may include a single Mo layer.

The sixth conductive pattern 1102 and the eleventh conductive pattern 1304 may overlap each other with the buffer layer 111 and the first insulating layer 113 therebetween and constitute the (1-2)nd storage capacitance Cpt11-2. The buffer layer 111 and the first insulating layer 113 may serve as dielectric layers of the capacitor.

The 21-st conductive pattern 1405 may be disposed on the second insulating layer 115. The 21-st conductive pattern 1405 may include a conductive material including molybdenum (Mo), aluminum (Al), copper (Cu), and/or titanium (Ti) and have a single-layered structure or a multi-layered structure including the above materials. As an example, the 21-st conductive pattern 1405 may have a multi-layered structure of Ti/Al/Ti.

The eleventh conductive pattern 1304 and the 21-st conductive pattern 1405 may overlap each other with the second insulating layer 115 therebetween and constitute the (1-3)rd storage capacitance Cpt11-3. The second insulating layer 115 may serve as a dielectric layer of the capacitor.

A third insulating layer 117 and a fourth insulating layer 119 may be stacked on the second insulating layer 115 to cover the 21-st conductive pattern 1405. The third insulating layer 117 and the fourth insulating layer 119 may include a single layer or a multi-layer including an organic material and provide a flat upper surface. The third insulating layer 117 and the fourth insulating layer 119 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acrylic-based polymer, an imide-based polymer, an aryl ether-based polymer, an amide-based polymer, a fluorine containing polymer, a p-xylene-based polymer, a vinyl alcohol-based polymer, or a blend thereof.

The 27-th conductive pattern 1503 and the 28-th conductive pattern 1504 may be disposed between the third insulating layer 117 and the fourth insulating layer 119. The 27-th conductive pattern 1503 and the 28-th conductive pattern 1504 may each include a conductive material including molybdenum (Mo), aluminum (Al), copper (Cu), and/or titanium (Ti) and have a single-layered structure or a multi-layered structure including the above materials. As an example, the 27-th conductive pattern 1503 and the 28-th conductive pattern 1504 may each have a multi-layered structure of Ti/Al/Ti.

A display element 300 may be disposed on the fourth insulating layer 119. The display element 300 may be an organic light-emitting diode OLED and may include a pixel electrode 310, an intermediate layer 320 including an organic emission layer, and an opposite electrode 330.

The pixel electrode 310 may be a (semi) light-transmissive electrode or a reflective electrode. In an embodiment, the pixel electrode 310 may include a reflective layer and a transparent or semi-transparent electrode layer on the reflective layer. The reflective layer may include at least one of Ag, Mg, Al, Pt, Pd, Au, Ni, Nd, Ir, Cr, and a compound thereof. The transparent or semi-transparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). In an embodiment, the pixel electrode 310 may include ITO/Ag/ITO.

In the display area of the substrate 100, a pixel-defining layer 121 may be disposed on the fourth insulating layer 119. The pixel-defining layer 121 may cover the edges of the pixel electrode 310 and include an opening exposing the central portion of the pixel electrode 310. An emission area of the display element 300 may be defined by the opening.

The pixel-defining layer 121 may prevent arcs and the like from occurring at the edges of each pixel electrode 310 by increasing a distance between the edges of each pixel electrode 310 and the opposite electrode 330 over the pixel electrode 310.

The pixel-defining layer 121 may include an organic insulating material such as polyimide, an acrylic resin, benzocyclobutene, a phenolic resin, and the like and be formed by using spin coating and the like. The pixel-defining layer 121 may include an organic insulating material. In other embodiments, the pixel-defining layer 121 may include an inorganic insulating material such as silicon nitride, silicon oxynitride, and/or silicon oxide. In other embodiments, the pixel-defining layer 121 may include an organic insulating material and an inorganic insulating material. In an embodiment, the pixel-defining layer 121 may include a light-blocking material and be provided in black. The light-blocking material may include carbon black, carbon nanotubes, a resin or paste including black dye, metal particles, for example, nickel, aluminum, molybdenum, and an alloy thereof, metal oxide particles (e.g., chrome oxide) or metal nitride particles (e.g., chrome nitride). In case that the pixel-defining layer 121 includes a light-blocking material, external light reflection by metal structures arranged below the pixel-defining layer 121 may be reduced.

The intermediate layer 320 may be disposed inside the opening formed in the pixel-defining layer 121 and may include an organic emission layer. The organic emission layer may include an organic material including a fluorescent or phosphorous material emitting red, green, blue, or white light. The organic emission layer may include a polymer organic material or a low molecular weight organic material. Functional layers may be selectively further arranged under and on the organic emission layer, the functional layers including a hole transport layer (HTL), a hole injection layer (HIL), an electron transport layer (ETL), or an electron injection layer (EIL).

The opposite electrode 330 may be a (semi) light-transmissive electrode or a reflective electrode. In an embodiment, the opposite electrode 330 may be a transparent or semi-transparent electrode and may include a metal thin film including Li, Ca, LiF, Al, Ag, Mg, or compound thereof or a material having a multi-layer structure such as LiF/Ca or LiF/Al and having a small work function. A transparent conductive oxide (TCO) layer such as ITO, IZO, ZnO, and/or $In_2O_3$ may be further arranged on the metal thin film. The opposite electrode 330 may be arranged over the display area and disposed on the intermediate layer 320 and the pixel-defining layer 121. The opposite electrode 330 may be formed as one body over the display elements 300 to correspond to the pixel electrodes 310.

Because the display element 300 may be readily damaged by external moisture, oxygen, or the like, an encapsulation layer (not shown) may protect the display element 300 by covering the display element 300. The encapsulation layer may cover the display area and extend to at least a portion of the peripheral area. The encapsulation layer may include a first inorganic encapsulation layer, an organic encapsulation layer, and a second inorganic encapsulation layer.

Figure 13:
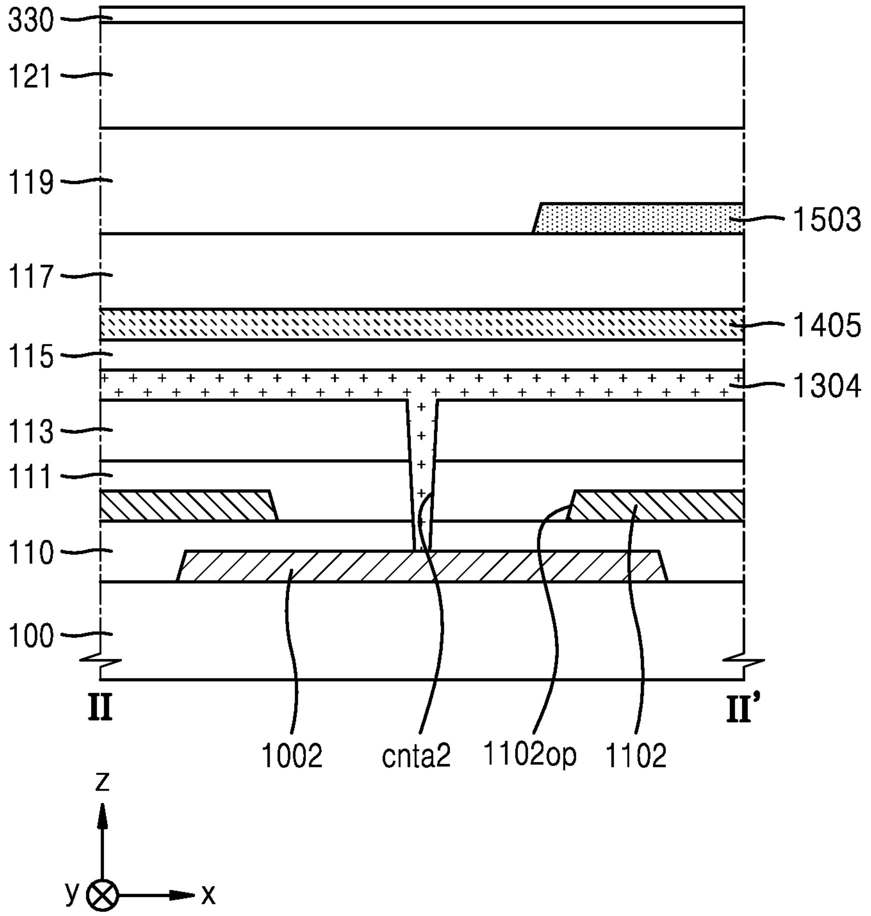
FIG. 13 is a cross-sectional view of an example of a portion of the display apparatus in FIG. 6, taken along line II-II' in FIG. 6.

FIG. 13 is a cross-sectional view of an example of a portion of the display apparatus in FIG. 6, taken along line II-II' in FIG. 6. In FIG. 13, the same reference numerals as those of FIG. 12 denote the same members, and thus, repeated descriptions thereof are omitted.

Referring to FIG. 13, the sixth conductive pattern 1102 may include a first opening 1102*op* exposing at least a portion of the barrier layer 110. The eleventh conductive pattern 1304 may be connected to the second conductive pattern 1002 through the second contact hole cnta2 formed in the barrier layer 110, the buffer layer 111, and the first insulating layer 113. The second contact hole cnta2 may pass through the first opening 1102*op* of the sixth conductive pattern 1102.

In an embodiment, as shown in FIG. 6 above, in a plan view, the first opening 1102*op* of the sixth conductive pattern 1102 may overlap the central portion of the second conductive pattern 1002. A connection defect between the second conductive pattern 1002 and the eleventh conductive pattern 1304 may be prevented.

Figure 14:
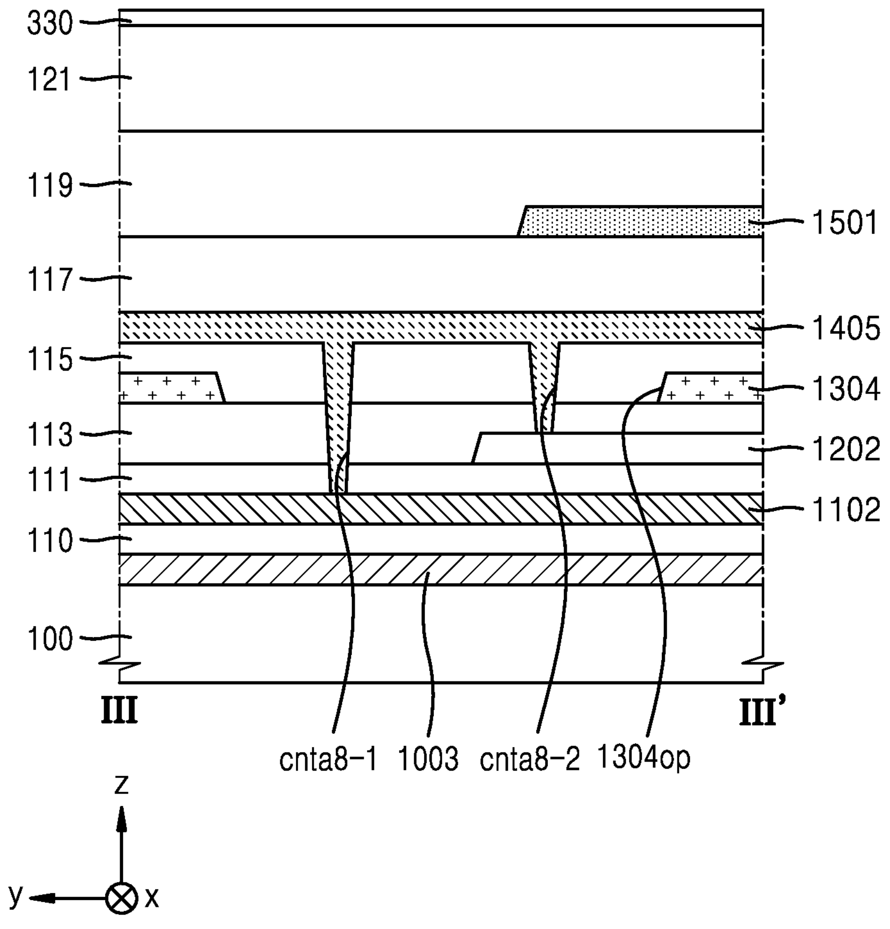
FIG. 14 is a cross-sectional view of an example of a portion of the display apparatus in FIG. 6, taken along line III-III' in FIG. 6.

FIG. 14 is a cross-sectional view of an example of a portion of the display apparatus in FIG. 6, taken along line III-III' in FIG. 6. In FIG. 14, the same reference numerals as those of FIG. 12 denote the same members, and thus, repeated descriptions thereof are omitted.

Referring to FIG. 14, the second semiconductor pattern 1202 may be disposed between the buffer layer 111 and the first insulating layer 113. The 25-th conductive pattern 1501 may be disposed between the third insulating layer 117 and the fourth insulating layer 119.

The eleventh conductive pattern 1304 may have a second opening 1304*op* exposing at least a portion of the first insulating layer 113. The 21-st conductive pattern 1405 may be connected to the sixth conductive pattern 1102 through the (8-1)st contact hole cnta8-1 formed in the buffer layer 111, the first insulating layer 113, and the second insulating layer 115. The 21-st conductive pattern 1405 may be connected to the second semiconductor pattern 1202 through the (8-2)nd contact hole cnta8-2 formed in the first insulating layer 113 and the second insulating layer 115. The (8-1)st contact hole cnta8-1 and the (8-2)nd contact hole cnta8-2 may pass through the second opening 1304*op* of the eleventh conductive pattern 1304.

Figure 15:
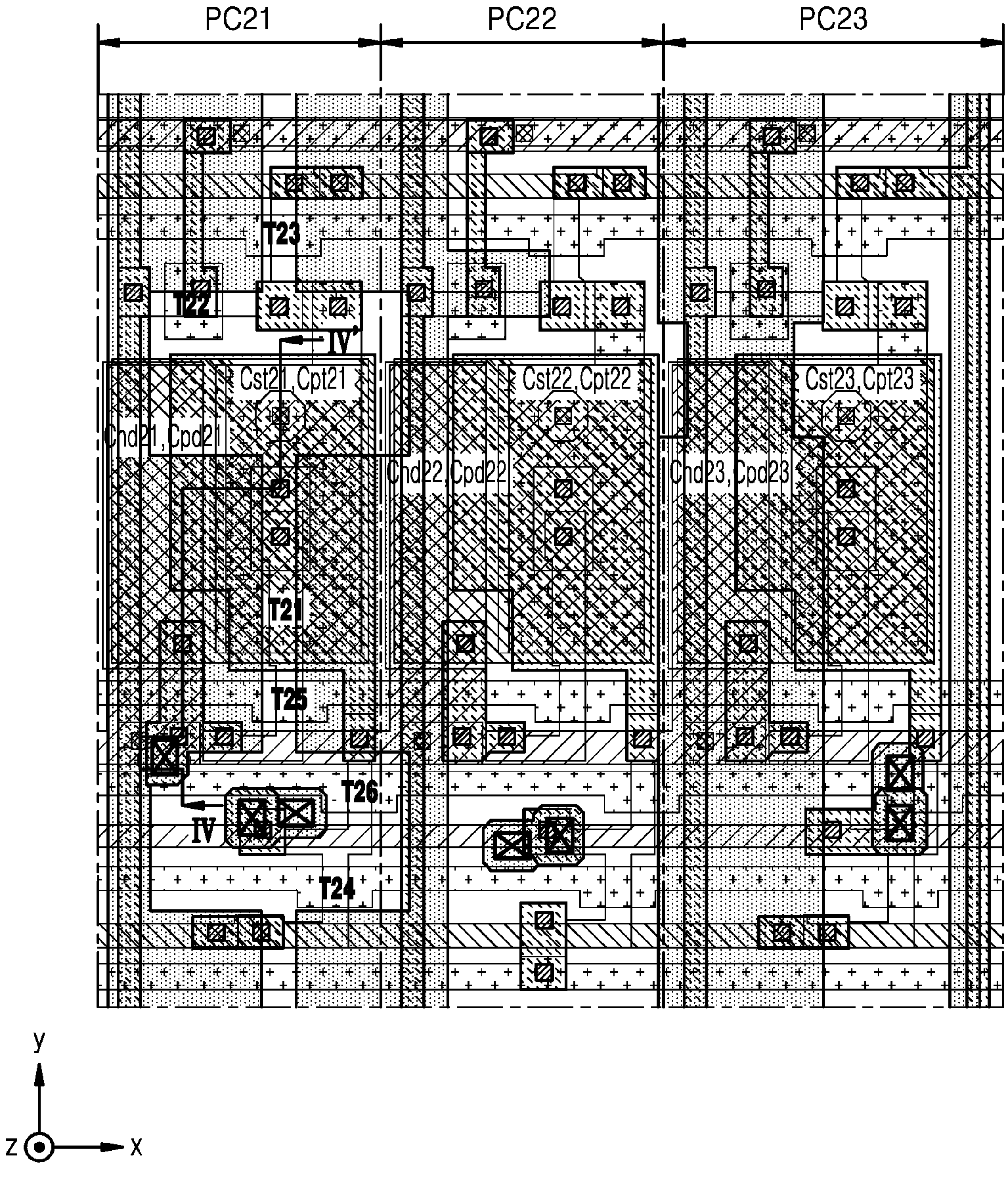
FIG. 15 is a schematic configuration view of positions of transistors, capacitors, and the like in pixel circuits included in the display apparatus of FIG. 4.

FIG. 15 is a schematic configuration view of positions of transistors, capacitors and the like in pixel circuits included in the display apparatus of FIG. 4, and FIGS. 16 to 20 are schematic configuration views of elements such as transistors and capacitors, for layers of a display apparatus shown in FIG. 15. Although FIGS. 16 to 20 describe a first pixel circuit PC21 of FIG. 15, the description is equally applicable to a second pixel circuit PC22 and a third pixel circuit PC23.

First, referring to FIG. 15, the display apparatus may include the first pixel circuit PC21, the second pixel circuit PC22, and the third pixel circuit PC23. The first pixel circuit PC21, the second pixel circuit PC22, and the third pixel circuit PC23 may be arranged in the first direction (e.g., the ±x direction).

The first pixel circuit PC21, the second pixel circuit PC22, and the third pixel circuit PC23 may each correspond to the pixel circuit PC of FIG. 5. As an example, the first pixel circuit PC21 may include first to sixth transistors T21, T22, T23, T24, T25, and T26, a first storage capacitor Cst21, and a first hold capacitor Chd21. The first to sixth transistors T21, T22, T23, T24, T25, and T26 may correspond to the first to sixth transistor T1, T2, T3, T4, T5, and T6 of FIG. 5, the first storage capacitor Cst21 may correspond to the storage capacitor Cst of FIG. 5, and the first hold capacitor Chd21 may correspond to the hold capacitor Chd of FIG. 5. Although description has been made to the first pixel circuit PC21, the description is equally applicable to the second pixel circuit PC22 and the third pixel circuit PC23. As an example, the second pixel circuit PC22 may include a second storage capacitor Cst22 and a second hold capacitor Chd22, and the third pixel circuit PC23 may include a third storage capacitor Cst23 and a third hold capacitor Chd23. The second storage capacitor Cst22 and the third storage capacitor Cst23 may each correspond to the storage capacitor Cst of FIG. 5, and the second hold capacitor Chd22 and the third hold capacitor Chd23 may each correspond to the hold capacitor Chd of FIG. 5.

In an embodiment, the first pixel circuit PC21, the second pixel circuit PC22, and the third pixel circuit PC23 may be respectively electrically connected to display elements configured to emit light of different colors. The first pixel circuit PC21, the second pixel circuit PC22, and the third pixel circuit PC23 may be configured to respectively drive display elements configured to emit light of different colors. As an example, a display element electrically connected to the first pixel circuit PC21 may be configured to emit red light. The first pixel circuit PC21 may be configured to drive a display element configured to emit red light. A display element electrically connected to the second pixel circuit PC22 may be configured to emit green light. The second pixel circuit PC22 may be configured to drive a display element configured to emit green light. A display element electrically connected to the third pixel circuit PC23 may be configured to emit blue light. The third pixel circuit PC23 may be configured to drive a display element configured to emit blue light.

The first storage capacitor Cst21 of the first pixel circuit PC21 may have a first storage capacitance Cpt21, and the first hold capacitor Chd21 of the first pixel circuit PC21 may have a first hold capacitance Cpd21. The second storage capacitor Cst22 of the second pixel circuit PC22 may have a second storage capacitance Cpt22, and the second hold capacitor Chd22 of the second pixel circuit PC22 may have a second hold capacitance Cpd22. The third storage capacitor Cst23 of the third pixel circuit PC23 may have a third storage capacitance Cpt23, and the third hold capacitor Chd23 of the third pixel circuit PC23 may have a third hold capacitance Cpd23.

In an embodiment, the first storage capacitance Cpt21 of the first storage capacitor Cst21, the second storage capacitance Cpt22 of the second storage capacitor Cst22, and the third storage capacitance Cpt23 of the third storage capacitor Cst23 may be substantially equal to each other. The first hold capacitance Cpd21 of the first hold capacitor Chd21, the second hold capacitance Cpd22 of the second hold capacitor Chd22, and the third hold capacitance Cpd23 of the third hold capacitor Chd23 may be substantially equal to each other.

In another embodiment, the first storage capacitance Cpt21 of the first storage capacitor Cst21, the second storage capacitance Cpt22 of the second storage capacitor Cst22, and the third storage capacitance Cpt23 of the third storage capacitor Cst23 may be different from each other. The first hold capacitance Cpd21 of the first hold capacitor Chd21, the second hold capacitance Cpd22 of the second hold capacitor Chd22, and the third hold capacitance Cpd23 of the third hold capacitor Chd23 may be different from each other. As an example, the second storage capacitance Cpt22 of the second storage capacitor Cst22 may be greater than the first storage capacitance Cpt21 of the first storage capacitor Cst21, and the third storage capacitance Cpt23 of the third storage capacitor Cst23. The third hold capacitance Cpd23 of the third hold capacitor Chd23 may be greater than the first hold capacitance Cpd21 of the first hold capacitor Chd21 and the second hold capacitance Cpd22 of the second hold capacitor Chd22.

Elements such as transistors and capacitors of the display apparatus shown in FIG. 15 are described more specifically with reference to FIGS. 16 to 20.

Figure 16:
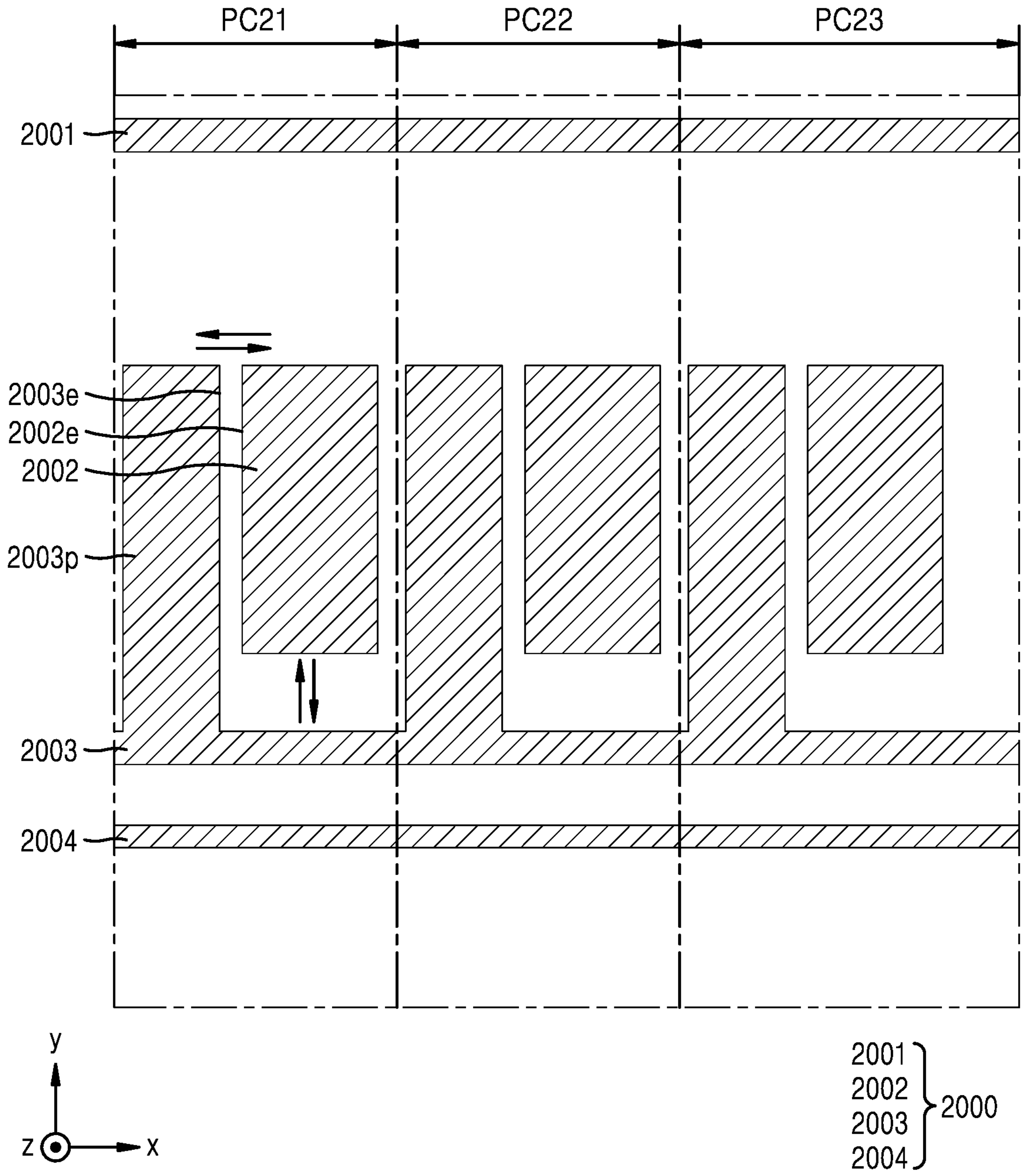
FIGS. 16 to 20 are schematic configuration views of elements such as transistors and capacitors, for layers of a display apparatus shown in FIG. 15.

A first conductive layer 2000 shown in FIG. 16 may be disposed on the substrate 100 (see FIG. 4). The first conductive layer 2000 may include at least one of molybdenum (Mo), aluminum (Al), copper (Cu), titanium (Ti) and the like and include a single layer or a multi-layer. As an example, the first conductive layer 2000 may include a single Mo layer.

The first conductive layer 2000 may include a first conductive pattern 2001, a second conductive pattern 2002, a third conductive pattern 2003, and a fourth conductive pattern 2004. The first conductive pattern 2001, the third conductive pattern 2003, and the fourth conductive pattern 2004 may substantially extend in the first direction (e.g., the +x direction). The third conductive pattern 2003 may be in a state in which a preset voltage is applied. As an example, the first driving voltage ELVDD of FIG. 5 may be applied to the third conductive pattern 2003. The fourth conductive pattern 2004 may be a repair line. The first conductive pattern 2001 may correspond to the first scan line GWL of FIG. 5, the second conductive pattern 2002 may correspond to the first storage electrode CEs1 of the storage capacitor Cst of FIG. 5, and the third conductive pattern 2003 may correspond to the first hold electrode CEh1 of the hold capacitor Chd of FIG. 5.

In an embodiment, the third conductive pattern 2003 may have a protrusion 2003*p* protruding in the second direction (e.g., the ±y direction). The second conductive pattern 2002 may be arranged adjacent to the protrusion 2003*p* of the third conductive pattern 2003 in the first direction (e.g., the ±x direction). The second conductive pattern 2002 may be arranged between the protrusions 2003*p* of the third conductive pattern 2003.

The areas of the second conductive pattern 2002 and the third conductive pattern 2003 may be changed by moving the positions of an edge 2002*e* of the second conductive pattern 2002 and an edge 2003*e* of the third conductive pattern 2003 facing each other in the first direction (e.g., the ±x direction) and/or the second direction (e.g., the ±y direction). As an example, in case that the positions of the edge 2002*e* of the second conductive pattern 2002 and the edge 2003*e* of the third conductive pattern 2003 facing each other are moved in the +x direction, the area of the second conductive pattern 2002 may be reduced, and the area of the third conductive pattern 2003 may be increased. In case that the positions of the edge 2002*e* of the second conductive pattern 2002 and the edge 2003*e* of the third conductive pattern 2003 facing each other are moved in the −x direction, the area of the second conductive pattern 2002 may be increased, and the area of the third conductive pattern 2003 may be reduced. In case that the positions of the edge 2002*e* of the second conductive pattern 2002 and the edge 2003*e* of the third conductive pattern 2003 facing each other are moved in the +y direction, the area of the second conductive pattern 2002 may be reduced, and the area of the third conductive pattern 2003 may be increased. In case that the positions of the edge 2002*e* of the second conductive pattern 2002 and the edge 2003*e* of the third conductive pattern 2003 facing each other are moved in the −y direction, the area of the second conductive pattern 2002 may be increased, and the area of the third conductive pattern 2003 may be reduced.

Figure 17:
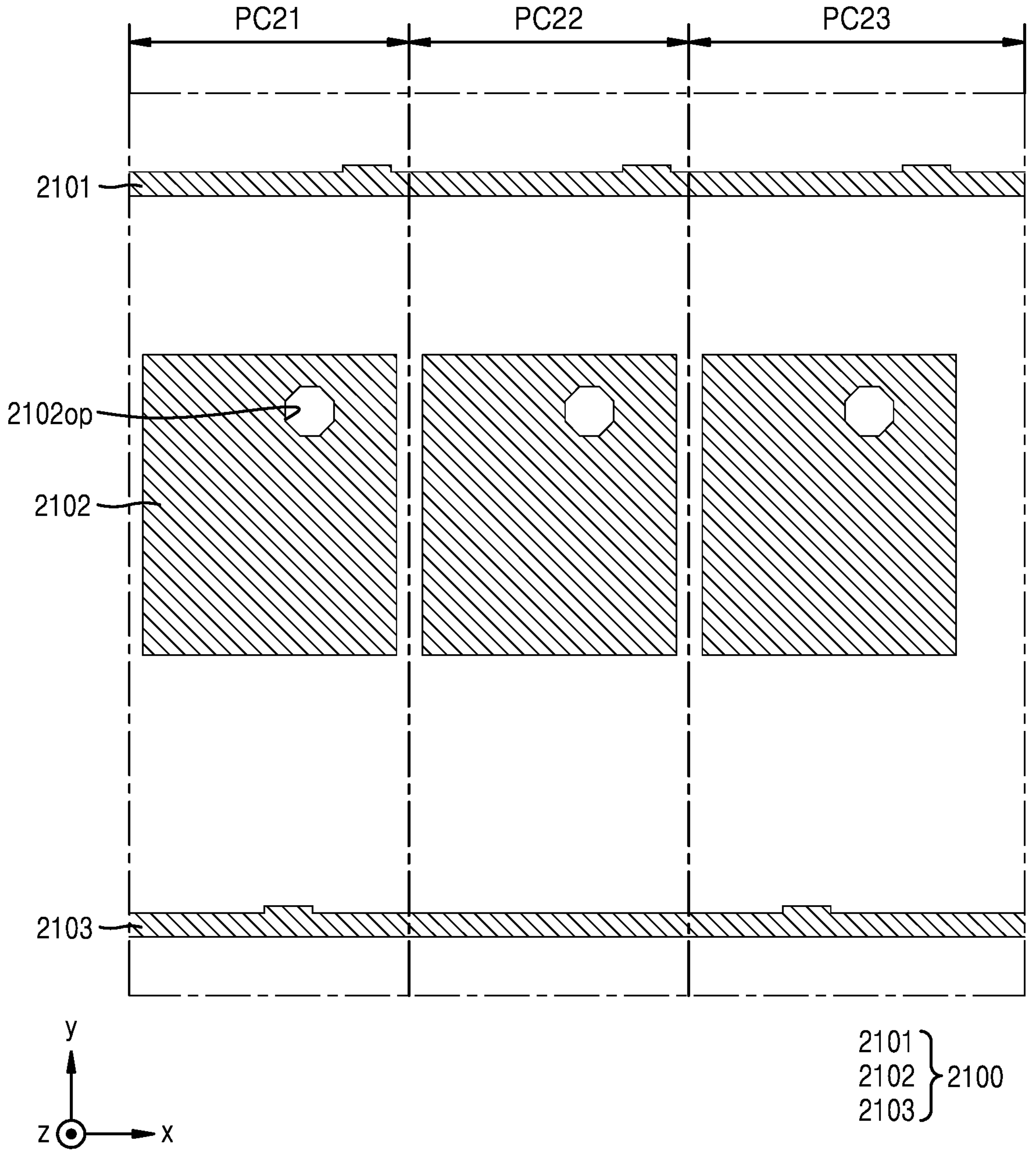

A second conductive layer 2100 shown in FIG. 17 may be disposed on the first conductive layer 2000. The second conductive layer 2100 may include at least one of molybdenum (Mo), aluminum (Al), copper (Cu), titanium (Ti) and the like and include a single layer or a multi-layer. As an example, the second conductive layer 2100 may include a single Mo layer.

The second conductive layer 2100 may include a fifth conductive pattern 2101, a sixth conductive pattern 2102, and a seventh conductive pattern 2103. The fifth conductive pattern 2101 and the seventh conductive pattern 2103 may substantially extend in the first direction (e.g., the +x direction). The fifth conductive pattern 2101 and the seventh conductive pattern 2103 may be in a state in which a preset voltage is applied. As an example, the reference voltage VREF of FIG. 5 may be applied to the fifth conductive pattern 2101, and the initialization voltage Vint of FIG. 5 may be applied to the seventh conductive pattern 2103. A first opening 2102*op* may be formed in the sixth conductive pattern 2102. A conductive pattern disposed on the sixth conductive pattern 2102 may be connected to a conductive pattern disposed under the sixth conductive pattern 2102 through the first opening 2102*op* of the sixth conductive pattern 2102. The fifth conductive pattern 2101 may correspond to the first voltage line VL1 of FIG. 5, the sixth conductive pattern 2102 may correspond to the second storage electrode CEs2 of the storage capacitor Cst and the second hold electrode CEh2 of the hold capacitor Chd of FIG. 5, and the seventh conductive pattern 2103 may correspond to the second voltage line VL2 of FIG. 5.

Figure 18:
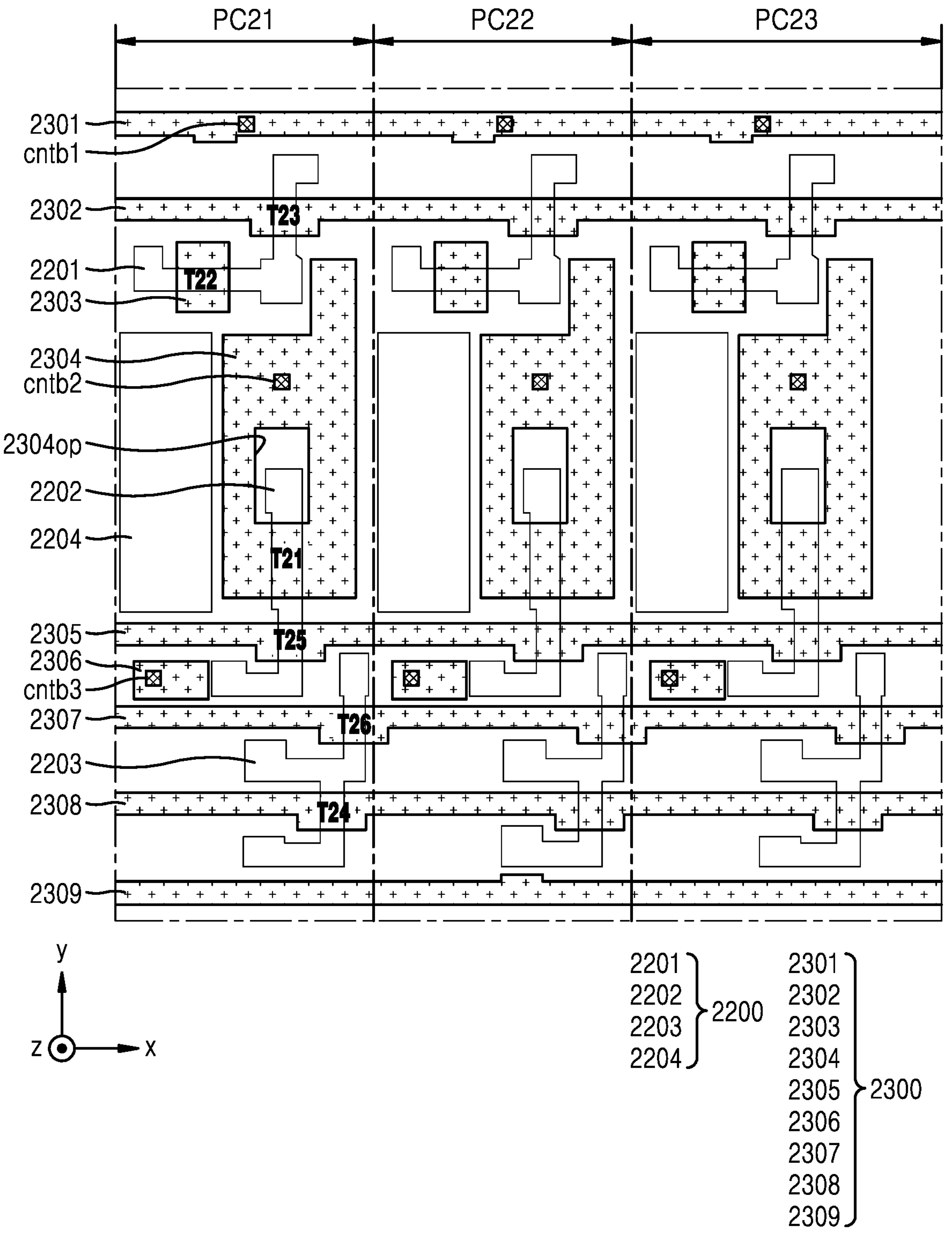

A semiconductor layer 2200 shown in FIG. 18 may be disposed on the second conductive layer 2100. The semiconductor layer 2200 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). As an example, the semiconductor layer 2200 may be an ITZO (In—Sn—Zn—O) semiconductor layer, an IGZO (In—Ga—Zn—O) semiconductor layer and the like. The semiconductor layer 2200 may include a first semiconductor pattern 2201, a second semiconductor pattern 2202, a third semiconductor pattern 2203, and a fourth semiconductor pattern 2204.

In case needed, a process of making a conductor (or conductive) by plasma treatment and the like may be performed on at least a portion of the semiconductor layer 2200. As an example, the fourth semiconductor pattern 2204 may be made a conductor (or conductive) by a plasma treatment and the like. The fourth semiconductor pattern 2204 may correspond to the first hold electrode CEh1 of the hold capacitor Chd of FIG. 5.

A third conductive layer 2300 shown in FIG. 18 may be disposed on the semiconductor layer 2200. The third conductive layer 2300 may include at least one of molybdenum (Mo), aluminum (Al), copper (Cu), titanium (Ti) and the like and include a single layer or a multi-layer. As an example, the third conductive layer 2300 may include a single Mo layer.

The third conductive layer 2300 may include an eighth conductive pattern 2301, a ninth conductive pattern 2302, a tenth conductive pattern 2303, an eleventh conductive pattern 2304, a twelfth conductive pattern 2305, a thirteenth conductive pattern 2306, a fourteenth conductive pattern 2307, a fifteenth conductive pattern 2308, and a sixteenth conductive pattern 2309. The eighth conductive pattern 2301, the ninth conductive pattern 2302, the twelfth conductive pattern 2305, the fourteenth conductive pattern 2307, the fifteenth conductive pattern 2308, and the sixteenth conductive pattern 2309 may substantially extend in the first direction (e.g., the ±x direction). A second opening 2304*op* may be formed in the eleventh conductive pattern 2304. A conductive pattern disposed on the eleventh conductive pattern 2304 may be connected to a semiconductor pattern and/or a conductive pattern disposed under the eleventh conductive pattern 2304 through the second opening 2304*op* of the eleventh conductive pattern 2304. The eighth conductive pattern 2301 may correspond to the first scan line GWL of FIG. 5, the ninth conductive pattern 2302 may correspond to the second scan line GRL of FIG. 5, the eleventh conductive pattern 2304 may correspond to the first storage electrode CEs1 of the storage capacitor Cst of FIG. 5, the twelfth conductive pattern 2305 may correspond to the first emission control line EML of FIG. 5, the fourteenth conductive pattern 2307 may correspond to the second emission control line EMBL of FIG. 5, the fifteenth conductive pattern 2308 may correspond to the third scan line GIL of FIG. 5, and the sixteenth conductive pattern 2309 may correspond to the second voltage line VL2 of FIG. 5.

The seventh conductive pattern 2103 and the sixteenth conductive pattern 2309 of FIG. 8 may each correspond to the second voltage line VL2 of FIG. 5 and may be respectively connected to different pixel circuits. As an example, the seventh conductive pattern 2103 may be connected to the first pixel circuit PC21 and the third pixel circuit PC23, and configured to transfer the initialization voltage Vint of FIG. 5 to the first pixel circuit PC21 and the third pixel circuit PC23. The sixteenth conductive pattern 2309 may be connected to the second pixel circuit PC22 and configured to transfer the initialization voltage Vint to the second pixel circuit PC22.

A portion of the tenth conductive pattern 2303 overlapping the first semiconductor pattern 2201 may correspond to a gate of the second transistor T22. A portion of the ninth conductive pattern 2302 overlapping the first semiconductor pattern 2201 may correspond to a gate of the third transistor T23. A portion of the eleventh conductive pattern 2304 overlapping the second semiconductor pattern 2202 may correspond to a (upper) gate of the first transistor T21. A portion of the twelfth conductive pattern 2305 overlapping the second semiconductor pattern 2202 may correspond to a gate of the fifth transistor T25. A portion of the fourteenth conductive pattern 2307 overlapping the third semiconductor pattern 2203 may correspond to a gate of the sixth transistor T26. A portion of the fifteenth conductive pattern 2308 overlapping the third semiconductor pattern 2203 may correspond to a gate of the fourth transistor T24.

The eighth conductive pattern 2301 may be connected to the first conductive pattern 2001 through a first contact hole cntb1. The first conductive pattern 2001 and the eighth conductive pattern 2301 may constitute a double scan line. The eleventh conductive pattern 2304 may be connected to the second conductive pattern 2002 through a second contact hole cntb2. The second conductive pattern 2002 and the eleventh conductive pattern 2304 may constitute the first storage electrode CEs1 of the storage capacitor Cst of FIG. 5. The thirteenth conductive pattern 2306 may be connected to the third conductive pattern 2003 through a third contact hole cntb3.

Figure 19:
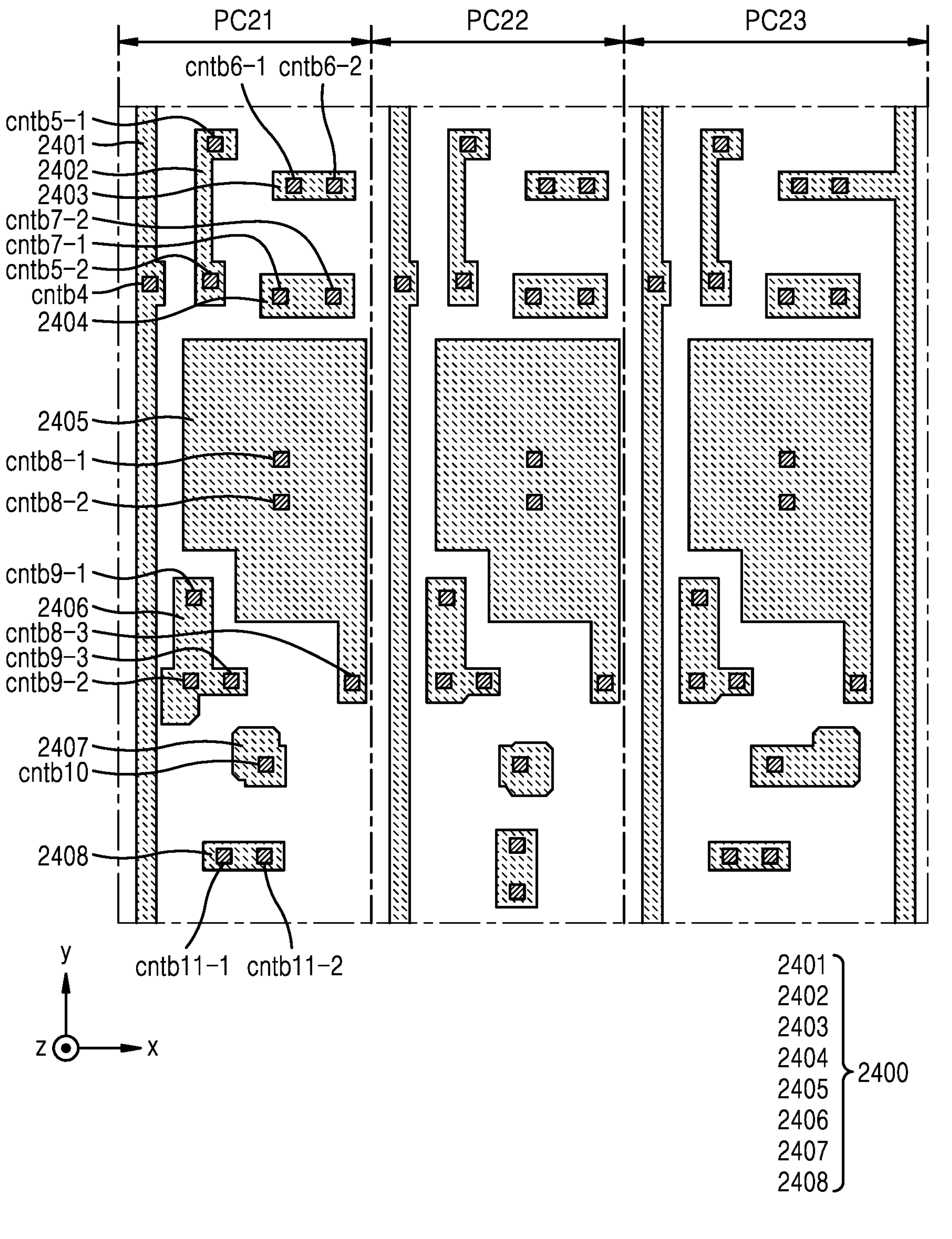

A fourth conductive layer 2400 shown in FIG. 19 may be disposed on the third conductive layer 2300. The fourth conductive layer 2400 may include a conductive material including molybdenum (Mo), aluminum (Al), copper (Cu), and/or titanium (Ti) and have a single-layered structure or a multi-layered structure including the above materials. As an example, the fourth conductive layer 2400 may have a multi-layered structure of Ti/Al/Ti.

The fourth conductive layer 2400 may include a seventeenth conductive pattern 2401, an eighteenth conductive pattern 2402, a nineteenth conductive pattern 2403, a twentieth conductive pattern 2404, a 21-st conductive pattern 2405, a 22-nd conductive pattern 2406, a 23-rd conductive pattern 2407, and a 24-th conductive pattern 2408. The seventeenth conductive pattern 2401 may substantially extend in the second direction (e.g., the ±y direction). The seventeenth conductive pattern 2401 may correspond to the data line DL of FIG. 5. The 21-st conductive pattern 2405 may correspond to the second storage electrode CEs2 of the storage capacitor Cst of FIG. 5.

The seventeenth conductive pattern 2401 may be connected to the first semiconductor pattern 2201 through a fourth contact hole cntb4. The eighteenth conductive pattern 2402 may be connected to the eighth conductive pattern 2301 through a (5-1)st contact hole cntb5-1 and connected to the tenth conductive pattern 2303 through a (5-2)nd contact hole cntb5-2. The nineteenth conductive pattern 2403 may be connected to the first semiconductor pattern 2201 through a (6-1)st contact hole cntb6-1 and connected to the fifth conductive pattern 2101 through a (6-2)nd contact hole cntb6-2. The twentieth conductive pattern 2404 may be connected to the first semiconductor pattern 2201 through a (7-1)st contact hole cntb7-1 and connected to the eleventh conductive pattern 2304 through a (7-2)nd contact hole cntb7-2. The 21-st conductive pattern 2405 may be connected to the sixth conductive pattern 2102 through a (8-1)st contact hole cntb8-1, connected to the second semiconductor pattern 2202 through a (8-2)nd contact hole cntb8-2, and connected to the third semiconductor pattern 2203 through a (8-3)rd contact hole cntb8-3. The 22-nd conductive pattern 2406 may be connected to the fourth semiconductor pattern 2204 through a (9-1)st contact hole cntb9-1, connected to the thirteenth conductive pattern 2306 through a (9-2)nd contact hole cntb9-2, and connected to the second semiconductor pattern 2202 through a (9-3)rd contact hole cntb9-3. The 23-rd conductive pattern 2407 may be connected to the third semiconductor pattern 2203 through a tenth contact hole cntb10. The 24-th conductive pattern 2408 may be connected to the seventh conductive pattern 2103 through a (11-1)st contact hole cntb11-1 and connected to the third semiconductor pattern 2203 through a (11-2)nd contact hole cntb11-2.

Figure 20:
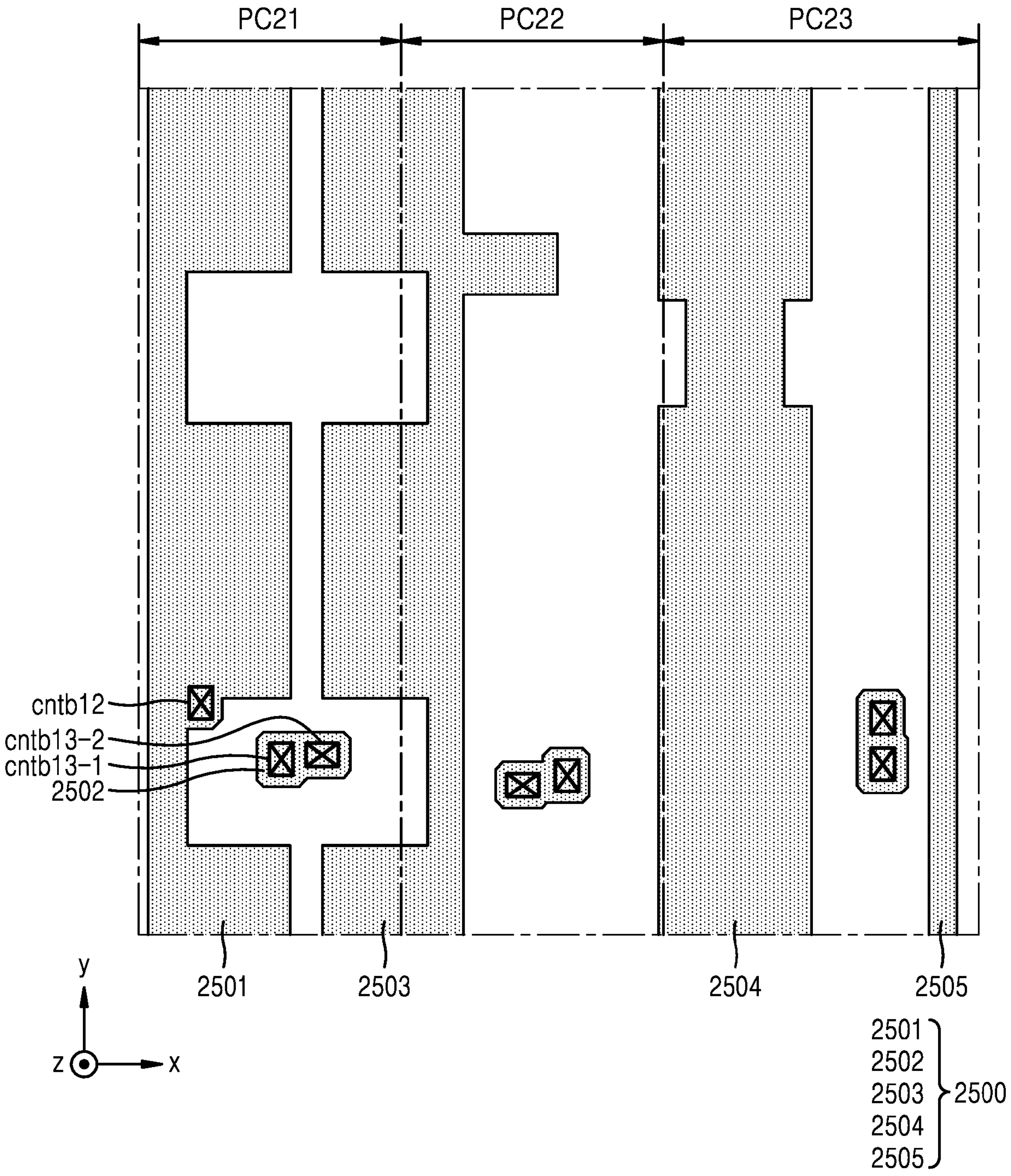

A fifth conductive layer 2500 shown in FIG. 20 may be disposed on the fourth conductive layer 2400. The fifth conductive layer 2500 may include a conductive material including molybdenum (Mo), aluminum (Al), copper (Cu), and/or titanium (Ti) and have a single-layered structure or a multi-layered structure including the above materials. As an example, the fifth conductive layer 2500 may have a multi-layered structure of Ti/Al/Ti.

The fifth conductive layer 2500 may include a 25-th conductive pattern 2501, a 26-th conductive pattern 2502, a 27-th conductive pattern 2503, a 28-th conductive pattern 2504, and a 29-th conductive pattern 2505. The 25-th conductive pattern 2501, the 27-th conductive pattern 2503, the 28-th conductive pattern 2504, and the 29-th conductive pattern 2505 may substantially extend in the second direction (e.g., the ±y direction). The 25-th conductive pattern 2501 may correspond to the power line PL of FIG. 5, the 27-th conductive pattern 2503 may correspond to the second voltage line VL2 of FIG. 5, the 28-th conductive pattern 2504 may correspond to the common electrode of FIG. 5, and the 29-th conductive pattern 2505 may correspond to the first voltage line VL1 of FIG. 5.

The 25-th conductive pattern 2501 may be connected to the 22-nd conductive pattern 2406 through a 12-th contact hole cntb12. The 26-th conductive pattern 2502 may be connected to the 23-rd conductive pattern 2407 through a (13-1)st contact hole cnta13-1 and connected to the anode of the display element through a (13-2)nd contact hole cntb13-2.

Figure 21:
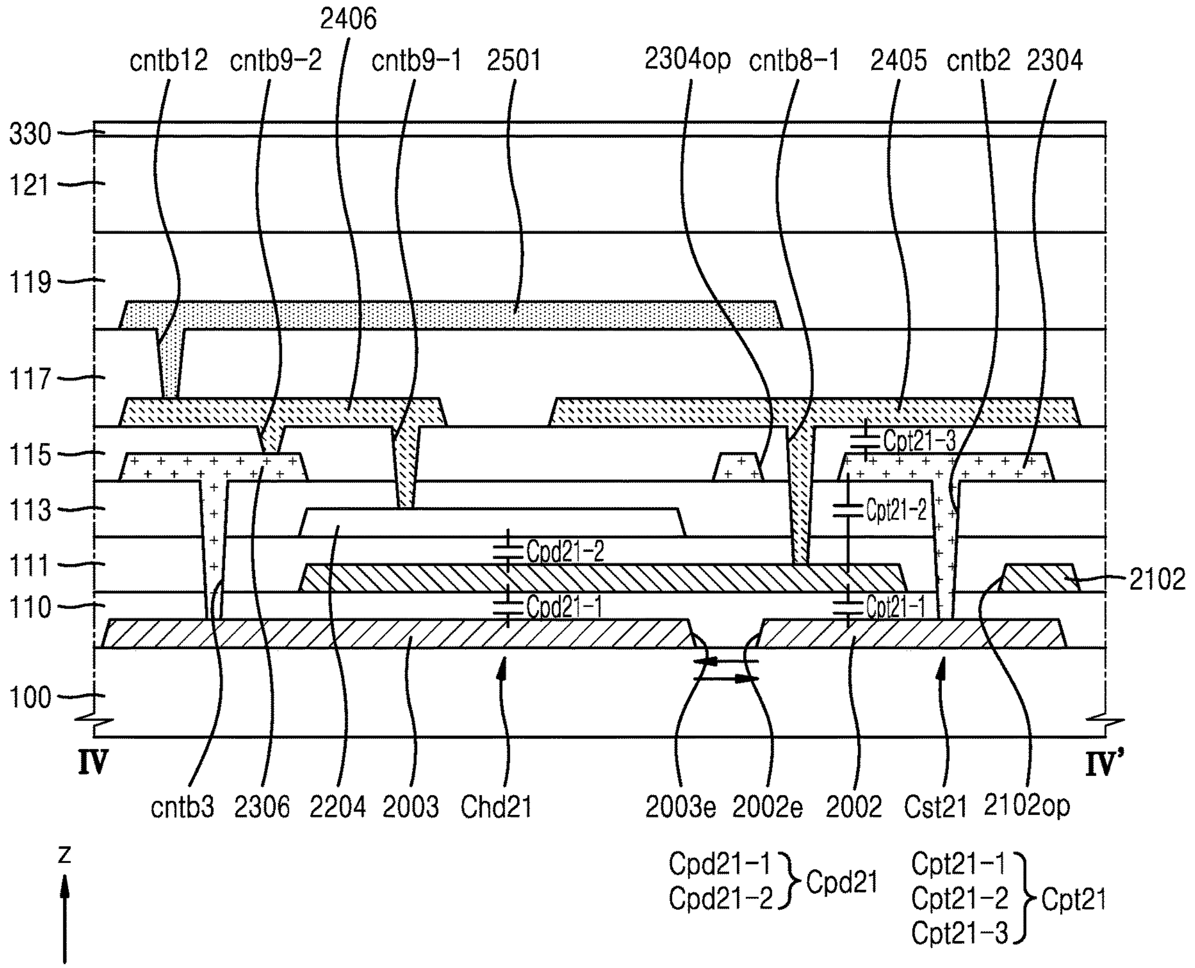
FIG. 21 is a cross-sectional view of an example of a portion of the display apparatus in FIG. 15, taken along line IV-IV' in FIG. 15.

FIG. 21 is a cross-sectional view of an example of a portion of the display apparatus in FIG. 15, taken along line IV-IV' in FIG. 15. Although FIG. 21 describes the first pixel circuit PC21 of FIG. 15, the description is equally applicable to the second pixel circuit PC22 and the third pixel circuit PC23. In FIG. 21, the same reference numerals as those of FIG. 12 denote the same members, and thus, repeated descriptions thereof are omitted.

Referring to FIG. 21, the first pixel circuit PC21 may include the first storage capacitor Cst21 and the first hold capacitor Chd21.

The first storage capacitor Cst21 may include the second conductive pattern 2002 (or a first electrode), the sixth conductive pattern 2102 (or a third electrode), the 11-th conductive pattern 2304 (or a fifth electrode), and the 21-st conductive pattern 2405 (or a sixth electrode). The first storage capacitor Cst21 may include a first storage electrode and a second storage electrode. The first storage electrode may be connected to a (upper) gate of the first transistor T21, and the second storage electrode may be connected to a source of the first transistor T21. The first storage electrode of the first storage capacitor Cst21 may include the second conductive pattern 2002 and the 11-th conductive pattern 2304, and the second storage electrode of the first storage capacitor Cst21 may include the sixth conductive pattern 2102 and the 21-st conductive pattern 2405.

The second conductive pattern 2002, the sixth conductive pattern 2102, the eleventh conductive pattern 2304, and the 21-st conductive pattern 2405 may include molybdenum (Mo), aluminum (Al), copper (Cu), and/or titanium (Ti) and have a single layer or a multi-layer. As an example, the second conductive pattern 2002, the sixth conductive pattern 2102, and the eleventh conductive pattern 2304 may each be a single Mo layer. The 21-st conductive pattern 2405 may have a multi-layered structure of Ti/Al/Ti.

The second conductive pattern 2002 may be disposed between the substrate 100 and the barrier layer 110, the sixth conductive pattern 2102 may be disposed between the barrier layer 110 and the buffer layer 111, the eleventh conductive pattern 2304 may be disposed between the first insulating layer 113 and the second insulating layer 115, and the 21-st conductive pattern 2405 may be disposed between the second insulating layer 115 and the third insulating layer 117. The second conductive pattern 2002 and the sixth conductive pattern 2102 may overlap each other with the barrier layer 110 therebetween and constitute the (1-1)st storage capacitance Cpt21-1. The sixth conductive pattern 2102 and the eleventh conductive pattern 2304 may overlap each other with the buffer layer 111 and the first insulating layer 113 therebetween and constitute the (1-2)nd storage capacitance Cpt21-2. The eleventh conductive pattern 2304 and the 21-st conductive pattern 2405 may overlap each other with the second insulating layer 115 therebetween and constitute the (1-3)rd storage capacitance Cpt21-3. The barrier layer 110, the buffer layer 111, the first insulating layer 113, and the second insulating layer 115 may serve as dielectric layers.

The second conductive pattern 2002 may be connected to the eleventh conductive pattern 2304 through the second contact hole cntb2 formed in the barrier layer 110, the buffer layer 111, and the first insulating layer 113. The second contact hole cntb2 may pass through the first opening 2102*op* of the sixth conductive pattern 2102. The sixth conductive pattern 2102 may be connected to the 21-st conductive pattern 2405 through the (8-1)st contact hole cntb8-1 formed in the buffer layer 111, the first insulating layer 113, and the second insulating layer 115. The (8-1)st contact hole cntb8-1 may pass through the second opening 2304*op* of the eleventh conductive pattern 2304.

The first storage capacitor Cst21 may include a first storage capacitance Cpt21 based on a (1-1)st storage capacitance Cpt21-1, a (1-2)nd storage capacitance Cpt21-2, and a (1-3)rd storage capacitance Cpt21-3. As an example, the first storage capacitance Cpt21 of the first storage capacitor Cst21 may be a sum of the (1-1)st storage capacitance Cpt21-1, the (1-2)nd storage capacitance Cpt21-2, and the (1-3)rd storage capacitance Cpt21-3.

The first hold capacitor Chd21 may include the third conductive pattern 2003 (or a second electrode), the sixth conductive pattern 2102, and the fourth semiconductor pattern 2204 (or a fourth electrode). The first hold capacitor Chd21 may include a first hold electrode and a second hold electrode. The first hold electrode may be connected to the power line PL of FIG. 5, and the second hold electrode may be connected to the source of the first transistor T21. The first hold electrode of the first hold capacitor Chd21 may include the third conductive pattern 2003 and the fourth semiconductor pattern 2204, and the second hold electrode of the first hold capacitor Chd21 may include the sixth conductive pattern 2102.

The third conductive pattern 2003 and the sixth conductive pattern 2102 may include at least one of molybdenum (Mo), aluminum (Al), copper (Cu), titanium (Ti) and the like and include a single layer or a multi-layer. As an example, the third conductive pattern 2003 and the sixth conductive pattern 2102 may be a single Mo layer. The fourth semiconductor pattern 2204 may include an oxide semiconductor material. The fourth semiconductor pattern 2204 may include, for example, an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). The fourth semiconductor pattern 2204 may be made a conductor (or conductive) by a plasma treatment and the like.

The third conductive pattern 2003 may be disposed between the substrate 100 and the barrier layer 110, the sixth conductive pattern 2102 may be disposed between the barrier layer 110 and the buffer layer 111, and the fourth semiconductor pattern 2204 may be disposed between the buffer layer 111 and the first insulating layer 113. The third conductive pattern 2003 may be apart from the second conductive pattern 2002. The third conductive pattern 2003 and the sixth conductive pattern 2102 may overlap each other with the barrier layer 110 therebetween and constitute a (1-1)st hold capacitance Cpd21-1. The sixth conductive pattern 2102 and the fourth semiconductor pattern 2204 may overlap each other with the buffer layer 111 therebetween and constitute a (1-2)nd hold capacitance Cpd21-2. The barrier layer 110 and the buffer layer 111 may serve as a dielectric layer of the capacitor.

A preset voltage may be applied to the third conductive pattern 2003 and the fourth semiconductor pattern 2204. As an example, the first driving voltage ELVDD of FIG. 5 may be applied to the third conductive pattern 2003 and the fourth semiconductor pattern 2204.

The third conductive pattern 2003 may be electrically connected to the fourth semiconductor pattern 2204. As an example, the third conductive pattern 2003 may be connected to the thirteenth conductive pattern 2306 through the third contact hole cntb3 formed in the barrier layer 110, the buffer layer 111, and the first insulating layer 113. The fourth semiconductor pattern 2204 may be connected to the 22-nd conductive pattern 2406 through the (9-1)st contact hole cntb9-1 formed in the first insulating layer 113 and the second insulating layer 115. The thirteenth conductive pattern 2306 may be connected to the 22-nd conductive pattern 2406 through the (9-2)nd contact hole cntb9-2 formed in the second insulating layer 115. The 22-nd conductive pattern 2406 may be connected to the 25-th conductive pattern 2501 through the twelfth contact hole cntb12 formed in the third insulating layer 117.

The first hold capacitor Chd21 may have the first hold capacitance Cpd21 based on the (1-1)st hold capacitance Cpd21-1 and the (1-2)nd hold capacitance Cpd21-2. As an example, the first hold capacitor Chd21 may be a sum of the (1-1)st hold capacitance Cpd21-1 and the (1-2)nd hold capacitance Cpd21-2.

In case that the 'first storage capacitor Cst21 may include the sixth conductive pattern 2102', it may mean that the 'first storage capacitor Cst21 may include a portion of the sixth conductive pattern 2102 overlapping the second conductive pattern 2002 and the eleventh conductive pattern 2304.' In case that the 'first hold capacitor Chd21 may include the sixth conductive pattern 2102', it may mean that the 'first hold capacitor Chd21 may include another portion of the sixth conductive pattern 2102 overlapping the third conductive pattern 2003 and the fourth semiconductor pattern 2204.'

As described above with reference to FIG. 16, the areas of the second conductive pattern 2002 and the third conductive pattern 2003 may be changed by moving the edge 2002*e* of the second conductive pattern 2002 and the edge 2003*e* of the third conductive pattern 2003 facing each other in the first direction (e.g., the ±x direction) and/or the second direction (e.g., the ±y direction). In case that the areas of the second conductive pattern 2002 and the third conductive pattern 2003 are changed, the area of each of the second conductive pattern 2002 and the third conductive pattern 2003 overlapping the sixth conductive pattern 2102 may be changed. The first storage capacitance Cpt21 of the first storage capacitor Cst21 and the first hold capacitance Cpd21 of the first hold capacitor Chd21 may be changed.

As an example, in case that the positions of the edge 2002*e* of the second conductive pattern 2002 and the edge 2003*e* of the third conductive pattern 2003 facing each other are moved in the +x direction, the area of the second conductive pattern 2002 may be reduced, and the area of the third conductive pattern 2003 may be increased. The first storage capacitance Cpt21 of the first storage capacitor Cst21 may be reduced and the first hold capacitance Cpd21 of the first hold capacitor Chd21 may be increased. In case that the positions of the edge 2002*e* of the second conductive pattern 2002 and the edge 2003*e* of the third conductive pattern 2003 facing each other are moved in the −x direction, the area of the second conductive pattern 2002 may be increased, and the area of the third conductive pattern 2003 may be reduced. The first storage capacitance Cpt21 of the first storage capacitor Cst21 may be increased and the first hold capacitance Cpd21 of the first hold capacitor Chd21 may be reduced.

As described above, capacitors of the first to third pixel circuits PC21, PC22, and PC23 may be differentially formed by moving the positions of the edge 2002*e* of the second conductive pattern 2002 and the edge 2003*e* of the third conductive pattern 2003 facing each other in the first direction (e.g., the ±x direction) and/or the second direction (e.g., the ±y direction). As an example, the second storage capacitance Cpt22 of the second storage capacitor Cst22 may be greater than the first storage capacitance Cpt21 of the first storage capacitor Cst21, and the third storage capacitance Cpt23 of the third storage capacitor Cst23. The third hold capacitance Cpd23 of the third hold capacitor Chd23 may be greater than the first hold capacitance Cpd21 of the first hold capacitor Chd21 and the second hold capacitance Cpd22 of the second hold capacitor Chd22.

As in an embodiment, in case that at least some of the electrodes constituting the first storage capacitor Cst21 is disposed on the first hold capacitor Chd21, an area in which the electrodes constituting the first hold capacitor Chd21 may be arranged may be increased (or secured). In case that at least some of the electrodes constituting the first storage capacitor Cst21 are stacked on the first hold capacitor Chd21, the first hold capacitance Cpd21 of the first hold capacitor Chd21 may be increased (or secured). In case that electrodes constituting the first hold capacitor Chd21 are stacked in a multi-layered structure, the first hold capacitance Cpd21 of the first hold capacitor Chd21 may be increased (or secured) even more. As the first hold capacitance Cpd21 of the first hold capacitor Chd21 is increased (or secured), a change in the source of the first transistor T21 may become small. As a change in the source of the first transistor T21 becomes small, an advantage may be achieved by reducing a data swing range while the pixel circuit is driven.

Figure 22:
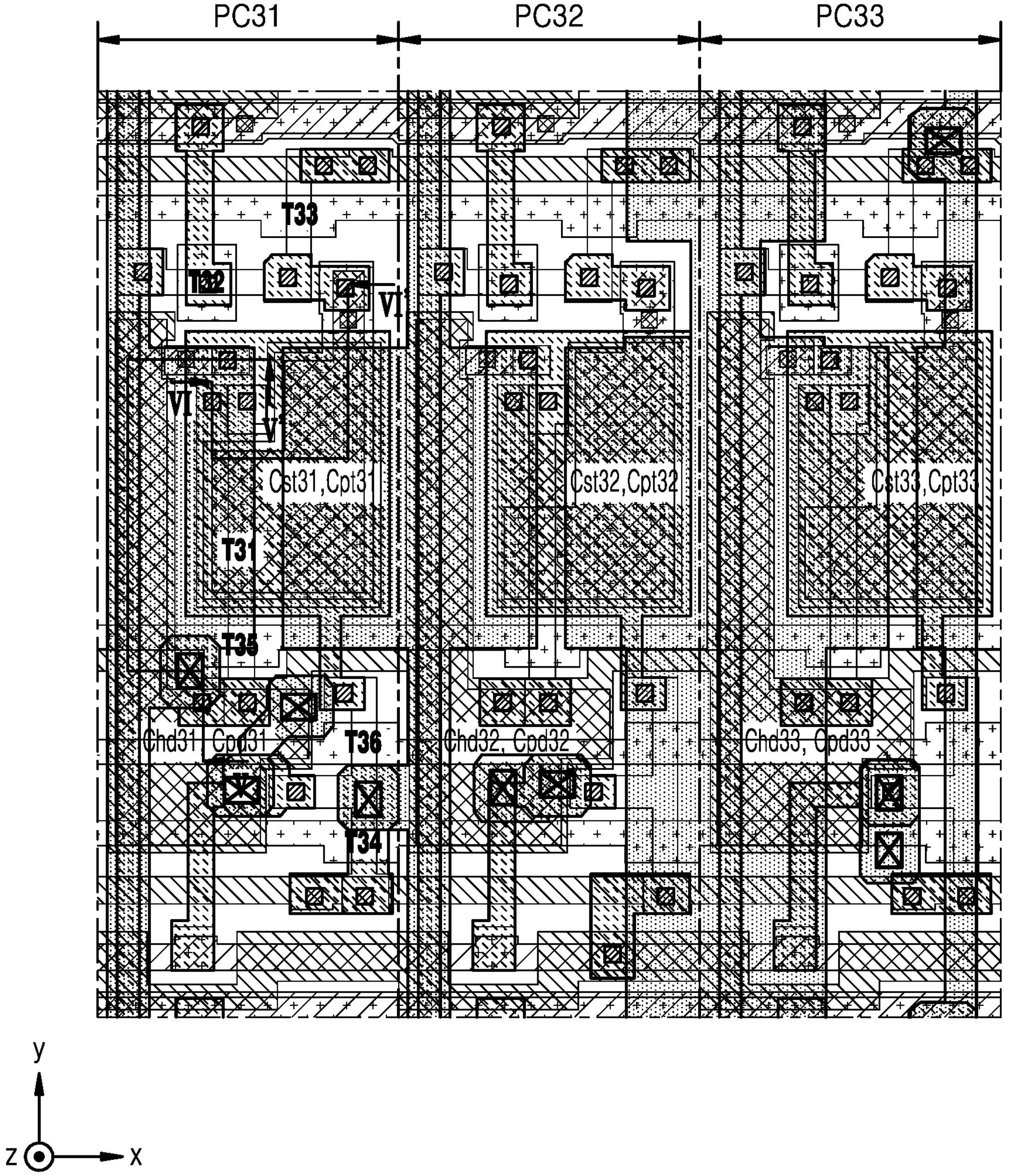
FIG. 22 is a schematic configuration view of positions of transistors, capacitors and the like in pixel circuits included in the display apparatus of FIG. 4.

FIG. 22 is a schematic configuration view of positions of transistors, capacitors and the like in pixel circuits included in the display apparatus of FIG. 4, and FIGS. 23 to 27 are schematic configuration views of elements such as transistors and capacitors, for layers of a display apparatus shown in FIG. 22. Although FIGS. 23 to 27 describe a first pixel circuit PC31 of FIG. 22, the description is equally applicable to a second pixel circuit PC32 and a third pixel circuit PC33.

First, referring to FIG. 22, the display apparatus may include the first pixel circuit PC31, the second pixel circuit PC32, and the third pixel circuit PC33. The first pixel circuit PC31, the second pixel circuit PC32, and the third pixel circuit PC33 may be arranged in the first direction (e.g., the ±x direction).

The first pixel circuit PC31, the second pixel circuit PC32, and the third pixel circuit PC33 may each correspond to the pixel circuit PC of FIG. 5. As an example, the first pixel circuit PC31 may include first to sixth transistors T31, T32, T33, T34, T35, and T36, a first storage capacitor Cst31, and a first hold capacitor Chd31. The first to sixth transistors T31, T32, T33, T34, T35, and T36 may correspond to the first to sixth transistor T1, T2, T3, T4, T5, and T6 of FIG. 5, the first storage capacitor Cst31 may correspond to the storage capacitor Cst of FIG. 5, and the first hold capacitor Chd31 may correspond to the hold capacitor Chd of FIG. 5. Although description has been made to the first pixel circuit PC31, the description is equally applicable to the second pixel circuit PC32 and the third pixel circuit PC33. As an example, the second pixel circuit PC32 may include a second storage capacitor Cst32 and a second hold capacitor Chd32, and the third pixel circuit PC33 may include a third storage capacitor Cst33 and a third hold capacitor Chd33. The second storage capacitor Cst32 and the third storage capacitor Cst33 may each correspond to the storage capacitor Cst of FIG. 5, and the second hold capacitor Chd32 and the third hold capacitor Chd33 may each correspond to the hold capacitor Chd of FIG. 5.

In an embodiment, the first pixel circuit PC31, the second pixel circuit PC32, and the third pixel circuit PC33 may be respectively electrically connected to display elements configured to emit light of different colors. The first pixel circuit PC31, the second pixel circuit PC32, and the third pixel circuit PC33 may be configured to respectively drive display elements configured to emit light of different colors. As an example, a display element electrically connected to the first pixel circuit PC31 may be configured to emit red light. The first pixel circuit PC31 may be configured to drive a display element configured to emit red light. A display element electrically connected to the second pixel circuit PC32 may be configured to emit green light. The second pixel circuit PC32 may be configured to drive a display element configured to emit green light. A display element electrically connected to the third pixel circuit PC33 may be configured to emit blue light. The third pixel circuit PC33 may be configured to drive a display element configured to emit blue light.

The first storage capacitor Cst31 of the first pixel circuit PC31 may have a first storage capacitance Cpt31, and the first hold capacitor Chd31 of the first pixel circuit PC31 may have a first hold capacitance Cpd31. The second storage capacitor Cst32 of the second pixel circuit PC32 may have a second storage capacitance Cpt32, and the second hold capacitor Chd32 of the second pixel circuit PC32 may have a second hold capacitance Cpd32. The third storage capacitor Cst33 of the third pixel circuit PC33 may have a third storage capacitance Cpt33, and the third hold capacitor Chd33 of the third pixel circuit PC33 may have a third hold capacitance Cpd33.

In an embodiment, the first storage capacitance Cpt31 of the first storage capacitor Cst31, the second storage capacitance Cpt32 of the second storage capacitor Cst32, and the third storage capacitance Cpt33 of the third storage capacitor Cst33 may be substantially equal to each other. The first hold capacitance Cpd31 of the first hold capacitor Chd31, the second hold capacitance Cpd32 of the second hold capacitor Chd32, and the third hold capacitance Cpd33 of the third hold capacitor Chd33 may be substantially equal to each other.

In another embodiment, the first storage capacitance Cpt31 of the first storage capacitor Cst31, the second storage capacitance Cpt32 of the second storage capacitor Cst32, and the third storage capacitance Cpt33 of the third storage capacitor Cst33 may be different from each other. The first hold capacitance Cpd31 of the first hold capacitor Chd31, the second hold capacitance Cpd32 of the second hold capacitor Chd32, and the third hold capacitance Cpd33 of the third hold capacitor Chd33 may be different from each other. As an example, the second storage capacitance Cpt32 of the second storage capacitor Cst32 may be greater than the first storage capacitance Cpt31 of the first storage capacitor Cst31, and the third storage capacitance Cpt33 of the third storage capacitor Cst33. The third hold capacitance Cpd33 of the third hold capacitor Chd33 may be greater than the first hold capacitance Cpd31 of the first hold capacitor Chd31 and the second hold capacitance Cpd32 of the second hold capacitor Chd32.

Elements such as transistors and capacitors of the display apparatus shown in FIG. 22 are described more specifically with reference to FIGS. 23 to 27.

Figure 23:
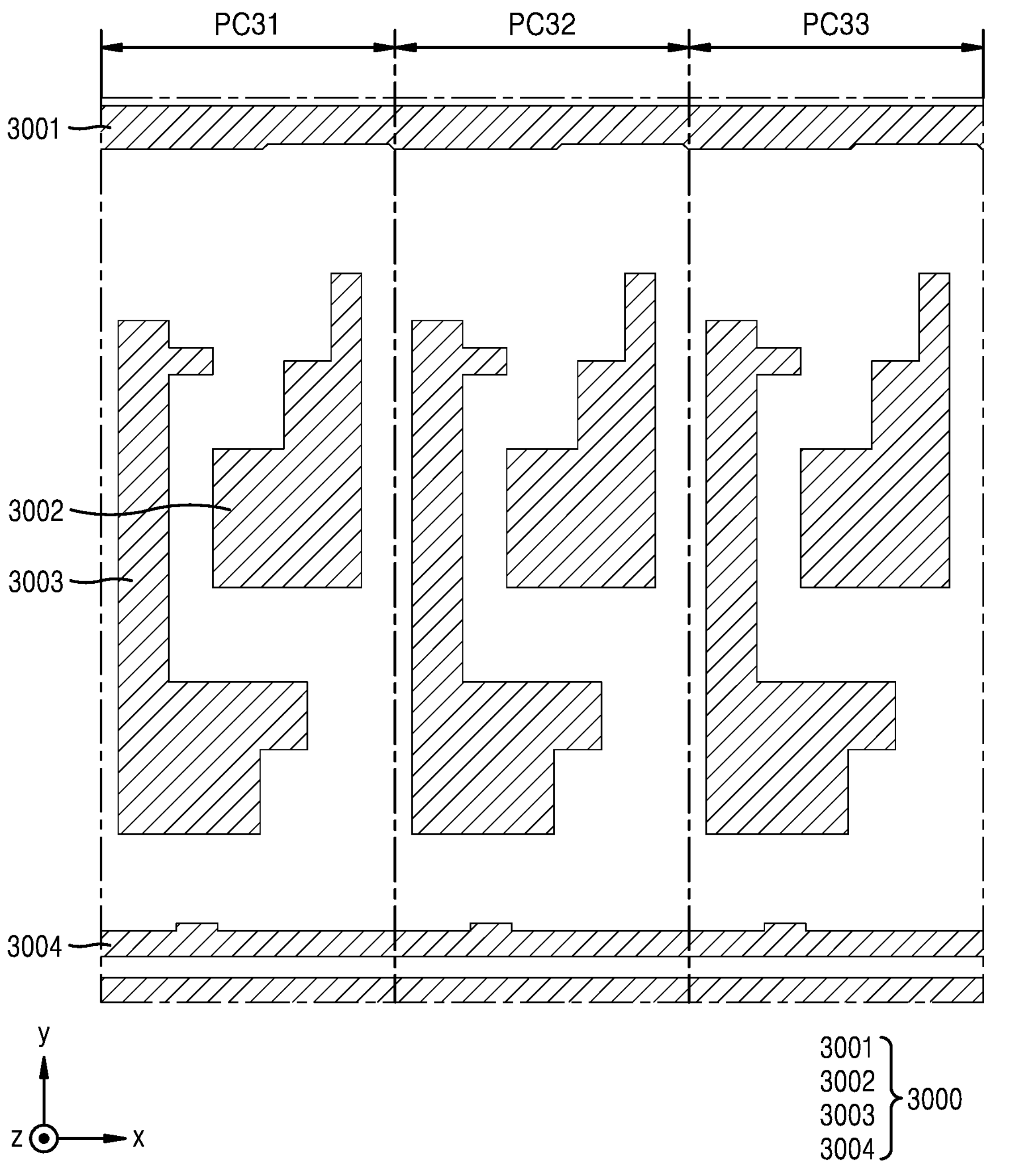
FIGS. 23 to 27 are schematic configuration views of elements such as transistors and capacitors, for layers of a display apparatus shown in FIG. 22.

A first conductive layer 3000 shown in FIG. 23 may be disposed on the substrate 100 (see FIG. 4). The first conductive layer 3000 may include at least one of molybdenum (Mo), aluminum (Al), copper (Cu), titanium (Ti) and the like and include a single layer or a multi-layer. As an example, the first conductive layer 3000 may include a single Mo layer.

The first conductive layer 3000 may include a first conductive pattern 3001, a second conductive pattern 3002, a third conductive pattern 3003, and a fourth conductive pattern 3004. The first conductive pattern 3001 and the fourth conductive pattern 3004 may substantially extend in the first direction (e.g., the +x direction). The fourth conductive pattern 3004 may be a repair line. The first conductive pattern 3001 may correspond to the first scan line GWL of FIG. 5, the second conductive pattern 3002 may correspond to the first storage electrode CEs1 of the storage capacitor Cst of FIG. 5, and the third conductive pattern 3003 may correspond to the second hold electrode CEh2 of the hold capacitor Chd of FIG. 5.

Figure 24:
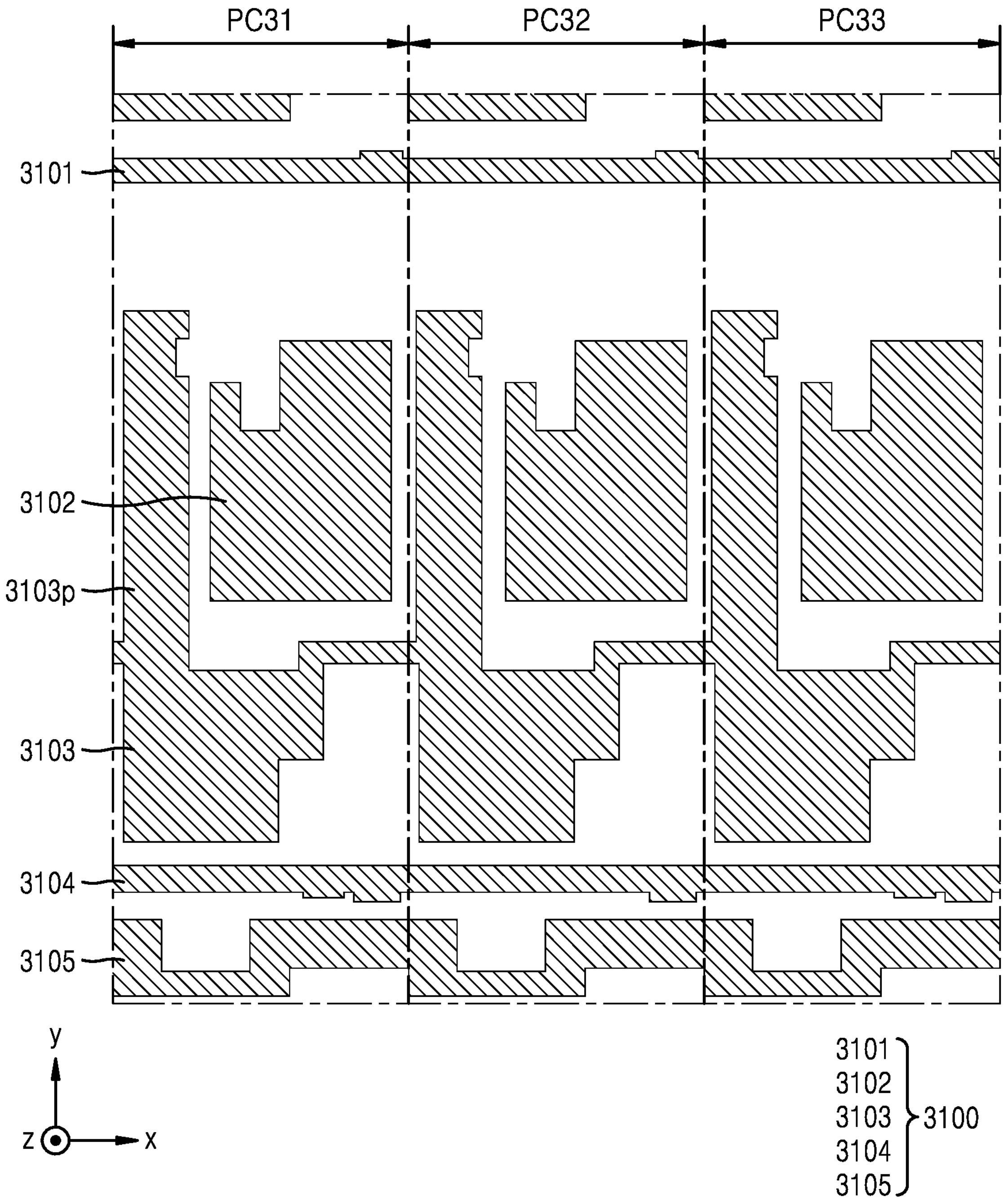

A second conductive layer 3100 shown in FIG. 24 may be disposed on the first conductive layer 3000. The second conductive layer 3100 may include at least one of molybdenum (Mo), aluminum (Al), copper (Cu), titanium (Ti) and the like and include a single layer or a multi-layer. As an example, the second conductive layer 3100 may include a single Mo layer.

The second conductive layer 3100 may include a fifth conductive pattern 3101, a sixth conductive pattern 3102, a seventh conductive pattern 3103, an eighth conductive pattern 3104, and a ninth conductive pattern 3105. The fifth conductive pattern 3101, the seventh conductive pattern 3103, the eighth conductive pattern 3104, and the ninth conductive pattern 3105 may substantially extend in the first direction (e.g., the +x direction). The fifth conductive pattern 3101, the seventh conductive pattern 3103, the eighth conductive pattern 3104, and the ninth conductive pattern 3105 may be in a state in which a preset voltage is applied. As an example, the reference voltage VREF of FIG. 5 may be applied to the fifth conductive pattern 3101, the first driving voltage ELVDD of FIG. 5 may be applied to the seventh conductive pattern 3103, and the initialization voltage Vint of FIG. 5 may be applied to the eighth conductive pattern 3104 and the ninth conductive pattern 3105. The fifth conductive pattern 3101 may correspond to the first voltage line VL1 of FIG. 5, the sixth conductive pattern 3102 may correspond to the second storage electrode CEs2 of the storage capacitor Cst of FIG. 5, the seventh conductive pattern 3103 may correspond to the first hold electrode CEh1 of the hold capacitor Chd of FIG. 5, and the eighth conductive pattern 3104 and the ninth conductive pattern 3105 may correspond to the second voltage line VL2 of FIG. 5.

In an embodiment, the seventh conductive pattern 3103 may have a protrusion 3103*p* protruding in the second direction (e.g., the ±y direction). The sixth conductive pattern 3102 may be arranged adjacent to the protrusion 3103*p* of the seventh conductive pattern 3103 in the first direction (e.g., the ±x direction). The sixth conductive pattern 3102 may be arranged between the protrusions 3103*p* of the seventh conductive pattern 3103.

The eighth conductive pattern 3104 and the ninth conductive pattern 3105 may each correspond to the second voltage line VL2 of FIG. 5 and may be respectively connected to different pixel circuits. As an example, the eighth conductive pattern 3104 may be connected to the first pixel circuit PC31 and the third pixel circuit PC33, and configured to transfer the initialization voltage Vint of FIG. 5 to the first pixel circuit PC31 and the third pixel circuit PC33. The ninth conductive pattern 3105 may be connected to the second pixel circuit PC32 and configured to transfer the initialization voltage Vint to the second pixel circuit PC32.

Figure 25:
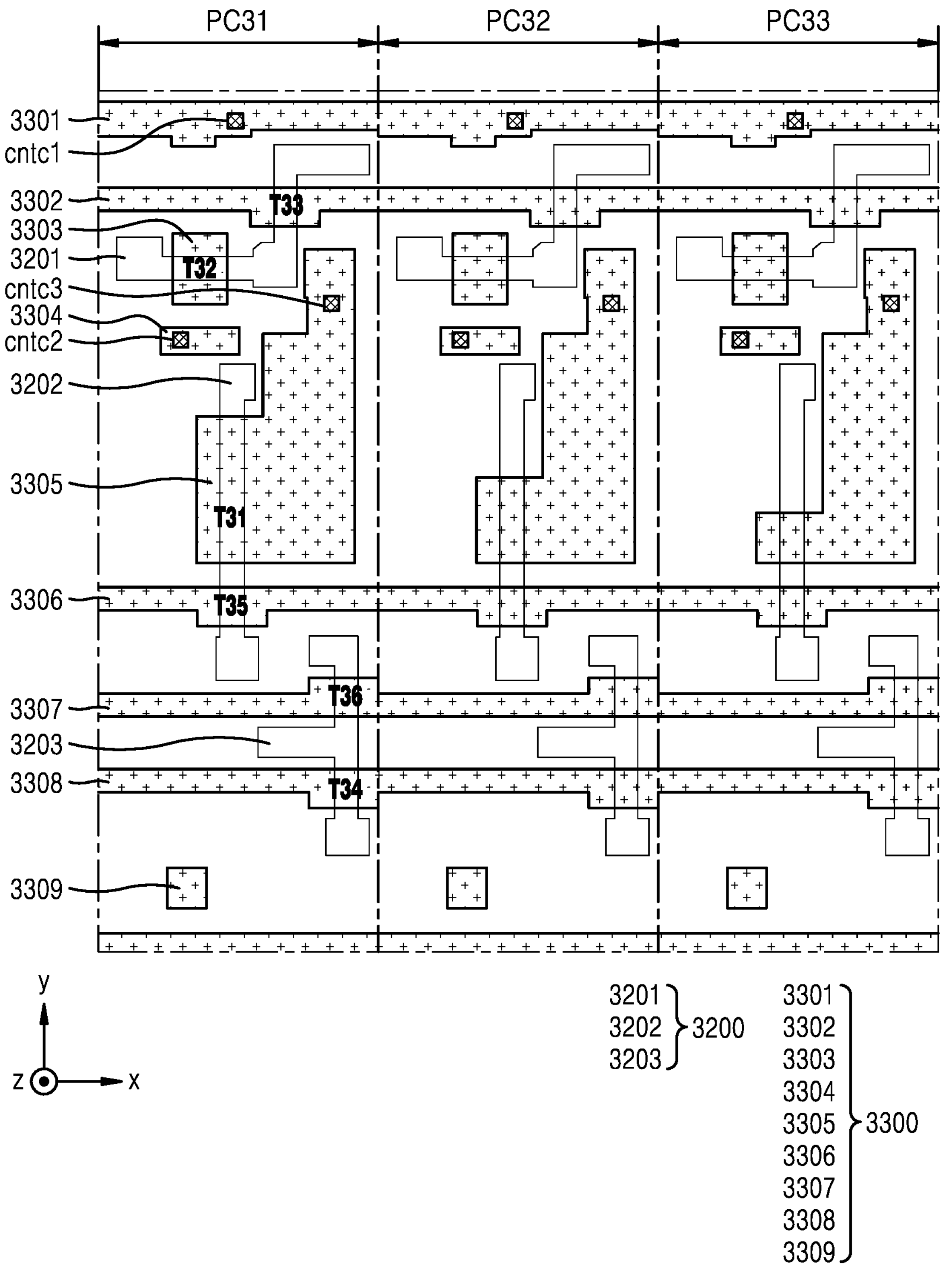

A semiconductor layer 3200 shown in FIG. 25 may be disposed on the second conductive layer 2100. The semiconductor layer 3200 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). As an example, the semiconductor layer 3200 may be an ITZO (In—Sn—Zn—O) semiconductor layer, an IGZO (In—Ga—Zn—O) semiconductor layer and the like. In case needed, a process of making a conductor (or conductive) by plasma treatment and the like may be performed on at least a portion of the semiconductor layer 3200. The semiconductor layer 3200 may include a first semiconductor pattern 3201, a second semiconductor pattern 3202, and a third semiconductor pattern 3203.

A third conductive layer 3300 shown in FIG. 25 may be disposed on the semiconductor layer 3200. The third conductive layer 3300 may include at least one of molybdenum (Mo), aluminum (Al), copper (Cu), titanium (Ti) and the like and include a single layer or a multi-layer. As an example, the third conductive layer 3300 may include a single Mo layer.

The third conductive layer 3300 may include a tenth conductive pattern 3301, an eleventh conductive pattern 3302, a twelfth conductive pattern 3303, a thirteenth conductive pattern 3304, a fourteenth conductive pattern 3305, a fifteenth conductive pattern 3306, a sixteenth conductive pattern 3307, a seventeenth conductive pattern 3308, and an eighteenth conductive pattern 3309. The tenth conductive pattern 3301, the eleventh conductive pattern 3302, the fifteenth conductive pattern 3306, the sixteenth conductive pattern 3307, and the seventeenth conductive pattern 3308 may substantially extend in the first direction (e.g., the +x direction). The tenth conductive pattern 3301 may correspond to the first scan line GWL of FIG. 5, the eleventh conductive pattern 3302 may correspond to the second scan line GRL of FIG. 5, the fourteenth conductive pattern 3305 may correspond to the first storage electrode CEs1 of the storage capacitor Cst of FIG. 5, the fifteenth conductive pattern 3306 may correspond to the first emission control line EML of FIG. 5, the sixteenth conductive pattern 3307 may correspond to the second emission control line EMBL of FIG. 5, and the seventeenth conductive pattern 3308 may correspond to the third scan line GIL of FIG. 5.

A portion of the twelfth conductive pattern 3303 overlapping the first semiconductor pattern 3201 may correspond to a gate of the second transistor T32. A portion of the eleventh conductive pattern 3302 overlapping the first semiconductor pattern 3201 may correspond to a gate of the third transistor T33. A portion of the fourteenth conductive pattern 3305 overlapping the second semiconductor pattern 3202 may correspond to a gate of the first transistor T31. A portion of the fifteenth conductive pattern 3306 overlapping the second semiconductor pattern 3202 may correspond to a gate of the fifth transistor T35. A portion of the sixteenth conductive pattern 3307 overlapping the third semiconductor pattern 3203 may correspond to a gate of the sixth transistor T36. A portion of the seventeenth conductive pattern 3308 overlapping the third semiconductor pattern 3203 may correspond to a gate of the fourth transistor T34.

The tenth conductive pattern 3301 may be connected to the first conductive pattern 3001 through a first contact hole cntc1. The thirteenth conductive pattern 3304 may be connected to the third conductive pattern 3003 through a second contact hole cntc2. The fourteenth conductive pattern 3305 may be connected to the second conductive pattern 3002 through a third contact hole cntc3. The second conductive pattern 3002 and the fourteenth conductive pattern 3305 may constitute the first storage electrode CEs1 of the storage capacitor Cst of FIG. 5.

Figure 26:
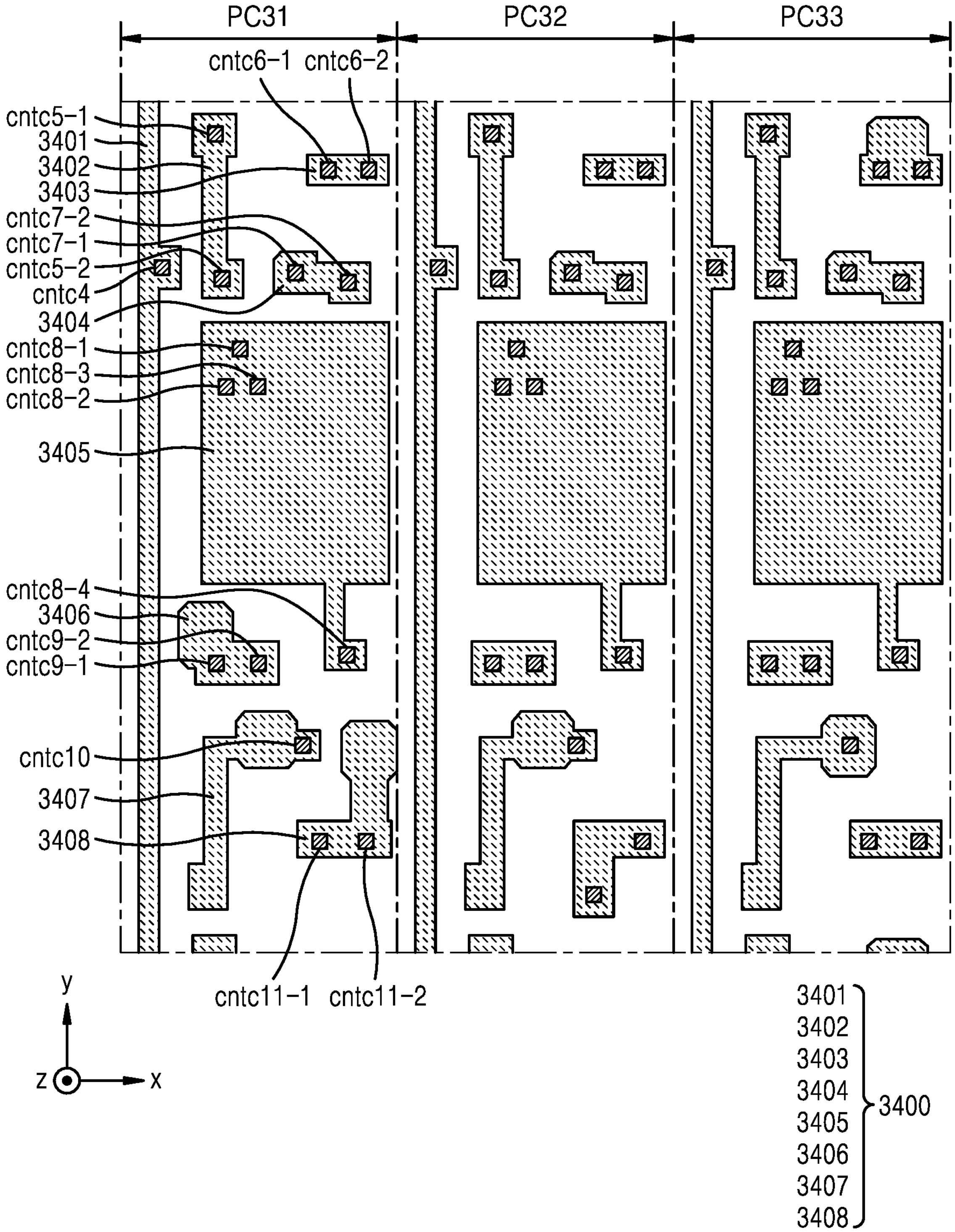

A fourth conductive layer 3400 shown in FIG. 26 may be disposed on the third conductive layer 3300. The fourth conductive layer 3400 may include a conductive material including molybdenum (Mo), aluminum (Al), copper (Cu), and/or titanium (Ti) and have a single-layered structure or a multi-layered structure including the above materials. As an example, the fourth conductive layer 3400 may have a multi-layered structure of Ti/Al/Ti.

The fourth conductive layer 3400 may include a nineteenth conductive pattern 3401, a 20-th conductive pattern 3402, a 21-st conductive pattern 3403, a 22-nd conductive pattern 3404, a 23-rd conductive pattern 3405, a 24-th conductive pattern 3406, a 25-th conductive pattern 3407, and a 26-th conductive pattern 3408. The nineteenth conductive pattern 3401 may substantially extend in the second direction (e.g., the ±y direction). The nineteenth conductive pattern 3401 may correspond to the data line DL of FIG. 5. The 23-rd conductive pattern 3405 may correspond to the second storage electrode CEs2 of the storage capacitor Cst of FIG. 5.

The nineteenth conductive pattern 3401 may be connected to the first semiconductor pattern 3201 through a fourth contact hole cntc4. The 20-th conductive pattern 3402 may be connected to the tenth conductive pattern 3301 through a (5-1)st contact hole cntc5-1 and connected to the twelfth conductive pattern 3303 through a (5-2)nd contact hole cntc5-2. The 21-st conductive pattern 3403 may be connected to the first semiconductor pattern 3201 through a (6-1)st contact hole cntc6-1 and connected to the fifth conductive pattern 3101 through a (6-2)nd contact hole cntc6-2. The 22-nd conductive pattern 3404 may be connected to the first semiconductor pattern 3201 through a (7-1)st contact hole cntc7-1 and connected to the fourteenth conductive pattern 3305 through a (7-2)nd contact hole cntc7-2. The 23-rd conductive pattern 3405 may be connected to the thirteenth conductive pattern 3304 through a (8-1)st contact hole cntc8-1, connected to the sixth conductive pattern 3102 through a (8-2)nd contact hole cntc8-2, connected to the second semiconductor pattern 3202 through a (8-3)rd contact hole cntc8-3, and connected to the third semiconductor pattern 3203 through a (8-4)th contact hole cntc8-4. The 24-th conductive pattern 3406 may be connected to the seventh conductive pattern 3103 through a (9-1)st contact hole cntc9-1 and connected to the second semiconductor pattern 3202 through a (9-2)nd contact hole cntc9-2. The 25-th conductive pattern 3407 may be connected to the third semiconductor pattern 3203 through a tenth contact hole cntc10. The 26-th conductive pattern 3408 may be connected to the eighth conductive pattern 3104 through a (11-1)st contact hole cntc11-1 and connected to the third semiconductor pattern 3203 through a (11-2)nd contact hole cntc11-2.

Figure 27:
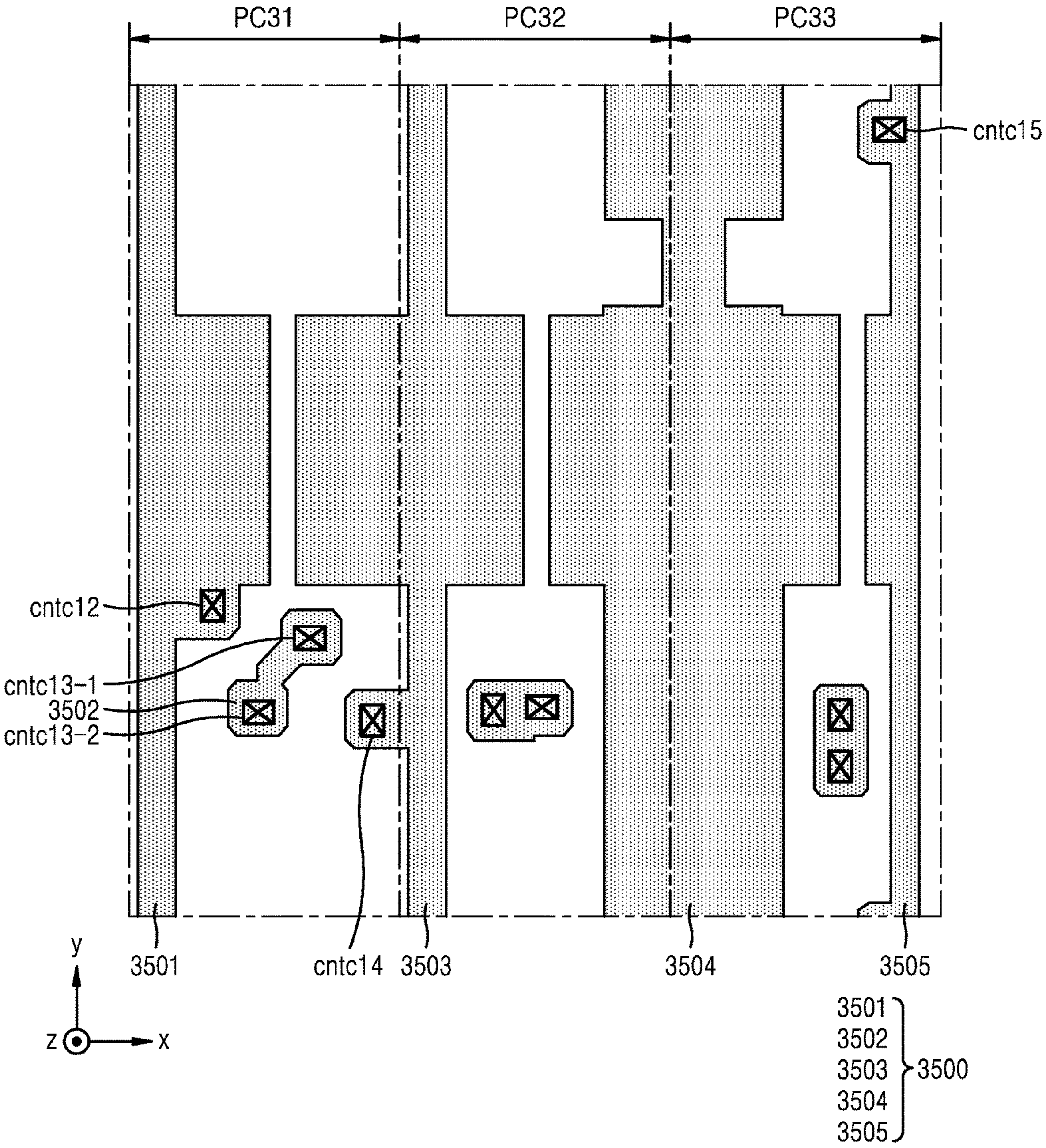

A fifth conductive layer 3500 shown in FIG. 27 may be disposed on the fourth conductive layer 3400. The fifth conductive layer 3500 may include a conductive material including molybdenum (Mo), aluminum (Al), copper (Cu), and/or titanium (Ti) and have a single-layered structure or a multi-layered structure including the above materials. As an example, the fifth conductive layer 3500 may have a multi-layered structure of Ti/Al/Ti.

The fifth conductive layer 3500 may include a 27-th conductive pattern 3501, a 28-th conductive pattern 3502, a 29-th conductive pattern 3503, a 30-th conductive pattern 3504, and a 31-st conductive pattern 3505. The 27-th conductive pattern 3501, the 29-th conductive pattern 3503, the 30-th conductive pattern 3504, and the 31 st conductive pattern 3505 may substantially extend in the second direction (e.g., the ty direction). The 27-th conductive pattern 3501 may correspond to the power line PL of FIG. 5, the 29-th conductive pattern 3503 may correspond to the second voltage line VL2 of FIG. 5, the 30-th conductive pattern 3504 may correspond to the common electrode of FIG. 5, and the 31-st conductive pattern 3505 may correspond to the first voltage line VL1 of FIG. 5.

The 27-th conductive pattern 3501 may be connected to the 24-th conductive pattern 3406 through a 12-th contact hole cntc12. The 28-th conductive pattern 3502 may be connected to an anode of the display element through a (13-1)st contact hole cntc13-1 and connected to the 25-th conductive pattern 3407 through a (13-2)nd contact hole cntc13-2. The 29-th conductive pattern 3503 may be connected to the 26-th conductive pattern 3408 through a 14-th contact hole cntc14. The 31-st conductive pattern 3505 may be connected to the 21-st conductive pattern 3403 of the third pixel circuit PC33 through a 15-th contact hole cntc15.

Figure 28:
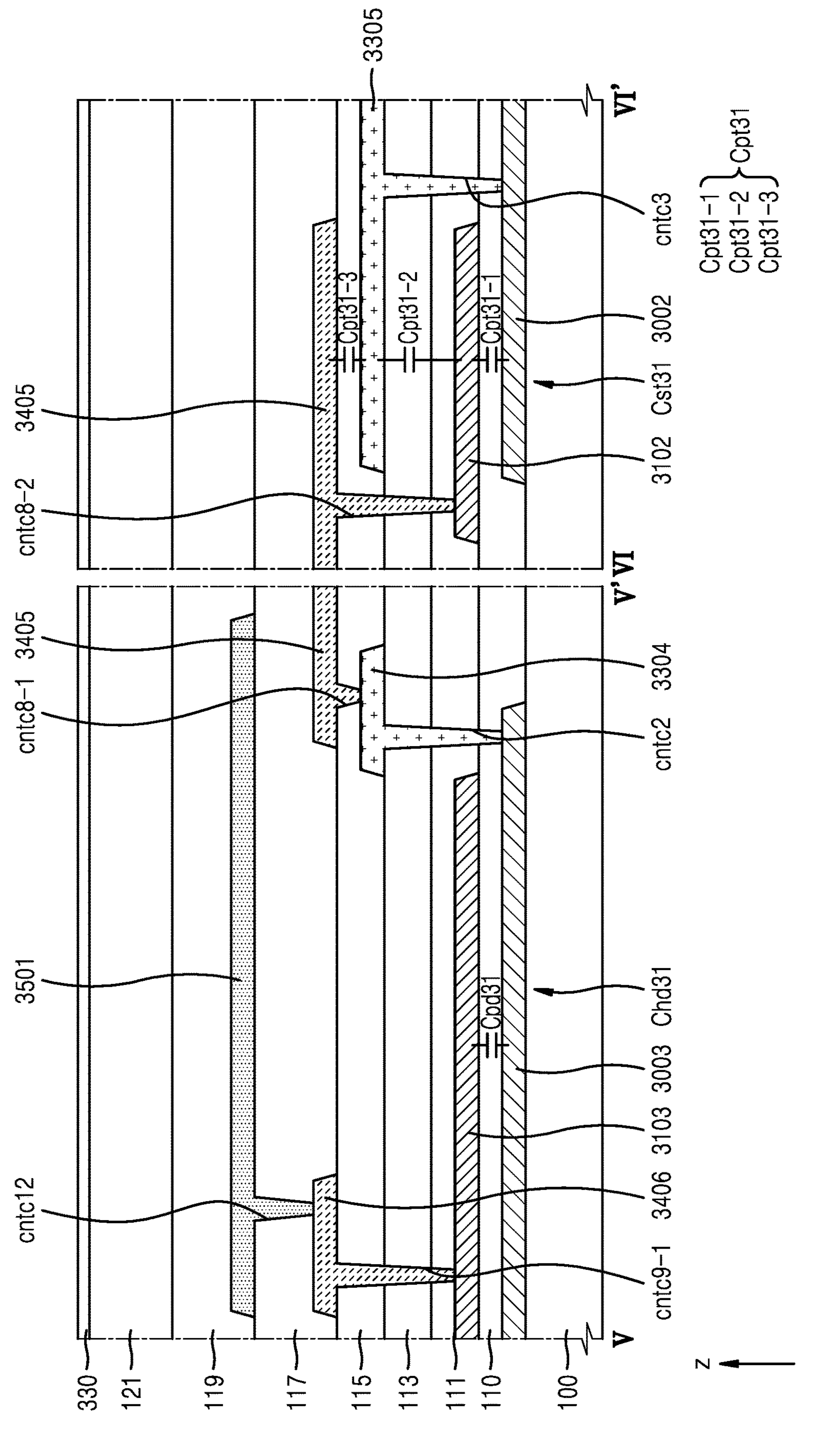
FIG. 28 is a cross-sectional view of an example of portions of the display apparatus in FIG. 22, taken along lines V-V' and VI-VI' in FIG. 22, respectively.

FIG. 28 is a cross-sectional view of an example of portions of the display apparatus in FIG. 22, taken along lines V-V' and VI-VI' in FIG. 22, respectively. Although FIG. 28 describes the first pixel circuit PC31 of FIG. 22, the description is equally applicable to the second pixel circuit PC32 and the third pixel circuit PC33. In FIG. 28, the same reference numerals as those of FIG. 12 denote the same members, and thus, repeated descriptions thereof are omitted.

Referring to FIG. 28, the first pixel circuit PC31 may include the first storage capacitor Cst31 and the first hold capacitor Chd31.

The first storage capacitor Cst31 may include the second conductive pattern 3002 (or a first electrode), the sixth conductive pattern 3102 (or a third electrode), the 14-th conductive pattern 3305 (or a fifth electrode), and the 23-rd conductive pattern 3405 (or a sixth electrode). The first storage capacitor Cst31 may include a first storage electrode and a second storage electrode. The first storage electrode may be connected to a (upper) gate of the first transistor T31, and the second storage electrode may be connected to a source of the first transistor T31. The first storage electrode of the first storage capacitor Cst31 may include the second conductive pattern 3002 and the 14-th conductive pattern 3305, and the second storage electrode of the first storage capacitor Cst31 may include the sixth conductive pattern 3102 and the 23-rd conductive pattern 3405.

The second conductive pattern 3002, the sixth conductive pattern 3102, the fourteenth conductive pattern 3305, and the 23-rd conductive pattern 3405 may include molybdenum (Mo), aluminum (Al), copper (Cu), and/or titanium (Ti) and have a single layer or a multi-layer. As an example, the second conductive pattern 3002, the sixth conductive pattern 3102, and the fourteenth conductive pattern 3305 may each be a single Mo layer. The 23-rd conductive pattern 3405 may have a multi-layered structure of Ti/Al/Ti.

The second conductive pattern 3002 may be disposed between the substrate 100 and the barrier layer 110, the sixth conductive pattern 3102 may be disposed between the barrier layer 110 and the buffer layer 111, the fourteenth conductive pattern 3305 may be disposed between the first insulating layer 113 and the second insulating layer 115, and the 23-rd conductive pattern 3405 may be disposed between the second insulating layer 115 and the third insulating layer 117. The second conductive pattern 3002 and the sixth conductive pattern 3102 may overlap each other with the barrier layer 110 therebetween and constitute the (1-1)st storage capacitance Cpt31-1. The sixth conductive pattern 3102 and the fourteenth conductive pattern 3305 may overlap each other with the buffer layer 111 and the first insulating layer 113 therebetween and constitute the (1-2)nd storage capacitance Cpt31-2. The fourteenth conductive pattern 3305 and the 23-rd conductive pattern 3405 may overlap each other with the second insulating layer 115 therebetween and constitute the (1-3)rd storage capacitance Cpt31-3. The barrier layer 110, the buffer layer 111, the first insulating layer 113, and the second insulating layer 115 may serve as dielectric layers.

The second conductive pattern 3002 may be connected to the fourteenth conductive pattern 3305 through the third contact hole cntc3 formed in the barrier layer 110, the buffer layer 111, and the first insulating layer 113. The sixth conductive pattern 3102 may be connected to the 23-rd conductive pattern 3405 through the (8-2)nd contact hole cntc8-2 formed in the buffer layer 111, the first insulating layer 113, and the second insulating layer 115.

The first storage capacitor Cst31 may include a first storage capacitance Cpt31 based on a (1-1)st storage capacitance Cpt31-1, a (1-2)nd storage capacitance Cpt31-2, and a (1-3)rd storage capacitance Cpt31-3. As an example, the first storage capacitance Cpt31 of the first storage capacitor Cst31 may be a sum of the (1-1)st storage capacitance Cpt31-1, the (1-2)nd storage capacitance Cpt31-2, and the (1-3)rd storage capacitance Cpt31-3.

The first hold capacitor Chd31 may include the third conductive pattern 3003 (or the second electrode) and the seventh conductive pattern 3103 (or the fourth electrode). The first hold capacitor Chd31 may include a first hold electrode and a second hold electrode. The first hold electrode may be connected to the power line PL of FIG. 5, and the second hold electrode may be connected to the source of the first transistor T31. The first hold electrode of the first hold capacitor Chd31 may include the third conductive pattern 3003, and the second hold electrode of the first hold capacitor Chd31 may include the seventh conductive pattern 3103.

The third conductive pattern 3003 and the seventh conductive pattern 3103 may include at least one of molybdenum (Mo), aluminum (Al), copper (Cu), titanium (Ti) and the like and include a single layer or a multi-layer. As an example, the third conductive pattern 3003 and the seventh conductive pattern 3103 may be a single Mo layer.

The third conductive pattern 3003 may be disposed between the substrate 100 and the barrier layer 110, and the seventh conductive pattern 3103 may be disposed between the barrier layer 110 and the buffer layer 111. The third conductive pattern 3003 may be apart from the second conductive pattern 3002, and the seventh conductive pattern 3103 may be apart from the sixth conductive pattern 3102. The third conductive pattern 3003 may overlap the seventh conductive pattern 3103 with the barrier layer 110 therebetween. The third conductive pattern 3003 and the seventh conductive pattern 3103 may constitute the first hold capacitance Cpd31 of the first hold capacitor Chd31. The barrier layer 110 may serve as a dielectric layer of the capacitor.

In an embodiment, a preset voltage may be applied to the seventh conductive pattern 3103. As an example, the first driving voltage ELVDD of FIG. 5 may be applied to the seventh conductive pattern 3103. The seventh conductive pattern 3103 may be connected to the 24-th conductive pattern 3406 through the (9-1)st contact hole cntc9-1 formed in the buffer layer 111, the first insulating layer 113, and the second insulating layer 115. The 24-th conductive pattern 3406 may be connected to the 27-th conductive pattern 3501 through the twelfth contact hole cntc12 formed in the third insulating layer 117.

The third conductive pattern 3003 may be electrically connected to the 23-rd conductive pattern 3405. As an example, the third conductive pattern 3003 may be connected to the thirteenth conductive pattern 3304 through the second contact hole cntc2 formed in the barrier layer 110, the buffer layer 111, and the first insulating layer 113. The thirteenth conductive pattern 3304 may be electrically connected to the 23-rd conductive pattern 3405 through the (8-1)st contact hole cntc8-1 formed in the second insulating layer 115.

As in an embodiment, in case that at least some of the electrodes constituting the first storage capacitor Cst31 is disposed on the first hold capacitor Chd31, an area in which the electrodes constituting the first hold capacitor Chd31 may be arranged may be increased (or secured). In case that at least some of the electrodes constituting the first storage capacitor Cst31 are stacked on the first hold capacitor Chd31, the first hold capacitance Cpd31 of the first hold capacitor Chd31 may be increased (or secured). As the first hold capacitance Cpd31 of the first hold capacitor Chd31 is increased (or secured), a change in the source of the first transistor T31 may become small. As a change in the source of the first transistor T31 becomes small, an advantage may be achieved by reducing a data swing range while the pixel circuit is driven.

Though description has been made to with respect to a display apparatus, the description is not limited thereto. As an example, a method of manufacturing such a display apparatus also falls within the scope of the disclosure.

According to an embodiment, a display apparatus including a capacitor with an increased (or secured) capacitance may be implemented. The capacitor may be in a pixel circuit configured to drive a display element. However, the scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure.

What is claimed is:

1. A display apparatus, comprising:

a first electrode and a second electrode that are disposed apart from each other on a substrate;

a first insulating layer disposed on the substrate and covering the first electrode and the second electrode;

a third electrode disposed on the first insulating layer and covering the first electrode and the second electrode;

a second insulating layer disposed on the first insulating layer and covering the third electrode;

a fourth electrode disposed on the second insulating layer, covering the third electrode, and electrically connected to the first electrode;

a third insulating layer disposed on the second insulating layer and covering the fourth electrode; and a fifth electrode disposed on the third insulating layer, covering the fourth electrode, and electrically connected to the third electrode.

2. The display apparatus of claim 1, wherein in a plan view, the second electrode substantially extends in a first direction and has a protrusion protruding in a second direction intersecting the first direction, and the first electrode is disposed adjacent in the first direction to the protrusion of the second electrode.

3. The display apparatus of claim 1, further comprising:

a first display element configured to emit light of a first color; and a first pixel circuit electrically connected to the first display element and electrically connected to a power line, wherein:

the first pixel circuit includes:

a first transistor configured to control a magnitude of a first driving current flowing through the first display element;

a first storage capacitor electrically connected between a gate of the first transistor and a source of the first transistor; and a first hold capacitor electrically connected between the power line and the source of the first transistor, a first storage capacitance of the first storage capacitor is a sum of a first capacitance between the first electrode and the third electrode, a second capacitance between the third electrode and the fourth electrode, and a third capacitance between the fourth electrode and the fifth electrode, and a first hold capacitance of the first hold capacitor is a fourth capacitance between the second electrode and the third electrode.

4. The display apparatus of claim 3, further comprising:

a second display element configured to emit light of a second color different from the first color; and a second pixel circuit electrically connected to the second display element and electrically connected to the power line, wherein the second pixel circuit includes:

a second transistor configured to control a magnitude of a second driving current flowing through the second display element;

a second storage capacitor electrically connected between a gate of the second transistor and a source of the second transistor; and a second hold capacitor electrically connected between the power line and the source of the second transistor, the first storage capacitance of the first storage capacitor is greater than a second storage capacitance of the second storage capacitor, and the first hold capacitance of the first hold capacitor is less than a second hold capacitance of the second hold capacitor.

5. The display apparatus of claim 4, wherein the first color is green, and the second color is blue.

6. The display apparatus of claim 1, further comprising:

a display element; and a pixel circuit electrically connected to the display element and electrically connected to a power line, wherein the pixel circuit includes:

a first transistor configured to control a magnitude of a driving current flowing through the display element;

a storage capacitor including a first storage electrode and a second storage electrode, the first storage electrode being electrically connected to a gate of the first transistor, and the second storage electrode being electrically connected to a source of the first transistor; and a hold capacitor including a first hold electrode and a second hold electrode, the first hold electrode being electrically connected to the power line, and the second hold electrode being electrically connected to the source of the first transistor, the first storage electrode of the storage capacitor includes the first electrode and the fourth electrode, the second storage electrode of the storage capacitor includes a portion of the third electrode overlapping the first electrode, and the fifth electrode, the first hold electrode of the hold capacitor includes the second electrode, and the second hold electrode of the hold capacitor includes another portion of the third electrode overlapping the second electrode.

7. The display apparatus of claim 6, wherein the display element includes an anode and a cathode, the pixel circuit is electrically connected to a data line, a first voltage line, and a second voltage line, and the pixel circuit further includes:

a second transistor configured to electrically connect the data line to the gate of the first transistor in response to a first scan signal;

a third transistor configured to electrically connect the first voltage line to the gate of the first transistor in response to a second scan signal;

a fourth transistor configured to electrically connect the second voltage line to the anode of the display element in response to a third scan signal;

a fifth transistor configured to electrically connect the power line to a drain of the first transistor in response to a first emission control signal; and a sixth transistor configured to electrically connect the source of the first transistor to the anode of the display element in response to a second emission control signal.

8. The display apparatus of claim 1, further comprising:

a semiconductor layer disposed between the third electrode and the fourth electrode and including an oxide semiconductor material.

9. The display apparatus of claim 1, wherein the third electrode includes an opening exposing at least a portion of the first insulating layer, and the first electrode is electrically connected to the fourth electrode through a contact hole passing through the opening of the third electrode.

10. The display apparatus of claim 9, wherein, in a plan view, the opening of the third electrode overlaps a central portion of the first electrode.

11. The display apparatus of claim 1, wherein the fourth electrode includes an opening exposing at least a portion of the second insulating layer, and the third electrode is electrically connected to the fifth electrode through a contact hole passing through the opening of the fourth electrode.

12. The display apparatus of claim 1, wherein a first hold capacitor in a first pixel circuit is a capacitance between the second electrode and the third electrode.

13. The display apparatus of claim 1, wherein the first electrode and the second electrode are disposed in a same layer.

14. The display apparatus of claim 1, wherein the first electrode and the fourth electrode are directly electrically connected to each other.

15. The display apparatus of claim 1, wherein the third electrode and the fifth electrode are part of a same electrical node.

16. The display apparatus of claim 1, wherein the third electrode and the fourth electrode overlap in a plan view.

17. A display apparatus, comprising:

a first electrode and a second electrode that are disposed apart from each other on a substrate;

a first insulating layer disposed on the substrate and covering the first electrode and the second electrode;

a third electrode disposed on the first insulating layer and covering the first electrode and the second electrode;

a second insulating layer disposed on the first insulating layer and covering the third electrode;

a fourth electrode disposed on the second insulating layer, covering the third electrode, and electrically connected to the second electrode;

a third insulating layer disposed on the second insulating layer and covering the fourth electrode;

a fifth electrode disposed on the third insulating layer, covering the third electrode, and electrically connected to the first electrode;

a fourth insulating layer disposed on the third insulating layer and covering the fifth electrode; and a sixth electrode disposed on the fourth insulating layer, covering the fifth electrode, and electrically connected to the third electrode.

18. The display apparatus of claim 17, wherein the fourth electrode includes an oxide semiconductor material.

19. The display apparatus of claim 17, wherein in a plan view, the second electrode substantially extends in a first direction and has a protrusion protruding in a second direction intersecting the first direction, and the first electrode is disposed adjacent in the first direction to the protrusion of the second electrode.

20. The display apparatus of claim 17, further comprising:

a display element; and a pixel circuit electrically connected to the display element and electrically connected to a power line, wherein the pixel circuit includes:

a transistor configured to control a magnitude of a driving current flowing through the display element;

a storage capacitor including a first storage electrode and a second storage electrode, the first storage electrode being electrically connected to a gate of the transistor, and the second storage electrode being electrically connected to a source of the transistor; and a hold capacitor including a first hold electrode and a second hold electrode, the first hold electrode being electrically connected to the power line, and the second hold electrode being electrically connected to the source of the transistor, the first storage electrode of the storage capacitor includes the first electrode and the fifth electrode, the second storage electrode of the storage capacitor includes a portion of the third electrode overlapping the first electrode, and the sixth electrode, the first hold electrode of the hold capacitor includes the second electrode and the fourth electrode, and the second hold electrode of the hold capacitor includes another portion of the third electrode overlapping the second electrode.

21. The display apparatus of claim 17, further comprising:

a first display element configured to emit light of a first color; and a first pixel circuit electrically connected to the first display element and electrically connected to a power line, wherein the first pixel circuit includes:

a first transistor configured to control a magnitude of a first driving current flowing through the first display element;

a first storage capacitor electrically connected between a gate of the first transistor and a source of the first transistor; and a first hold capacitor electrically connected between the power line and the source of the first transistor, a first storage capacitance of the first storage capacitor is a sum of a first capacitance between the first electrode and the third electrode, a second capacitance between the third electrode and the fifth electrode, and a third capacitance between the fifth electrode and the sixth electrode, and a first hold capacitance of the first hold capacitor is a sum of a fourth capacitance between the second electrode and the third electrode, and a fifth capacitance between the third electrode and the fourth electrode.

22. The display apparatus of claim 21, further comprising:

a second display element configured to emit light of a second color different from the first color; and a second pixel circuit electrically connected to the second display element and electrically connected to the power line, wherein the second pixel circuit includes:

a second transistor configured to control a magnitude of a second driving current flowing through the second display element;

a second storage capacitor electrically connected between a gate of the second transistor and a source of the second transistor; and a second hold capacitor electrically connected between the power line and the source of the second transistor, the first storage capacitance of the first storage capacitor is greater than a second storage capacitance of the second storage capacitor, and the first hold capacitance of the first hold capacitor is less than a second hold capacitance of the second hold capacitor.

23. The display apparatus of claim 22, wherein the first color is green, and the second color is blue.

24. The display apparatus of claim 17, wherein the third electrode includes a first opening exposing at least a portion of the first insulating layer, the fifth electrode includes a second opening exposing at least a portion of the third insulating layer, the first electrode is electrically connected to the fifth electrode through a first contact hole passing through the first opening of the third electrode, and the third electrode is electrically connected to the sixth electrode through a second contact hole passing through the second opening of the fifth electrode.

25. The display apparatus of claim 17, wherein the sixth electrode and the third electrode are directly connected.

26. The display apparatus of claim 17, wherein the second electrode and the fourth electrode are directly electrically connected to each other and are part of a same electrical node.

27. The display apparatus of claim 17, wherein the third electrode and the fourth electrode form a capacitor.

* * * * *